United States Patent
Okuno et al.

(10) Patent No.: US 10,365,520 B2
(45) Date of Patent: Jul. 30, 2019

(54) WIRING STRUCTURE FOR DISPLAY DEVICE

(75) Inventors: Hiroyuki Okuno, Kobe (JP); Toshihiro Kugimiya, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 376 days.

(21) Appl. No.: 14/241,600

(22) PCT Filed: Sep. 3, 2012

(86) PCT No.: PCT/JP2012/072339
§ 371 (c)(1),
(2), (4) Date: Feb. 27, 2014

(87) PCT Pub. No.: WO2013/047095
PCT Pub. Date: Apr. 4, 2013

(65) Prior Publication Data
US 2014/0227462 A1  Aug. 14, 2014

(30) Foreign Application Priority Data

Sep. 28, 2011 (JP) .................... 2011-213506
Jul. 26, 2012 (JP) .................... 2012-166391

(51) Int. Cl.
*H01L 23/532* (2006.01)
*G02F 1/1343* (2006.01)
(Continued)

(52) U.S. Cl.
CPC ........ *G02F 1/13439* (2013.01); *B32B 15/016* (2013.01); *B32B 15/017* (2013.01); (Continued)

(58) Field of Classification Search
CPC combination set(s) only.
See application file for complete search history.

(56) References Cited

U.S. PATENT DOCUMENTS 5,514,909 A  5/1996 Yamamoto et al.
6,033,542 A  3/2000 Yamamoto et al.
(Continued)

FOREIGN PATENT DOCUMENTS

CN  1940688 A  4/2007
JP  11-284195  10/1999
(Continued)

OTHER PUBLICATIONS

International Search Report dated Dec. 4, 2012 in PCT/JP12/072339 Filed Sep. 3, 2012.
(Continued)

*Primary Examiner* — Anthony J Frost
(74) *Attorney, Agent, or Firm* — Oblon, McClelland, Maier & Neustadt, L.L.P.

(57) ABSTRACT

Provided is a wiring structure for display device which does not generate hillocks even when exposed to high temperatures at levels around 450 to 600° C., has excellent high-temperature heat resistance, keeps electrical resistance (wiring resistance) of the entire wiring structure low, and further has excellent resistance to hydrofluoric acid. This wiring structure for a display device comprises a structure in which are laminated, in order from the substrate side, a first layer of an Al alloy that contains at least one chemical element selected from the group (group X) consisting of Ta, Nb, Re, Zr, W, Mo, V, Hf, Ti, Cr, and Pt and contains at least one rare earth element, and a second layer of an Al alloy nitride, or a nitride of at least one chemical element selected from the group Y consisted of Ti, Mo, Al, Ta, Nb, Re, Zr, W, V, Hf, and Cr.

19 Claims, 4 Drawing Sheets

(51) Int. Cl.

| | | |
|---|---|---|
| C22C 21/00 | (2006.01) | |
| H01J 31/12 | (2006.01) | |
| H01J 11/46 | (2012.01) | |
| H01L 27/12 | (2006.01) | |
| B32B 15/01 | (2006.01) | |
| C23C 14/06 | (2006.01) | |
| H01L 21/48 | (2006.01) | |
| G02F 1/1362 | (2006.01) | |
| C23C 14/00 | (2006.01) | |
| C23C 14/02 | (2006.01) | |
| C22C 14/00 | (2006.01) | |
| C22C 27/02 | (2006.01) | |
| C22C 27/04 | (2006.01) | |

(52) U.S. Cl.
CPC .............. *C22C 14/00* (2013.01); *C22C 21/00* (2013.01); *C22C 27/02* (2013.01); *C22C 27/04* (2013.01); *C23C 14/0036* (2013.01); *C23C 14/025* (2013.01); *C23C 14/0641* (2013.01); *G02F 1/136286* (2013.01); *H01J 11/46* (2013.01); *H01J 31/127* (2013.01); *H01L 21/4885* (2013.01); *H01L 23/53219* (2013.01); *H01L 23/53223* (2013.01); *H01L 27/124* (2013.01); *G02F 2001/136295* (2013.01); *H01L 2924/0002* (2013.01); *Y10T 428/10* (2015.01); *Y10T 428/1095* (2015.01); *Y10T 428/265* (2015.01); *Y10T 428/31678* (2015.04)

(56) References Cited

U.S. PATENT DOCUMENTS

| | | | |
|---|---|---|---|
| 6,096,438 A | 8/2000 | Takagi et al. | |
| 6,218,295 B1* | 4/2001 | Meikle | H01L 21/28518 |
| | | | 257/E21.165 |
| 6,252,247 B1 | 6/2001 | Sakata et al. | |
| 6,255,706 B1 | 7/2001 | Watanabe et al. | |
| 6,940,214 B1* | 9/2005 | Komiya | H01L 27/3244 |
| | | | 313/505 |
| 7,098,539 B2 | 8/2006 | Gotoh et al. | |
| 7,154,180 B2 | 12/2006 | Gotoh et al. | |
| 7,262,085 B2 | 8/2007 | Gotoh et al. | |
| 7,365,810 B2 | 4/2008 | Gotoh et al. | |
| 7,411,298 B2 | 8/2008 | Kawakami et al. | |
| 7,553,754 B2 | 6/2009 | Gotoh et al. | |
| 7,622,809 B2 | 11/2009 | Gotoh et al. | |
| 7,683,370 B2 | 3/2010 | Kugimiya et al. | |
| 7,781,767 B2 | 8/2010 | Kawakami et al. | |
| 7,803,238 B2 | 9/2010 | Kugimiya et al. | |
| 7,943,933 B2 | 5/2011 | Hino et al. | |
| 7,994,503 B2 | 8/2011 | Hino et al. | |
| 8,044,399 B2 | 10/2011 | Hino et al. | |
| 8,053,083 B2 | 11/2011 | Gotou et al. | |
| 8,088,259 B2 | 1/2012 | Gotoh et al. | |
| 8,163,143 B2 | 4/2012 | Takagi et al. | |
| 8,299,614 B2 | 10/2012 | Kawakami et al. | |
| 8,384,280 B2 | 2/2013 | Ochi et al. | |
| 8,422,207 B2 | 4/2013 | Nakai et al. | |
| 8,482,189 B2 | 7/2013 | Goto et al. | |
| 8,535,997 B2 | 9/2013 | Kawakami et al. | |
| 2003/0047812 A1* | 3/2003 | Hagihara | C22F 1/04 |
| | | | 257/771 |
| 2003/0151049 A1 | 8/2003 | Hotta et al. | |
| 2003/0160331 A1* | 8/2003 | Fujisawa | H01L 21/76805 |
| | | | 257/774 |
| 2004/0097024 A1 | 5/2004 | Doi | |
| 2004/0183072 A1 | 9/2004 | Kim et al. | |
| 2004/0232424 A1 | 11/2004 | Hotta et al. | |
| 2005/0250264 A1 | 11/2005 | Hotta et al. | |
| 2005/0255621 A1 | 11/2005 | Hotta et al. | |
| 2005/0269572 A1 | 12/2005 | Hotta et al. | |
| 2006/0011914 A1 | 1/2006 | Kim et al. | |
| 2006/0181198 A1* | 8/2006 | Gotoh | H01L 27/12 |
| | | | 313/503 |
| 2006/0275618 A1 | 12/2006 | Kugimiya et al. | |
| 2007/0069211 A1 | 3/2007 | Inoue et al. | |
| 2007/0166999 A1* | 7/2007 | Vaartstra | C23C 16/34 |
| | | | 438/627 |
| 2008/0081532 A1 | 4/2008 | Okuno | |
| 2008/0121522 A1 | 5/2008 | Ehira et al. | |
| 2008/0223718 A1 | 9/2008 | Takagi et al. | |
| 2009/0001373 A1 | 1/2009 | Ochi et al. | |
| 2009/0011261 A1 | 1/2009 | Gotou | |
| 2009/0133784 A1 | 5/2009 | Kugimiya et al. | |
| 2009/0176113 A1 | 7/2009 | Gotoh et al. | |
| 2009/0242394 A1 | 10/2009 | Takagi et al. | |
| 2010/0032186 A1 | 2/2010 | Gotou et al. | |
| 2010/0065847 A1 | 3/2010 | Gotou et al. | |
| 2010/0207121 A1 | 8/2010 | Hino et al. | |
| 2010/0328247 A1 | 12/2010 | Miki et al. | |
| 2011/0008640 A1 | 1/2011 | Goto et al. | |
| 2011/0012121 A1 | 1/2011 | Inoue et al. | |
| 2011/0079777 A1* | 4/2011 | Akimoto | H01L 29/7869 |
| | | | 257/43 |
| 2011/0147753 A1 | 6/2011 | Onishi et al. | |
| 2011/0198602 A1 | 8/2011 | Nanbu et al. | |
| 2011/0248272 A1 | 10/2011 | Ochi et al. | |
| 2011/0318607 A1 | 12/2011 | Kobayashi et al. | |
| 2012/0091591 A1 | 4/2012 | Gotoh et al. | |
| 2012/0301732 A1 | 11/2012 | Okuno et al. | |
| 2012/0325655 A1 | 12/2012 | Iwasaki et al. | |

FOREIGN PATENT DOCUMENTS

| | | |
|---|---|---|
| JP | 2000 208773 | 7/2000 |
| JP | 2003 45873 | 2/2003 |
| JP | 2003-203919 | 7/2003 |
| JP | 2004 61687 | 2/2004 |
| JP | 2004 165289 | 6/2004 |
| JP | 2004-172150 | 6/2004 |
| JP | 2004 282066 | 10/2004 |
| JP | 2005-44851 A | 2/2005 |
| JP | 2006-261636 A | 9/2006 |
| JP | 2007 93686 | 4/2007 |
| JP | 2010 87068 | 4/2010 |
| JP | 2010-114226 | 5/2010 |
| WO | 2011 102396 | 8/2011 |

OTHER PUBLICATIONS

Written Opinion of the International Searching Authority dated Dec. 4, 2012 in PCT/JP12/072339 Filed Sep. 3, 2012.

* cited by examiner

WIRING STRUCTURE FOR DISPLAY DEVICE

TECHNICAL FIELD

The present invention relates to a wiring structure having an Al alloy film and being useful as an electrode and a wiring material for use in a display device such as a liquid crystal display, a fabrication method of the wiring structure, a display device comprising the wiring structure.

BACKGROUND ART

Aluminum alloy films for use in display devices are mainly used as electrodes and wiring materials. Examples of the electrodes and wiring materials include gate, source, and drain electrodes for a thin film transistor and a wiring material in a liquid crystal display (LCD); gate, source, and drain electrodes for a thin film transistor and a wiring material in an organic EL (OLED); cathode and gate electrodes and a wiring material in a field emission display (FED); an anode electrode and a wiring material in a vacuum fluorescent display (VFD); an address electrode and a wiring material in a plasma display panel (PDP); and a back electrode in an inorganic EL.

Hereinafter, while a liquid crystal display is representatively described as a liquid crystal display device, the present invention is not limited thereto.

Large-sized liquid crystal displays are widely used as main display devices because of advancement in low power consumption technology. Liquid crystal displays having a size of more than 100 inches are now commercialized. There are various types of liquid crystal displays having different operating principles. Among them, active-matrix liquid crystal displays including thin film transistors (hereinafter, referred to as "TFTs") used for the switching of pixels are most-widely used because they have high-precision image qualities and can display fast moving images. In liquid crystal displays required to have lower power consumption and higher switching speeds of pixels, TFTs including semiconductor layers composed of polycrystalline silicon and continuous grain silicon are used.

For example, active-matrix liquid crystal displays having amorphous silicon include TFTs serving as switching elements, pixel electrodes comprising of a conductive oxide film, and wiring such as scan lines and signal lines. The scan and signal lines are electrically connected to pixel electrodes. Wiring materials constituting scan lines and signal lines are formed of Al-based alloy thin films such as an Al—Ni alloy (Patent literatures 1-5 for example). For displays having polycrystalline silicon, refractory metal such as Mo are used for wiring materials constituting scan lines while Al-based alloy thin films such as an Al—Ni alloy are adopted as wiring materials constituting signal lines.

The structure of a core portion of a TFT substrate including a semiconductor layer composed of polycrystalline silicon is described below with reference to FIG. 1. FIG. 1 illustrates a structure after depositing various kinds of wiring and pattering them.

As illustrated in FIG. 1, a scan line 4 and a polycrystalline silicon layer 2, a semiconductor layer, are arranged on a glass substrate 1. A part of the scan line 4 functions as a gate electrode 5 that controls the on/off state of a TFT. The gate electrode 5 is electrically insulated with a gate insulating film 7 (a silicon nitride film for example). A semiconductor polycrystalline silicon layer 2 is arranged as a channel layer on the gate insulating film 7. The polycrystalline silicon layer 2 is connected to a part of signal line 10 such as a source electrode 8 and a drain electrode 9 with a low-resistance polycrystalline silicon layer 3 and has electrical conductivity. The drain electrode 9 is connected to transparent electrode 12 comprising such as indium tin oxide (ITO). The low-resistance polycrystalline silicon layer 3 is formed, after fabricating the scam line 4, by ion-implantation of elements such as phosphorus or boron followed by activation heat treatment at high temperature of about 450° C. to 600° C.

As just described the scan line 4 could be subjected to high temperature of about 450° C. to 600° C. The Al-based alloys for use in wiring of TFTs disclosed in the patent literatures 1-5 are, however, insufficient in terms of heat resistance at high temperatures. Their heatproof temperature is 350° C. at the highest. Instead of the Al-based alloys, refractory metals such as Mo and Mo-based alloys which are excellent in high temperature heat resistance are being used. The refractory metals such as Mo and Mo-based metals have, however, high electrical resistance.

A process to remove native oxides formed on the surface of polycrystalline silicon layer 3 and via hole 11 may be carried out prior to connecting source electrode 8 and drain electrode 9 which are part of signal line 10 to polycrystalline silicon layer 3 of low resistance. This is due to a fact that TFT characteristics is deteriorated by the formation of the native oxides which increase contact resistance of source electrode 8 and drain electrode 9 with polycrystalline silicon layer 3. Wet cleaning with about 1 percent hydrofluoric acid (dilute hydrofluoric acid) solution is generally conducted. Due to poor resistance to hydrofluoric acid, conventional Al-based alloy thin films had a problem of dissolving by cleaning using hydrofluoric acid solution of polycrystalline silicon layer 3 and via hole 11 in the TFT structure illustrated in FIG. 1.

PRIOR ART REFERENCES

Patent Documents

Patent Document 1: Japanese Unexamined Patent Application Publication No. 2007-157917
Patent Document 2: Japanese Unexamined Patent Application Publication No. 2007-81385
Patent Document 3: Japanese Unexamined Patent Application Publication No. 2006-210477
Patent Document 4: Japanese Unexamined Patent Application Publication No. 2007-317934
Patent Document 5: Japanese Unexamined Patent Application Publication No. H7-90552

SUMMARY OF THE INVENTION

Problems to be Solved by the Invention

These days there is an increasing need to enhance carrier mobility, which significantly affects the performance of a TFT, in a semiconductor silicon layer to achieve energy savings and higher performance (for example, corresponding to fast moving images) of a liquid crystal display. To that end, it is practical to crystallize hydrogenated amorphous silicon serving as a constituent material of the semiconductor silicon layer. Electron mobilities in continuous grain silicon, polycrystalline silicon, and hydrogenated amorphous silicon are respectively about 300 cm$^2$/V·s, about 100 cm$^2$/V·s, and about 1 cm$^2$/V·s or less. In the case where hydrogenated amorphous silicon is deposited and then subjected to a heat treatment, the hydrogenated amorphous silicon becomes microcrystalline to improve carrier mobility. With respect to the heat treatment, a higher heating temperature and a longer heating time allow the microcrystallization of hydrogenated amorphous silicon to proceed, thereby improving the carrier mobility.

In order to form a polycrystalline silicon layer of lower resistance, it is helpful to conduct an ion-implantation of elements such as phosphorus or boron followed by activation heat treatment at high temperature of about 450° C. to 600° C. With respect to the activation heat treatment, a higher heating temperature and a longer heating time allow the activation to proceed, thereby improve the performance of TFTs. However, such higher temperature of the heat treatment causes a problem of the formation of an abnormal protrusion (hillock) on an Al alloy wiring thin film due to thermal stress. Hitherto, the upper limit of the temperature of the heat treatment when the Al alloy thin film is used has thus been at most about 350° C. Hence, when heat treatment is performed at a higher temperature than 350° C., a thin film composed of a refractory metal, such as Mo, is commonly used. However, the thin film has a problem in which it is not compatible to an increase in the size of a display because of its high wiring resistance.

In addition to the above-mentioned high-temperature heat resistance, an Al alloy film is required to have various properties. The Al alloy film is required to have a sufficiently low electrical resistivity even if heat treatment is performed at high temperatures of about 450° C. to 600° C.

Furthermore, the Al alloy film is required to have excellent corrosion resistance as well. In particular, in a production process of a TFT substrate, it is subjected to various kinds of chemical solutions at multiple wet processes. For example, in a case that the Al alloy film is exposed, it is easily damaged by the chemicals. It is particularly required to limit damage from dilute hydrofluoric acid which is used remove an oxide layer formed on the surface of a polycrystalline silicon film or a via hole.

The present invention has been made in light of the circumstances described above. It is an object of the present invention to provide a wiring structure for use in a display device, a fabrication method of the wiring structure, and a display device having the wiring structure, where the wiring structure possesses excellent high-temperature heat resistance such that a hillock is not formed even when the wiring structure is subjected to a high temperature of about 450° C. to 600° C., low electrical resistance (wiring resistance), excellent resistance to hydrofluoric acid so that the etching rate is kept low after wet cleaning of the wiring structure with hydrofluoric acid.

Means for Solving the Problems

The wiring structure according to the present invention that achieved to solve the above-described problem possesses excellent heat resistance to heat treatment 450° C. to 600° C. as well as resistance to hydrofluoric acid, and is used for display devices. The wiring structure has a multi-layered structure comprising the first layer of an Al alloy which comprises at least one element selected from a group consisting of Ta, Nb, Re, Zr, W, Mo, V, Hf, Ti, Cr, and Pt (group X) and at least one element of REM (rare earth metal); and the second layer of a nitride of at least one element selected from a group consisting of Ti, Mo, Al, Ta, Nb, Re, Zr, W, V, Hf, and Cr (group Y) or a nitride of an Al alloy in that order on a substrate. The Al alloy constituting the first layer and the Al alloy constituting the second layer may be the same or different from each other.

An Al alloy of the first layer may further comprise Cu and/or Ge.

An Al alloy of the first layer may further comprise Ni and/or Co.

The wiring structure may further comprise a third layer including at least one element selected from a group consisting of Ti, Mo, Ta, Nb, Re, Zr, W, V, Hf, and Cr (group Z), on the second layer.

In a preferred embodiment of the present invention, the wiring structure which is subjected to a heat treatment at 450° C. to 600° C. satisfies the features (1)-(3) described below;

(1) The electrical resistivity is 15 µΩcm or less,
(2) The hillock density is $1\times10^9$ pieces/m$^2$ or less, and
(3) The etching rate is 200 nm/min or less when it is subjected to 0.5 weight percent of hydrofluoric acid solution for 1 minute.

Electrical resistivity of the second layer which constitutes the wiring structure varies depending on the kind of nitride constituting the second layer. According to a method described in examples shown below, the electrical resistivity is 75 µΩcm or more in case the second layer comprises a nitride of Mo. The electrical resistivity is 90 µΩcm or more in case the second layer comprises a nitride of Ti. The electrical resistivity is 27 µΩcm or more in case the second layer comprises a nitride of Al alloy.

In a preferred embodiment of the present invention, nitrogen concentration in the Al alloy constituting the first layer is suppressed to be 1 atomic percent or lower after the wiring structure is subjected to a heat treatment at 450° C. to 600° C.

In a preferred embodiment of the present invention, the thickness of the second layer is 10 nm or more and 100 nm or less.

Further, a manufacturing method of the wiring structure of the present invention which solved the above-described problem is a method to fabricate the wiring structure for use of any one of the display device. The nitride constituting the second layer is formed by reactive sputtering method using a mixed gas of nitrogen and an inert gas. Moreover, the proportion (flow ratio) of nitrogen in the mixed gas is 2 percent or more.

The present invention encompasses a display device having the Al alloy film for a display device.

The present invention encompasses a liquid crystal display device having the Al alloy film for a display device.

The present invention encompasses an organic EL display device having the Al alloy film for a display device.

The present invention encompasses a field emission display having the Al alloy film for a display device.

The present invention encompasses a vacuum fluorescent display having the Al alloy film for a display device.

The present invention encompasses a plasma display device having the Al alloy film for a display device.

The present invention encompasses an inorganic EL display having the Al alloy film for a display device.

Advantageous Effects of Invention

As a wiring structure according to the present invention is composed as described above, it has excellent heat resistance when exposed to a high temperature of about 450° C. to 600° C., has satisfactory low electrical resistance (wiring resistance) after high-temperature treatment, and also has enhanced resistance to hydrofluoric acid.

According to the present invention, in particular, when the substrate is subjected to a high-temperature environment at about 450° C. to 600° C. in a process for producing a thin-film transistor substrate including semiconductor layers composed of polycrystalline silicon and continuous grain silicon, carrier mobility in the semiconductor silicon layers are increased, thereby improving the response speed of TFTs. It is thus possible to provide a high-performance display device that can achieve power savings and support high-speed moving images.

The wiring structure according to the present invention may be suitably used for a wiring material such as for example a scan line and a signal line and an electrode material such as for example a gate electrode, source electrode and a drain electrode. The wiring structure is more preferably used for a gate electrode and related wiring materials of a thin film transistor which is particularly susceptible to high temperature heat history.

DESCRIPTION OF EMBODIMENTS

Figure 1:
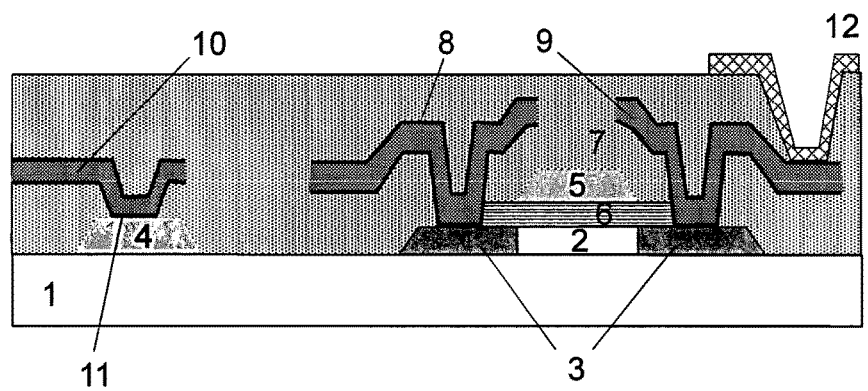
FIG. 1 illustrates a cross-sectional structure of a core portion of a thin film transistor after patterning.

The inventors have conducted intensive studies in order to provide a wiring structure for use in a display device, the wiring structure having excellent high-temperature heat resistance such that a hillock is not formed even when the film is subjected to a high temperature of about 450° C. to 600° C., having low electrical resistance (wiring resistance) of the wiring film (to be precise a wiring structure comprising multi-layered thin films) itself, and having excellent resistance to hydrofluoric acid so that an etching rate for the wiring structure is suppressed low after a hydrofluoric acid cleaning.

As a result of the study, it was found the wiring structure on a substrate comprising;
(I) the first Al alloy layer including at least one element selected from a group (group X) consisting of Ta, Nb, Re, Zr, W, Mo, V, Hf, Ti, Cr, and Pt, and at least one kind of rare-earth element (Al-group X-REM), which contributes to improvement of high temperature heat resistance and lowering electrical resistance (wiring resistance) of the film itself; and
(II) the second nitride layer including a nitride of at least one element selected from a group (group Y) consisting of Ti, Mo, Al, Ta, Nb, Re, Zr, W, V, Hf, and Cr (group Y element), or a nitride of Al alloy, which contributes to improvement of resistance to hydrofluoric acid in addition to high temperature heat resistance and lowering wiring resistance, on the Al alloy of the first layer (herein, the Al alloy constituting the first layer and the Al alloy constituting the second layer may be the same or different from each other.), has the desired properties: high heat resistance, low electrical resistivity, and excellent resistance to hydrofluoric acid after being subjected to high temperature heat treatment. As described above, the Al-group X element-REM alloy for the first layer of the present invention is essential to realize the high heat resistance and low electrical resistivity after being subjected to high temperature treatment. However, it was found through experimental studies conducted by the present inventors that the Al alloy of the first layer only is not enough to achieve even more superior resistance to hydrofluoric acid. (See results of sample No. 42 and 46 in Table 1B in Example described later.)

The wiring structure essentially has a multi-layered structure of an Al-group X element-REM alloy (the first layer) and a nitride of the group Y element or a nitride of Al alloy (the second layer) in that order on a substrate. In this specification, the double-layered structure is occasionally referred to as the first wiring structure.

A third layer including at least one element (group Z element) from a group consisting of Ti, Mo, Ta, Nb, Re, Zr, W, V, Hf, and Cr (group Z) may further be formed on top of the second layer to constitute another wiring structure. It was found that such wiring structure effectively shows the properties of the present invention; superior heat resistance for high temperature heat treatment, low electrical resistivity, and excellent resistance to hydrofluoric acid. By the formation of the third layer, a certain effect may be obtained so as to suppress contact resistance to a wiring film which is fabricated on the third layer.

The wiring structure essentially has a triple-layered structure comprising an Al-group X element-REM alloy (the first layer), a nitride of the group Y element or a nitride of Al alloy (the second layer), and a layer including the group Y element except for Al (the third layer) in that order on a substrate. In this specification, the triple-layered structure is particularly referred to as the second wiring structure.

The wiring structure of the present invention (specifically, the first and second wiring structures) satisfies the features (1)-(3) described below after being subjected to a heat treatment at 450° C.-600° C.

(1) The electrical resistivity is 15 µΩcm or less,
(2) The hillock density is $1 \times 10^9$ pieces/m$^2$ or less, and
(3) The etching rate is 200 nm/min or less when it is subjected to 0.5 weight percent of hydrofluoric acid solution for 1 minute.

Hereinafter each of the wiring structure is described in detail.

(1) The First Wiring Structure
Firstly, the first wiring structure according to the present invention is explained.

As described above, the first wiring structure has a multi-layered structure comprising the first layer of an Al-group X element-REM alloy and the second layer of a nitride of at least one element selected from the group Y element (Ti, Mo, Al, Ta, Nb, Re, Zr, W, V, Hf, and Cr) or a nitride of Al alloy in that order on a substrate. The Al alloy constituting the first layer and the Al alloy constituting the second layer may be the same or different from each other.

(1-1) Substrate
A substrate used for the present invention is not particularly limited as long as it is among those ordinary used for a display device. Examples of such substrate are alkali-free glass, soda-lime glass, silicon, and silicon carbide, and so on. Among these, alkali-free glass is most preferred.

(1-2) Al Alloy (the First Layer)
The first layer of an Al-group X element-REM alloy is formed on the substrate. Herein, "on the substrate" may include both cases of i) immediately above the substrate, and on contact with an interlayer insulating film such as silicon oxide and silicon nitride on the substrate.

(The First Al Alloy Film)
The first Al alloy film is an Al-group X element-REM alloy film which contains at least one element selected from the group X consisting of Ta, Nb, Re, Zr, W, Mo, V, Hf, Ti, Cr, and Pr, and at least one kind of rare-earth metal (REM).

Here, the elements in group X (the group X elements) described above are refractory metals each having a melting point of about 1600° C. or higher and each contribute to improvement in heat resistance at high temperatures. These elements may be added alone or in combination of two or more. Among the group X elements, Ta and Ti are preferred. Ta is more preferred.

The proportion of the group X element (when one of the elements is added, the proportion is based on the amount of the contained element; and when two or more of the elements are added, the proportion is based on the total amount of the contained elements) is preferably in the range of 0.1 to 5 atomic percent. A proportion of the group X element of less than 0.1 atomic percent may not effectively result in the foregoing effects. A proportion of the group X element exceeding 5 atomic percent may result in an excessive increase in the electrical resistance of the Al alloy film itself and may cause a problem in which residues are easily formed during a wiring process. The proportion of the group X element is more preferably in the range of 0.1 atomic percent to 3.0 atomic percent and still more preferably 0.3 atomic percent to 2.0 atomic percent.

Here, the rare-earth element (REM) added in combination with the group X element in the Al alloy film contributes to improvement in high-temperature heat resistance. Moreover, REM itself has the effect of improving the corrosion resistance in a alkaline solution, which the group X element does not have. Specifically, the REM element has an effect, for example, to improve resistance to alkali corrosion by suppressing damage by alkaline developer used in photolithography processes.

Here, the rare-earth element indicates an element group including Sc (scandium) and Y (yttrium) in addition to lanthanoid elements (a total of 15 elements from La with an atomic number of 57 to Lu with an atomic number of 71 in the periodic table). In the present invention, the rare-earth elements may be used alone or in combination of two or more. Among the rare-earth elements, Nd, La, and Gd are preferred. Nd and La are more preferred.

To effectively provide the effect of rare-earth element, the proportion of the rare-earth element (when one of the elements is added, the proportion is based on the amount of the element contained; and when two or more of the elements are added, the proportion is based on the total amount of the elements) is preferably in the range of 0.1 to 4 atomic percent. A proportion of the rare-earth element of less than 0.1 atomic percent may not effectively provide the resistance to alkaline corrosion. A proportion of the rare-earth element exceeding 4 atomic percent may result in excessively high electrical resistance of the Al alloy film itself and may cause a problem in which residues are easily formed during a wiring process. The proportion of the rare-earth element is more preferably in the range of 0.3 atomic percent to 3 atomic percent and still more preferably 0.5 atomic percent to 2.5 atomic percent.

The first Al alloy film is an Al alloy film containing the foregoing elements and the balance being Al and incidental impurities.

Here, examples of the incidental impurities include Fe, Si and B. The total amount of the incidental impurities is not particularly limited and may be contained in an amount of about 0.5 atomic percent or less. With respect to each of the incidental impurities, B may be contained in an amount of 0.012 atomic percent or less. Each of Fe and Si may be contained in an amount of 0.12 atomic percent or less.

Furthermore, the first Al alloy film may contain elements shown below.

(Cu and/or Ge)
Cu and/or Ge are elements which contribute to improvement in high-temperature heat resistance and which prevent the formation of a hillock in a high-temperature process. Cu and/or Ge may be added separately. Alternatively, both of them may be added.

To effectively provide the effect, the proportion of Cu and/or Ge (when one of the elements is added, the proportion is based on the amount of the element contained; and when both of the elements are added, the proportion is based on the total amount of the elements) is preferably in the range of 0.1 to 2.0 atomic percent. A proportion of Cu and/or Ge of less than 0.1 atomic percent may not effectively provide the effect and high enough density of the second precipitates which contribute to improvement of heat resistance. A proportion of Cu and/or Ge exceeding 2.0 atomic percent may result in an excessive increase in the electrical resistance. The proportion of Cu and/or Ge is more preferably in the range of 0.1 atomic percent to 1.0 atomic percent and still more preferably 0.1 atomic percent to 0.6 atomic percent.

(Ni and/or Co)
Ni and Co are elements that enable the Al alloy film to come into direct contact with a transparent conductive film. This is because electrical continuity between the Al alloy film and the transparent conductive film can be established with highly conductive Al-based precipitates, containing Ni and/or Co, formed by a heat treatment in a fabrication process of TFTs. They may be added separately. Alternatively, both of them may be added.

To effectively provide the effect, the proportion of Ni and/or Co (when one of the elements is added, the proportion is based on the amount of the element contained; and when both of the elements are added, the proportion is based on the total amount of the elements) is preferably in the range of 0.1 to 3 atomic percent. A proportion of Ni and/or Co of less than 0.1 atomic percent may not provide the intended effect and may not ensure the density of the third precipitates that contribute to a reduction in the contact resistance with the transparent conductive film. That is, the size of the third precipitates is small, and the density is low. It is thus difficult to stably maintain low contact resistance with the transparent conductive film. A proportion of Ni and/or Co exceeding 3 atomic percent may result in poor resistance to alkaline corrosion of the Al alloy film. The proportion of Ni and/or Co is more preferably in the range of 0.1 atomic percent to 1 atomic percent and still more preferably 0.1 atomic percent to 0.6 atomic percent.

The elements constituting the first Al alloy layer has been described above.

As described hereinafter, the nitride (the second layer) is deposited on the Al alloy first layer. Nitrogen is occasionally mixed into the Al alloy first layer according to circumstances such as presence of nitrogen gas introduced for the formation of the nitride and thermal diffusion during the heat treatment. Even in such a case, the concentration of nitrogen mixed into the Al alloy constituting the first layer is preferably suppressed to 1 atomic percent or less, as the introduction of much nitrogen in the Al alloy induces increase of electrical resistance. The lower the concentration of nitrogen mixed into the Al alloy (the first layer), the better. It is more preferably 0.1 atomic percent or less, and even more preferably about 0.01 atomic percent or less.

The thickness of the Al alloy of the first layer is preferably about 50-800 nm. A thickness of less than 50 nm results in increase of wiring resistance. On the other hand, a thickness of more than 800 nm causes problems such as shape anomaly at wiring film edges and disconnection of the upper side film. The thickness of the Al alloy is more preferably about 100-500 nm.

(1-3) Nitride of the Group Y Element or Nitride of Al Alloy (the Second Layer)

In the first wiring structure, the second layer including a nitride of at least one element selected from a group (group Y) consisting of Ti, Mo, Al, Ta, Nb, Re, Zr, W, V, Hf, and Cr (group Y element), or a nitride of Al alloy is formed on the Al alloy of the first layer. Each of the nitride of the group Y element and the Al alloy, which contributes to improvement of resistance to hydrofluoric acid in addition to high temperature heat resistance and lowering wiring resistance by itself, may be added alone or in combination of two or more.

The second layer is selected for the purpose of obtaining desired function effect based on results of lots of basic experiments. It was elucidated that the desired function effects may be obtained by adopting the nitride of the group Y metal element or the Al alloy to the second layer (see example described later). Here "on the Al alloy of the first layer" stands for the layer lies directly on the Al alloy of the first layer. In this effect, no intermediate layer exists between the first and second layers.

The nitride of the group Y element encompasses a nitride which includes one or more of the group Y element. A nitride material is indicated as "—N". For example, "Ti—N" stands for a nitride which includes only Ti as the group Y element. "Ti—Mo—N" stands for a nitride which includes Ti and Mo of the group Y The Al alloy of "nitride of Al alloy" may be the same as an Al alloy constituting the first layer, or may be different from an Al alloy constituting the first layer. In the former case, the first and second layers may be composed of the same Al alloy or different Al alloys. From a perspective of productivity, the first and second layers are preferably composed of the same Al alloy.

The Al alloy constituting "nitride of Al alloy" is explained herein in further detail. As described above, it is required for the "nitride of Al alloy" constituting the second layer to have the desired effect to improve the resistance to hydrofluoric acid. Because the Al alloy constituting the first layer has functions of improving heat resistance at high temperature and lowering electrical resistance, it is not necessarily required for the second layer to these functions of improving heat resistance at high temperature and lowering electrical resistance. Examples of Al alloys used for the second layer are aforementioned Al alloys for the first layer including Al—group X element—REM alloy, Al—group X element—REM—Cu/Ge alloy, Al—group X element—REM—Ni/Co alloy, and Al—group X element—REM—Cu/Ge—Ni/Co alloy. Details of each of the elements may be referred to the descriptions for aforementioned Al alloys of the first layer. Specifically, included in such alloys are Al—Nd—Ti alloy, Al—Ta—Nd—Ti alloy, Al—Ta—Nd—Ni—Ge alloy, and Al—Ta—Nd—Ni—Ge—Zr alloy.

Additional examples of Al alloys used for the second layer are; Al-group X element alloy such as Al—Zr alloy, Al—REM alloy such as Al—Nd alloy, Al—Y alloy, and Al—Ce alloy. Al—Cu alloy, Al—Si alloy, Al—Fe—Si alloy are also such examples. It is noted, however, an Al alloy comprising elements such as Au and Pt having low solubility to Al etchant (such as for example a mixed solution of phosphoric acid, nitric acid, and acetic acid), with an amount of about 1.0 atomic percent or more is not preferred for use to constitute the second layer due to etching residue problem.

Among the nitrides, preferred from the point of view of cost reduction of manufacturing the sputtering targets to fabricate the nitride are nitrides including at least one of Al, Ti, and Mo as the group Y element and nitrides of Al alloy. In this context, "nitrides including at least one of Ti and Mo" includes a nitride consisting of only Ti (and the balance being inevitable impurities), a nitride consisting of only Mo (and the balance being inevitable impurities), a nitride consisting of Ti and nitride of Ti alloy comprising at least one kind of the group Y elements other than Ti (and the balance being inevitable impurities), and a nitride consisting of Mo and nitride of Mo alloy comprising at least one kind of the group Y elements other than Mo. More preferred are a nitride of Al, a nitride of Ti, a nitride of Mo, and a nitride of Al alloy.

It is not necessarily required for "nitride" according to the present invention to consist of the group Y element or Al alloy which is completely nitrided. In order to effectively exert the effect of the nitride, however, higher ratio of the nitridation is preferred. The most preferred is that the element or alloy is completely nitrided. In cases that, for example, a nitride comprises two or more group Y elements or a nitride of Al alloy comprises two or more elements, higher ratio of the nitridation of all the elements constituting the nitride is preferred. The most preferred is that all of the element or alloy is completely nitride: Specifically, as elucidated hereinafter, nitrides formed by controlling the proportion (flow ratio in percentage) of nitrogen being 2 percent or more (3 percent or more for some kinds of element constituting nitride of the second layer) in the mixed gas are within the scope of the present invention. It should be noted, however, nitrides are inherently insulating. As the proportion of nitride in the second layer increases, the electrical resistivity of the second layer and the total resistivity of the wiring structure increase. Further, depending on kind of element constituting the nitride, nitrides constituting the second layer are useful to improve resistance to hydrofluoric acid. Furthermore, depending on kind of element constituting the nitride, it is recommended to appropriately control the ratio of nitridation according to kind of elements constituting the nitride because excessive nitridation may cause deterioration of properties, such as wet-etching processability, generally required for wiring structure used for display devices.

The thickness of the nitride of the second layer is preferably about 10-100 nm. A thickness of less than 10 nm results in formation of pinholes in the layer. On the other hand, a thickness of more than 100 nm causes problems such as increase in electrical resistance of the wiring films and prolonged deposition time. The thickness of the nitride of the second layer is more preferably about 15-70 nm.

The wiring structure satisfies the features (1)-(3) described below after being subjected to a heat treatment at 450° C.-600° C.

(1) The electrical resistivity is 15 μΩcm or less,
(2) The hillock density is $1\times10^9$ pieces/m$^2$ or less, and
(3) The etching rate is 200 nm/min or less when it is subjected to 0.5 weight percent of hydrofluoric acid solution for 1 minute.

The feature (1) is an index value of low electrical resistance after high temperature heat treatment. The feature (2) is an index value of high temperature heat resistance after high temperature heat treatment. The feature (3) is an index value of excellent resistance to hydrofluoric acid after high temperature heat treatment. Details may be referred to acceptance criteria shown in Table 10. Detailed method to determine the resistance to hydrofluoric acid is described below in EXAMPLE section.

Here, "after high temperature heat treatment" assumes a heat treatment at high temperatures in the course of TFT fabrication process. Examples of such high temperature heat treatment in the course of TFT fabrication process are, for example, a laser annealing process for crystallization of amorphous silicon to obtain crystal silicon, and an activation heat treatment to form a polycrystalline silicon layer of low resistance. The wiring structure is often subjected to the high temperature environment particularly in a heat treatment for the purpose of activation. Preferred atmospheres for the activation heat treatment include vacuum, nitrogen gas, and inert gas. Preferable duration of the treatment is 1 minute or longer and 60 minutes or shorter.

Further, electrical resistivity of the second layer may be in an appropriate range depending on kind of nitride constituting the layer. The nitrides constituting the second layer are inherently insulating, as described above. Nitrides constituting the second layer are useful to improve resistance to hydrofluoric acid. Nitrides are, however, inherently insulating. Electrical resistivity of the second layer may be in a various range depending on kind of nitride constituting the layer.

For example, in a case the second layer comprises a nitride of Mo, it is possible to make the nitride excellent in terms of resistance to hydrofluoric acid by controlling the proportion (flow ratio) of nitrogen being 3 percent or more in the mixed gas. In such a case, the electrical resistivity of the second layer is 75 μΩcm or more according to a method described in examples shown below. Moreover, as described below, the upper limit of the proportion (flow ratio) of nitrogen in the mixed gas is preferably 50 percent. The electrical resistivity of such second layer is 400 μΩcm or less.

Further, in a case the second layer comprises a nitride of Ti, it is possible to make the nitride excellent in terms of resistance to hydrofluoric acid by controlling the proportion (flow ratio) of nitrogen being 2 percent or more in the mixed gas. In such a case, the electrical resistivity of the second layer is 90 μΩcm or more according to a method described in examples shown below. Moreover, as described below, the upper limit of the proportion (flow ratio) of nitrogen in the mixed gas is preferably 50 percent. The electrical resistivity of such second layer is 600 μΩcm or less.

Furthermore, in a case the second layer comprises a nitride of Al alloys shown in Table 9, it is possible to make the nitride excellent in terms of resistance to hydrofluoric acid by controlling the proportion (flow ratio) of nitrogen being 3 percent or more in the mixed gas. In such a case, the electrical resistivity of the second layer is 27 μΩcm or more according to a method described in examples shown below. Moreover, as described below, the upper limit of the proportion (flow ratio) of nitrogen in the mixed gas is preferably 15 percent. The electrical resistivity of such second layer is 1300 μΩcm or less.

The first wiring structure according to the present invention is described hereinbefore.

(2) The Second Wiring Structure

The second wiring structure according to the present invention is explained hereinafter.

As described above, the second wiring structure has the third layer comprising at least one element selected from a group consisting of Ti, Mo, Ta, Nb, Re, Zr, W, V, Hf, and Cr (group Z) on the nitride of the second layer of the first wiring structure. The second wiring structure also satisfies the features; (1) electrical resistivity of 15 μΩcm or less and (2) the hillock density of $1\times10^9$ pieces/m$^2$ or less, and possesses excellent resistance to hydrofluoric acid.

For details of the second wiring structure, sections (1-1) and (1-2) may be referred to for the substrate, the Al alloy of the first layer, and the Al alloy of the second layer, which are overlapping with those of the first wiring structure. Hereinafter, the third layer is explained.

(2-1) The Third Layer

The third layer is formed on the nitride of the second layer for the purpose of reducing contact resistance to other wiring films which may be formed on the third layer. Here, "on the nitride of the second layer" means that the third layer lies directly on the nitride of the second layer, and that no intermediate layer lies between the second and third layers.

Specifically, the third layer is composed of a layer comprising the group Z element(s). The group Z element is at least one of elements selected from all of the group Y elements but Al. Here, a layer comprising the group Z element(s) means that the layer includes one or more kind(s) of the group Z element and impurity elements inevitably included in the manufacturing process. The group Z element may be contained solely or in a combination of two or more. Preferred from the point of view of cost reduction of manufacturing the sputtering targets to fabricate the third layer is a layer including at least one of Ti, and Mo as the group Z element. In this context, "a layer including at least one of Ti and Mo" includes a layer consisting of only Ti (and the balance being inevitable impurities), a layer consisting of only Mo (and the balance being inevitable impurities), a layer consisting Ti and Ti alloy comprising at least one kind of the group Z elements other than Ti, and a layer consisting of Mo and Mo alloy comprising at least one kind of the group Y elements other than Mo. More preferred are a layer consisting of Al and a layer consisting of Mo.

The thickness of the third layer is preferably about 10-100 nm. A thickness of less than 10 nm results in formation of pinholes in the layer. On the other hand, a thickness of more than 100 nm causes increase in wiring resistance. The thickness of the third layer is more preferably about 15-70 nm.

The second wiring structure according to the present invention is described hereinbefore.

The present invention also includes a fabrication method of the wiring structure. The fabrication method according to the present invention is characterized in a process of forming the nitride of the second layer. For the rest of the processes of fabricating the first and the third layers, ordinary used film formation processes may appropriately be adopted.

In the fabrication method of the present invention, the nitride constituting the second layer is deposited by reactive sputtering method by using a mixed gas of nitrogen gas and inert gas (typically argon gas) and a sputtering target (may also be referred to as target hereinafter). Moreover, proportion of nitrogen gas (flow ratio) in the mixed gas is 2 percent or more (3 percent or more depending on elements constituting the nitride of the second layer). These are the characteristics of the present invention.

Examples of the inert gas include argon and neon. Among these, argon is preferred.

And the nitride which exerts the desired effects may be formed by controlling the proportion (flow ratio) of nitrogen in the mixed gas to 2 percent or higher (3 percent or higher for certain elements constituting the nitride of the second layer).

In a case to form a nitride of, for example, Ti as the second layer, the proportion (flow ratio) of nitrogen is to be controlled 2 percent or higher in the mixed gas. The proportion of nitrogen is preferably 3 percent or higher, more preferably 5 percent or higher, and even more preferably 10 percent or higher.

In a case to form a nitride of, for example, an element selected from a group consisting of Mo, Al, Ta, Nb, Re, Zr, W, V, Hf, and Cr, or Al alloy as the second layer, the proportion (flow ratio) of nitrogen is to be controlled 3 percent or higher in the mixed gas. The proportion of nitrogen is preferably 5 percent or higher, and more preferably 10 percent or higher.

However, excessive proportion of nitrogen in the mixed gas decreases the deposition rate. The upper limit is thus preferably 50 percent or lower, and more preferably 40 percent or lower, and even more preferably 30 percent or lower.

In a case to form a nitride of Al alloy as the second layer, it is recommended to control the proportion (flow ratio) of nitrogen 15 percent or lower in the mixed gas. Excessive proportion of nitrogen gas induces larger amount of nitride formed in the second layer, results in excess electrical resistivity, and make the second layer an insulator (specifically, the electrical resistivity of $10^8$ μΩcm or higher), which may result in high total electrical resistance of the wiring structure, accordingly. The excessive electrical resistivity of the second layer could further deteriorate processability of the wiring in terms of etching (wet etching in particular).

A manufacturing method of the nitride featuring the present invention is described hereinbefore.

The first layer (Al alloy) and the third layer (the film comprising group Z element) is preferably formed by a sputtering method with a sputtering target (hereinafter, also referred to as a "target") because a thin film having excellent in-plane uniformity in components and thickness can be easily formed, compared with the case where a thin film is formed by an ion-plating method, an electron-beam evaporation method, or a vacuum evaporation method.

In the case where the first or the third layer is formed by the sputtering method, a sputtering target containing the foregoing elements and having the same composition as the composition of a desired layer is suitably used as the target because the use of the target eliminates composition deviation and results in the formation of a layer having an intended composition.

With respect to the shape of the target, the target may be processed into any shape (a square plate-like shape, a circular plate-like shape, a doughnut plate-like shape, a cylinder shape, or the like) corresponding to the shape and structure of a sputtering apparatus.

Examples of a method for producing the target include a method in which an ingot composed of an Al-base alloy is produced by a melt-casting process, a powder sintering process, or a spray forming process to form a target; and a method in which after a preform (intermediate before the final dense product) composed of an Al-based alloy is produced, the preform is densified by densification means to form a target.

The present invention includes a display device characterized in that the wiring structure is used for a thin film transistor. Examples of an embodiment of the present invention include an embodiment in which the wiring structure is used for a wiring such as a scan line and a signal line, a wiring or an electrode material such as a gate electrode, a source electrode, and a drain electrode. A particularly preferred embodiment of the wiring structure is that it is used for a gate and a signal line which are affected by high temperature thermal history.

Furthermore, the case where the gate electrode, the scan line, the source electrode and/or the drain electrode, and the signal line are formed of the wiring structure having the same composition is included as an embodiment.

A transparent pixel electrode used in the present invention is not particularly limited. Examples thereof include indium tin oxide (ITO) and indium zinc oxide (IZO).

A semiconductor layer used in the present invention is not particularly limited. Examples thereof include amorphous silicon, polycrystalline silicon, and continuous grain silicon.

To produce the display device including the Al alloy film of the present invention, a common process for producing a display device may be employed. For example, the production methods described in patent literatures 1 to 5 described above may be referenced.

Figure 2:
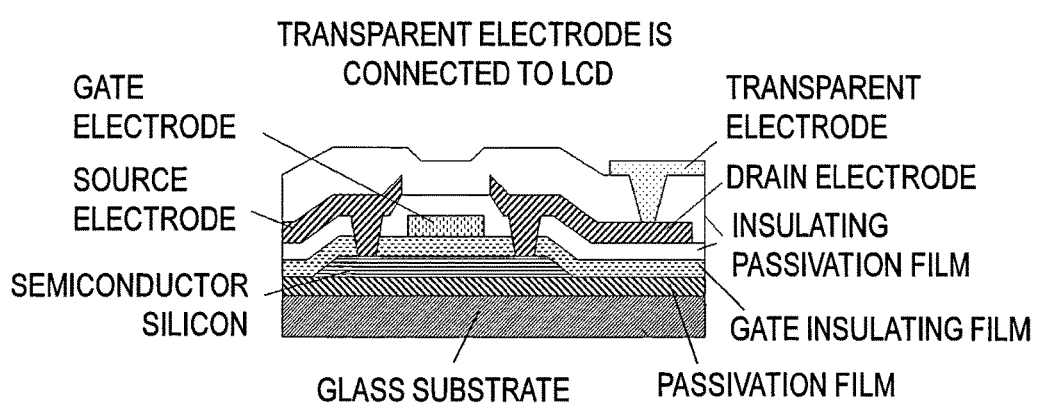
FIG. 2 is a schematic cross-sectional view of an exemplary liquid crystal display.
Figure 3:
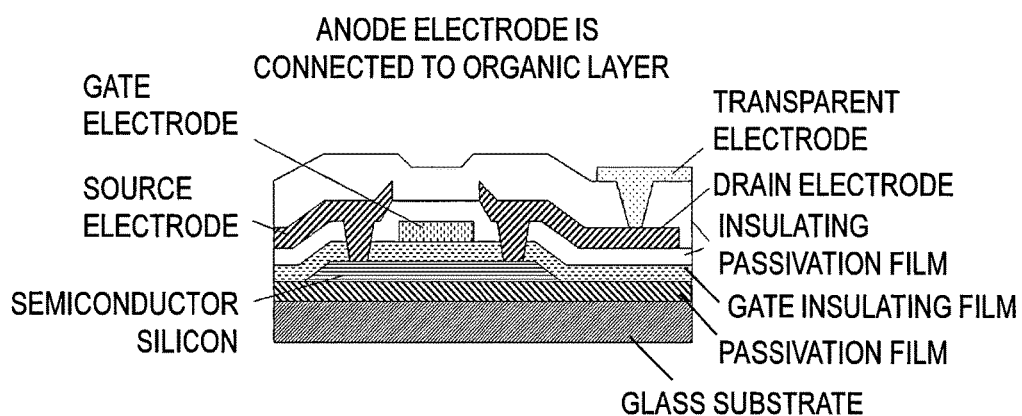
FIG. 3 is a schematic cross-sectional view of an exemplary organic electroluminescent (EL) display.
Figure 4:
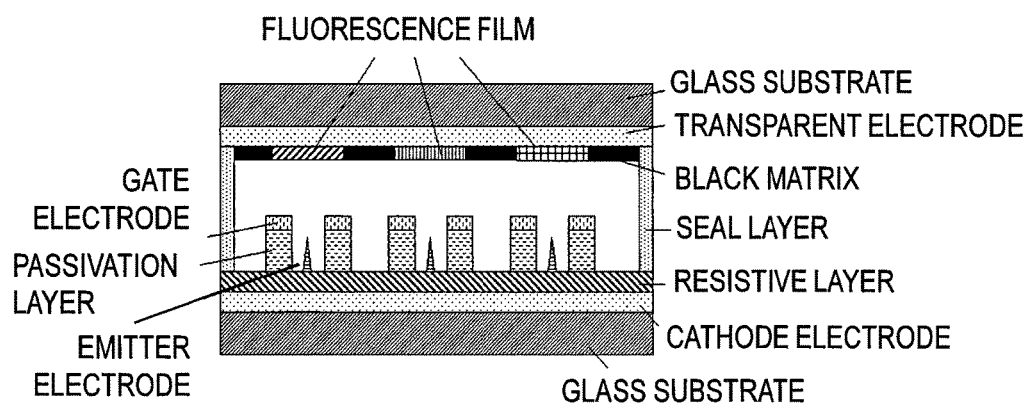
FIG. 4 is a schematic cross-sectional view of an exemplary field emission display.
Figure 5:
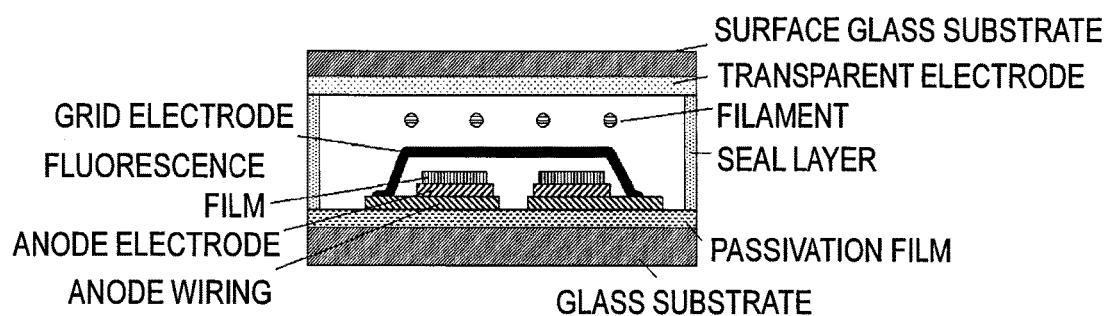
FIG. 5 is a schematic cross-sectional view of an exemplary vacuum fluorescent display.
Figure 6:
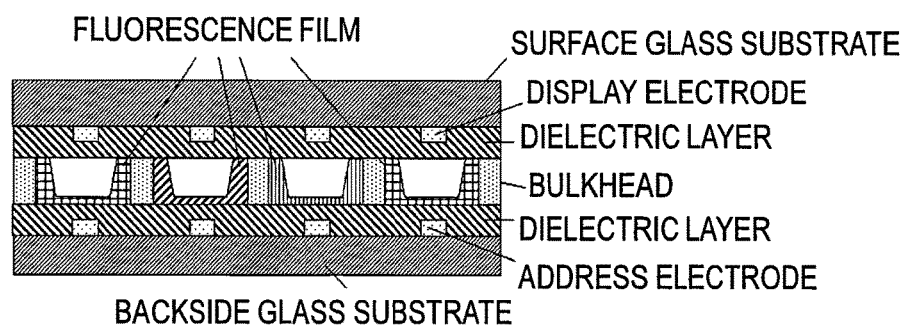
FIG. 6 is a schematic cross-sectional view of an exemplary plasma display.
Figure 7:
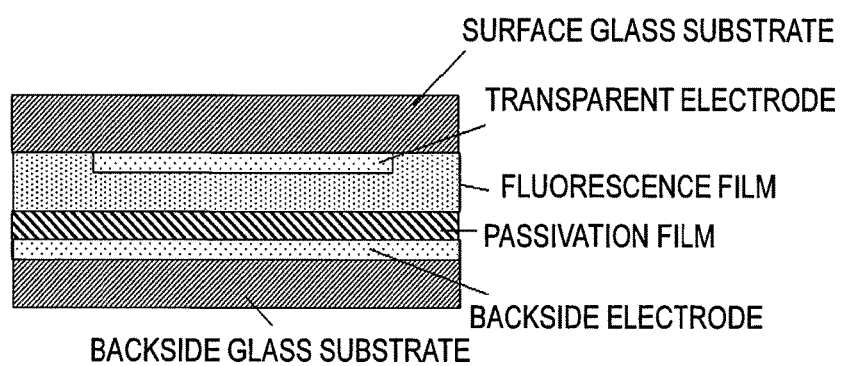
FIG. 7 is a schematic cross-sectional view of an exemplary inorganic electroluminescent (EL) display.

As a liquid crystal display device, a liquid crystal display is representatively described above. The foregoing wiring structure for use in a display device according to the present invention may be mainly used as electrodes and wiring materials in various liquid crystal display devices. Examples of the electrodes and wiring materials include gate, source, and drain electrodes for a thin film transistor and a wiring material in a liquid crystal display (LCD) as illustrated in FIG. 2; gate, source, and drain electrodes for a thin film transistor and a wiring material in an organic EL (OLED) as illustrated in FIG. 3; cathode and gate electrodes and a wiring material in a field emission display (FED) as illustrated in FIG. 4; an anode electrode and a wiring material in a vacuum fluorescent display (VFD) as illustrated in FIG. 5; an address electrode and a wiring material in a plasma display (PDP) as illustrated in FIG. 6; and a back electrode in an inorganic EL as illustrated in FIG. 7. Our experimental results demonstrate that in the case where the wiring structure for use in a display device according to the present invention is used, the predetermined effects described above are provided.

This application claims the benefit of priority to Japanese Patent Application Nos. 2011-213506 and 2012-166391 filed on Sep. 28, 2011 and Jul. 26, 2012, respectively. The entire contents of Japanese Patent Application Nos. 2011-213506 and 2012-166391 are incorporated by reference herein in their entirety.

EXAMPLES

The present invention is more specifically described below by presenting examples. The present invention is not limited to these examples described below. The present invention may be modified and performed without departing from the essence of the present invention described above and below. They are also within the technical scope of the present invention.

Example 1

In this example, samples of the first wiring structure were prepared as shown in Table 1. Each nitride film of various compositions shown in Table 1 was deposited as the second layer on Al alloys of compositions shown in the same table (the first layer). After the heat treatment at 450° C. to 600° C., electrical resistance, heat resistance (hillock density), and resistance to hydrofluoric acid of the wiring structures were evaluated. All of the Al alloys of the first layer used for this example are Al-group X element-REM alloys which satisfy the requirements of the present invention. In the tables, atomic percent is described as at %.

Firstly, the Al-0.5 at % Ta-2.0 at % Nd-0.1 at % Ni-0.5 at % Ge, Al-0.5 at % Ta-2.0 at % Nd-0.1 at % Ni-0.5 at % Ge-0.35 at % Zr, or Al-0.5 at % Ta-2.0 at % La-0.1 at % Ni-0.5 at % Ge alloy films (the first layer with a thickness of 300 nm) were deposited by a DC magnetron sputtering method on glass substrate (Eagle-XG, manufactured by Corning Inc.), atmospheric gas: argon with a flow rate: 30 sccm, pressure: 2 mTorr, and substrate temperature: 25° C. (room temperature).

Each of the Nos. 1-38 nitride films (the second layer with a thickness of 50 nm) shown in Table 6 was subsequently deposited in vacuo by a DC magnetron sputtering method (atmospheric gas: argon with a flow rate of 26 sccm and nitrogen with a flow rate of 4 sccm (i.e., the flow ratio of approximately 13%), total pressure: 2 mTorr, and substrate temperature: 25° C. (room temperature)). The first wiring structure consisting of two layers was thus fabricated. For comparison, each of the Nos. 39-41, 43-45 metal films was similarly deposited with a thickness of 50 nm. Moreover, in order to confirm the effects of the nitride films, samples No. 42 and 46 consisting of the first layer of Al alloy were prepared without the second layer for comparative examples.

For the preparation of the foregoing nitride films of having various compositions, metal or alloy targets having various compositions, which were prepared by the vacuum melting method, were used as a sputtering target.

Among the nitride films, a content of each of the alloy elements in the Al alloy nitride films were determined by the ICP emission spectrometry (inductively coupled plasma emission spectrometry) method.

Each of the first wiring structure prepared as described above was subjected to single high temperature heat treatment at 450° C. to 600° C. With respect to each of the wiring structures after the high-temperature heat treatment, properties of heat resistance, electrical resistance of the wiring structure itself (wiring resistance), and resistance to 0.5 percent hydrofluoric acid were measured by methods described below.

(1) Heat Resistance after Heat Treatment

Each of the various wiring structures was subjected to single heat treatment in an inert ($N_2$) gas atmosphere at 600° C. for 10 minutes. The surface morphology of the samples were observed with an optical microscope (magnification: ×500) to measure the density of hillocks (particles/$m^2$). The heat resistance was evaluated according to evaluation criteria described in Table 10. In this example, "excellent", "fair", and "good" indicate that the corresponding samples were acceptable, while "poor" indicates that the corresponding samples were unacceptable.

(2) Wiring Resistance of Al Alloy Film after Heat Treatment

A 10-µm line-and-space pattern formed on each of the various wiring structures was subjected to single heat treatment in an inert ($N_2$) gas atmosphere at 450° C., 550° C., or 600° C. for 10 minutes. The electrical resistance was determined by a 4-point probes method. The wiring resistance for each temperature was evaluated according to evaluation criteria described in Table 10. In this example, "excellent" or "fair" indicates that the corresponding samples were acceptable, while "good" or "no good" indicates that the corresponding samples were unacceptable.

(3) Resistance to Hydrofluoric Acid

The various wiring structures prepared in the manner described above were subjected to single heat treatment in an inert ($N_2$) gas atmosphere at 600° C. for 10 minutes. After a mask was formed, the wiring structure was immersed in a 0.5% hydrofluoric acid solution at 25° C. for 30 seconds and 1 minute. The amount etched was measured with a profilometer. The etch rate was derived from the difference between the amount etched after immersion for 1 minute and the amount etched after immersion for 30 seconds. The resistance to hydrofluoric acid was evaluated according to criteria described in Table 10. In this example, "excellent", "fair" or "good" indicates that the corresponding samples were acceptable, while "no good" indicates that the corresponding samples were unacceptable.

Further, for the various wiring structures prepared in the above-described manner, subjected to single heat treatment in an inert ($N_2$) gas atmosphere at 600° C. for 10 minutes, nitrogen concentration (in atomic percent) in the first layer (the Al-0.5 at % Ta-2.0 at % Nd-0.1 at % Ni-0.5 at % Ge, Al-0.5 at % Ta-2.0 at % Nd-0.1 at % Ni-0.5 at % Ge-0.35 at % Zr, or Al-0.5 at % Ta-2.0 at % La-0.1 at % Ni-0.5 at % Ge alloy film) was measured by secondary-ion mass spectroscopy.

The results are shown in Table 1.

TABLE 1A

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 1 | Ti—N | Al-0.5 at % Ta-2.0 at % Nd-0.1 at % Ni-0.5 at % Ge | excellent | excellent | excellent | excellent | excellent |
| 2 | Mo—N | | excellent | excellent | excellent | excellent | excellent |
| 3 | Al—N | | excellent | excellent | excellent | excellent | excellent |
| 4 | Al-2 at % Nd—N | | excellent | excellent | excellent | excellent | excellent |
| 5 | Al-1 at % Ta—N | | excellent | excellent | excellent | excellent | excellent |
| 6 | Al-1 at % Ni-0.5 at % Cu-0.3 at % La—N | | excellent | excellent | excellent | excellent | excellent |
| 7 | Al-0.5 at % Ta-2.0 at % Nd-0.1 at % Ni-0.5 at % Ge—N | | excellent | excellent | excellent | excellent | excellent |
| 8 | Al-0.5 at % Ta-0.2 at % Nd-0.1 at % Ni-0.5 at % Ge-0.35 at % Zr—N | | excellent | excellent | excellent | excellent | excellent |
| 9 | Ta—N | | excellent | excellent | excellent | excellent | excellent |
| 10 | Nb—N | | excellent | excellent | excellent | excellent | excellent |

TABLE 1A-continued

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 11 | Zr—N | | excellent | excellent | excellent | excellent | excellent |
| 12 | W—N | | excellent | excellent | excellent | excellent | excellent |
| 13 | V—N | | excellent | excellent | excellent | excellent | excellent |
| 14 | Hf—N | | excellent | excellent | excellent | excellent | excellent |
| 15 | Cr—N | | excellent | excellent | excellent | excellent | excellent |
| 16 | Re—N | | excellent | excellent | excellent | excellent | excellent |
| 17 | Mo—W—N | | excellent | excellent | excellent | excellent | excellent |
| 18 | Mo—Nb—N | | excellent | excellent | excellent | excellent | excellent |
| 19 | Mo—Ti—N | | excellent | excellent | excellent | excellent | excellent |

TABLE 1B

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 20 | Ti—N | Al-0.5 at % Ta-s | excellent | excellent | excellent | excellent | excellent |
| 21 | Mo—N | 0.2 at % Nd-0.1 at % | excellent | excellent | excellent | excellent | excellent |
| 22 | Al—N | Ni-0.5 at % | excellent | excellent | excellent | excellent | excellent |
| 23 | Al-2 at % Nd—N | Ge-0.35 at % Zr | excellent | excellent | excellent | excellent | excellent |
| 24 | Al-1 at % Ta—N | | excellent | excellent | excellent | excellent | excellent |
| 25 | Al-1 at % Ni-0.5 at % Cu-0.3 at % La—N | | excellent | excellent | excellent | excellent | excellent |
| 26 | Al-0.5 at % Ta-2.0 at % Nd-0.1 at % Ni-0.5 at % Ge—N | | excellent | excellent | excellent | excellent | excellent |
| 27 | Al-0.5 at % Ta-0.2 at % Nd-0.1 at % Ni-0.5 at % Ge-0.35 at % Zr—N | | excellent | excellent | excellent | excellent | excellent |
| 28 | Ta—N | | excellent | excellent | excellent | excellent | excellent |
| 29 | Nb—N | | excellent | excellent | excellent | excellent | excellent |
| 30 | Zr—N | | excellent | excellent | excellent | excellent | excellent |
| 31 | W—N | | excellent | excellent | excellent | excellent | excellent |
| 32 | V—N | | excellent | excellent | excellent | excellent | excellent |
| 33 | Hf—N | | excellent | excellent | excellent | excellent | excellent |
| 34 | Cr—N | | excellent | excellent | excellent | excellent | excellent |
| 35 | Re—N | | excellent | excellent | excellent | excellent | excellent |
| 36 | Mo—W—N | | excellent | excellent | excellent | excellent | excellent |
| 37 | Mo—Nb—N | | excellent | excellent | excellent | excellent | excellent |
| 38 | Mo—Ti—N | | excellent | excellent | excellent | excellent | excellent |
| 39 | Ti | Al-0.5 at % Ta-2.0 at | good | poor | poor | excellent | excellent |
| 40 | Mo | % La-0.1 at % Ni-0.5 | good | poor | poor | excellent | excellent |
| 41 | Al | at % Ge | excellent | excellent | excellent | good | poor |
| 42 | None | | excellent | excellent | excellent | excellent | poor |
| 43 | Ti | Al-0.5 at % Ta-0.2 at % | good | poor | poor | excellent | excellent |
| 44 | Mo | Nd-0.1 at % Ni-0.5 at % | good | poor | poor | excellent | excellent |
| 45 | Al | Ge-0.35 at % Zr | excellent | excellent | excellent | good | poor |
| 46 | None | | excellent | excellent | excellent | excellent | poor |

As shown in Table 1, samples No. 1-38 which satisfy the requirements of the present invention showed low wiring resistance and high heat resistance as well as excellent resistance to hydrofluoric acid after being subjected to the high temperature heat treatment. For all the samples in Table 1, nitrogen concentration (in atomic percent) in the first layer was suppressed to less than 1 atomic percent (not shown in the Table).

In contrast, as for samples No. 39-41, 43-45 (see Table 1B), those with the second layer comprising metal; Ti, Mo, or Al, instead of nitride, showed problems as described hereinafter, regardless of the kind of Al alloy of the first layer. Firstly, as for samples No. 39 and 43, while heat resistance and resistance to hydrofluoric acid were fair, their wiring resistances significantly increased after heat treatments at 450° C., 550° C., and 600° C., resistance to hydrofluoric acid was deteriorated for the wiring structure with a Ti layer as the second layer. It is supposed due to diffusion of Ti and underlying Al alloy. Samples No. 40 and 44 for which Mo is layered for Ti showed the similar tendency. Their wiring resistances increased after heat treatments at 450° C. or higher temperatures, presumably due to diffusion of Mo and underlying Al alloy. From these results, it was confirmed that the desired properties are not obtained for those with a refractory metal layer as the second layer.

Moreover, as for samples No. 41 and 45, while wiring resistance at high temperatures was suppressed, resistance to hydrofluoric acid was deteriorated for the wiring structure with an Al layer as the second layer. This result supports conventional observation that Al is inferior in heat resistance and resistance to hydrofluoric acid.

Furthermore, as for samples No. 42 and 46, resistance to hydrofluoric acid was deteriorated for the wiring structure consisting of the first layer only without the second layer nitride, even if they showed both low wiring resistance and high heat resistance after being subjected to a heat treatment at high temperature.

Example 2

In this example, the wiring structure was prepared in the same manner as for Example 1 except that Al alloy for the first layer and nitride for the second layer were varied as shown in Tables 2-5. After the heat treatment at 450° C. to 600° C., electrical resistance, heat resistance (hillock density), and resistance to hydrofluoric acid of the wiring structures were evaluated in the same manner as Example 1. The results are shown in Tables 2-5.

TABLE 2A

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 1 | Ti—N | Al-0.1 at % Ta-0.3 at % Nd-0.1 at % Ni-0.5 at % Ge | excellent | excellent | excellent | excellent | excellent |
| 2 | Ti—N | Al-0.1 at % Ta-0.3 at % La-0.1 at % Ni-0.5 at % Ge | excellent | excellent | excellent | excellent | excellent |
| 3 | Ti—N | Al-0.1 at % Ta-0.6 at % Nd-0.1 at % Ni-0.5 at % Ge | excellent | excellent | excellent | excellent | excellent |
| 4 | Ti—N | Al-0.1 at % Ta-0.6 at % La-0.1 at % Ni-0.5 at % Ge | excellent | excellent | excellent | excellent | excellent |
| 5 | Ti—N | Al-0.1 at % Ta-2.0 at % Nd-0.1 at % Ni-0.5 at % Ge | excellent | excellent | excellent | excellent | excellent |
| 6 | Ti—N | Al-0.1 at % Ta-2.0 at % La-0.1 at % Ni-0.5 at % Ge | excellent | excellent | excellent | excellent | excellent |
| 7 | Ti—N | Al-0.1 at % Ta-3.0 at % Nd-0.1 at % Ni-0.5 at % Ge | excellent | excellent | excellent | excellent | excellent |
| 8 | Ti—N | Al-0.1 at % Ta-3.0 at % La-0.1 at % Ni-0.5 at % Ge | excellent | excellent | excellent | excellent | excellent |
| 9 | Ti—N | Al-0.1 at % Ta-0.3 at % Nd-0.1 at % Ni-0.5 at % Cu | excellent | excellent | excellent | excellent | excellent |
| 10 | Ti—N | Al-0.1 at % Ta-0.3 at % La-0.1 at % Ni-0.5 at % Cu | excellent | excellent | excellent | excellent | excellent |
| 11 | Ti—N | Al-0.1 at % Ta-0.6 at % Nd-0.1 at % Ni-0.5 at % Cu | excellent | excellent | excellent | excellent | excellent |
| 12 | Ti—N | Al-0.1 at % Ta-0.6 at % La-0.1 at % Ni-0.5 at % Cu | excellent | excellent | excellent | excellent | excellent |
| 13 | Ti—N | Al-0.1 at % Ta-2.0 at % Nd-0.1 at % Ni-0.5 at % Cu | excellent | excellent | excellent | excellent | excellent |
| 14 | Ti—N | Al-0.1 at % Ta-2.0 at % La-0.1 at % Ni-0.5 at % Cu | excellent | excellent | excellent | excellent | excellent |
| 15 | Ti—N | Al-0.1 at % Ta-3.0 at % Nd-0.1 at % Ni-0.5 at % Cu | excellent | excellent | excellent | excellent | excellent |
| 16 | Ti—N | Al-0.1 at % Ta-3.0 at % La-0.1 at % Ni-0.5 at % Cu | excellent | excellent | excellent | excellent | excellent |
| 17 | Ti—N | Al-0.1 at % Ta-0.3 at % Nd-0.1 at % Co-0.5 at % Ge | excellent | excellent | excellent | excellent | excellent |
| 18 | Ti—N | Al-0.1 at % Ta-0.3 at % La-0.1 at % Co-0.5 at % Ge | excellent | excellent | excellent | excellent | excellent |
| 19 | Ti—N | Al-0.1 at % Ta-0.6 at % Nd-0.1 at % Co-0.5 at % Ge | excellent | excellent | excellent | excellent | excellent |
| 20 | Ti—N | Al-0.1 at % Ta-0.6 at % La-0.1 at % Co-0.5 at % Ge | excellent | excellent | excellent | excellent | excellent |
| 21 | Ti—N | Al-0.1 at % Ta-2.0 at % Nd-0.1 at % Co-0.5 at % Ge | excellent | excellent | excellent | excellent | excellent |
| 22 | Ti—N | Al-0.1 at % Ta-2.0 at % La-0.1 at % Co-0.5 at % Ge | excellent | excellent | excellent | excellent | excellent |
| 23 | Ti—N | Al-0.1 at % Ta-3.0 at % Nd-0.1 at % Co-0.5 at % Ge | excellent | excellent | excellent | excellent | excellent |
| 24 | Ti—N | Al-0.1 at % Ta-3.0 at % La-0.1 at % Co-0.5 at % Ge | excellent | excellent | excellent | excellent | excellent |

TABLE 2B

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 25 | Al-0.25 at % Ta-0.3 at % Nd-0.1 at % Ni-0.5 at % Ge—N | Al-0.25 at % Ta-0.3 at % Nd-0.1 at % Ni-0.5 at % Ge | excellent | excellent | excellent | excellent | excellent |
| 26 | Al-0.25 at % Ta-0.3 at % La-0.1 at % Ni-0.5 at % Ge—N | Al-0.25 at % Ta-0.3 at % La-0.1 at % Ni-0.5 at % Ge | excellent | excellent | excellent | excellent | excellent |
| 27 | Al-0.25 at % Ta-0.6 at % Nd-0.1 at % Ni-0.5 at % Ge—N | Al-0.25 at % Ta-0.6 at % Nd-0.1 at % Ni-0.5 at % Ge | excellent | excellent | excellent | excellent | excellent |
| 28 | Al-0.25 at % Ta-0.6 at % La-0.1 at % Ni-0.5 at % Ge—N | Al-0.25 at % Ta-0.6 at % La-0.1 at % Ni-0.5 at % Ge | excellent | excellent | excellent | excellent | excellent |
| 29 | Al-0.25 at % Ta-2.0 at % Nd-0.1 at % Ni-0.5 at % Ge—N | Al-0.25 at % Ta-2.0 at % Nd-0.1 at % Ni-0.5 at % Ge | excellent | excellent | excellent | excellent | excellent |
| 30 | Al-0.25 at % Ta-2.0 at % La-0.1 at % Ni-0.5 at % Ge—N | Al-0.25 at % Ta-2.0 at % La-0.1 at % Ni-0.5 at % Ge | excellent | excellent | excellent | excellent | excellent |
| 31 | Al-0.25 at % Ta-2.0 at % Gd-0.1 at % Ni-0.5 at % Ge—N | Al-0.25 at % Ta-2.0 at % Gd-0.1 at % Ni-0.5 at % Ge | excellent | excellent | excellent | excellent | excellent |
| 32 | Al-0.25 at % Ta-2.0 at % Y-0.1 at % Ni-0.5 at % Ge—N | Al-0.25 at % Ta-2.0 at % Y-0.1 at % Ni-0.5 at % Ge | excellent | excellent | excellent | excellent | excellent |
| 33 | Al-0.25 at % Ta-2.0 at % Ce-0.1 at % Ni-0.5 at % Ge—N | Al-0.25 at % Ta-2.0 at % Ce-0.1 at % Ni-0.5 at % Ge | excellent | excellent | excellent | excellent | excellent |
| 34 | Al-0.25 at % Ta-2.0 at % Sc-0.1 at % Ni-0.5 at % Ge—N | Al-0.25 at % Ta-2.0 at % Sc-0.1 at % Ni-0.5 at % Ge | excellent | excellent | excellent | excellent | excellent |
| 35 | Al-0.25 at % Ta-2.0 at % Dy-0.1 at % Ni-0.5 at % Ge—N | Al-0.25 at % Ta-2.0 at % Dy-0.1 at % Ni-0.5 at % Ge | excellent | excellent | excellent | excellent | excellent |
| 36 | Al-0.25 at % Ta-3.0 at % Nd-0.1 at % Ni-0.5 at % Ge—N | Al-0.25 at % Ta-3.0 at % Nd-0.1 at % Ni-0.5 at % Ge | excellent | excellent | excellent | excellent | excellent |
| 37 | Al-0.25 at % Ta-3.0 at % La-0.1 at % Ni-0.5 at % Ge—N | Al-0.25 at % Ta-3.0 at % La-0.1 at % Ni-0.5 at % Ge | excellent | excellent | excellent | excellent | excellent |
| 38 | Al-0.5 at % Ta-0.3 at % Nd-0.1 at % Ni-0.5 at % Ge—N | Al-0.5 at % Ta-0.3 at % Nd-0.1 at % Ni-0.5 at % Ge | excellent | excellent | excellent | excellent | excellent |
| 39 | Al-0.5 at % Ta-0.3 at % La-0.1 at % Ni-0.5 at % Ge—N | Al-0.5 at % Ta-0.3 at % La-0.1 at % Ni-0.5 at % Ge | excellent | excellent | excellent | excellent | excellent |
| 40 | Al-0.5 at % Ta-0.6 at % Nd-0.1 at % Ni-0.5 at % Ge—N | Al-0.5 at % Ta-0.6 at % Nd-0.1 at % Ni-0.5 at % Ge | excellent | excellent | excellent | excellent | excellent |

TABLE 2B-continued

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 41 | Al-0.5 at % Ta-0.6 at % La-0.1 at % Ni-0.5 at % Ge—N | Al-0.5 at % Ta-0.6 at % La-0.1 at % Ni-0.5 at % Ge | excellent | excellent | excellent | excellent | excellent |
| 42 | Al-0.5 at % Ta-2.0 at % Nd-0.1 at % Ni-0.5 at % Ge—N | Al-0.5 at % Ta-2.0 at % Nd-0.1 at % Ni-0.5 at % Ge | excellent | excellent | excellent | excellent | excellent |
| 43 | Al-0.5 at % Ta-2.0 at % La-0.1 at % Ni-0.5 at % Ge—N | Al-0.5 at % Ta-2.0 at % La-0.1 at % Ni-0.5 at % Ge | excellent | excellent | excellent | excellent | excellent |
| 44 | Al-0.5 at % Ta-2.0 at % Gd-0.1 at % Ni-0.5 at % Ge—N | Al-0.5 at % Ta-2.0 at % Gd-0.1 at % Ni-0.5 at % Ge | excellent | excellent | excellent | excellent | excellent |
| 45 | Al-0.5 at % Ta-2.0 at % Y-0.1 at % Ni-0.5 at % Ge—N | Al-0.5 at % Ta-2.0 at % Y-0.1 at % Ni-0.5 at % Ge | excellent | excellent | excellent | excellent | excellent |
| 46 | Al-0.5 at % Ta-2.0 at % Ce-0.1 at % Ni-0.5 at % Ge—N | Al-0.5 at % Ta-2.0 at % Ce-0.1 at % Ni-0.5 at % Ge | excellent | excellent | excellent | excellent | excellent |
| 47 | Al-0.5 at % Ta-2.0 at % Sc-0.1 at % Ni-0.5 at % Ge—N | Al-0.5 at % Ta-2.0 at % Sc-0.1 at % Ni-0.5 at % Ge | excellent | excellent | excellent | excellent | excellent |
| 48 | Al-0.5 at % Ta-2.0 at % Dy-0.1 at % Ni-0.5 at % Ge—N | Al-0.5 at % Ta-2.0 at % Dy-0.1 at % Ni-0.5 at % Ge | excellent | excellent | excellent | excellent | excellent |
| 49 | Al-0.5 at % Ta-3.0 at % Nd-0.1 at % Ni-0.5 at % Ge—N | Al-0.5 at % Ta-3.0 at % Nd-0.1 at % Ni-0.5 at % Ge | excellent | excellent | excellent | excellent | excellent |
| 50 | Al-0.5 at % Ta-3.0 at % La-0.1 at % Ni-0.5 at % Ge—N | Al-0.5 at % Ta-3.0 at % La-0.1 at % Ni-0.5 at % Ge | excellent | excellent | excellent | excellent | excellent |

TABLE 2C

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 51 | Al-0.5 at % Ta-0.3 at % Nd-0.1 at % Co-0.5 at % Ge—N | Al-0.5 at % Ta-0.3 at % Nd-0.1 at % Co-0.5 at % Ge | excellent | excellent | excellent | excellent | excellent |
| 52 | Al-0.5 at % Ta-0.3 at % La-0.1 at % Co-0.5 at % Ge—N | Al-0.5 at % Ta-0.3 at % La-0.1 at % Co-0.5 at % Ge | excellent | excellent | excellent | excellent | excellent |
| 53 | Al-0.5 at %Ta-0.6 at % La-0.1 at % Co-0.5 at % Ge—N | Al-0.5 at % Ta-0.6 at % La-0.1 at % Co-0.5 at % Ge | excellent | excellent | excellent | excellent | excellent |
| 54 | Al-0.5 at % Ta-2.0 at % Nd-0.1 at % Co-0.5 at % Ge—N | Al-0.5 at % Ta-2.0 at % Nd-0.1 at % Co-0.5 at % Ge | excellent | excellent | excellent | excellent | excellent |
| 55 | Al-0.5 at % Ta-2.0 at % La-0.1 at % Co-0.5 at % Ge—N | Al-0.5 at % Ta-2.0 at % La-0.1 at % Co-0.5 at % Ge | excellent | excellent | excellent | excellent | excellent |
| 56 | Al-0.5 at % Ta-3.0 at % Nd-0.1 at % Co-0.5 at % Ge—N | Al-0.5 at % Ta-3.0 at % Nd-0.1 at % Co-0.5 at % Ge | excellent | excellent | excellent | excellent | excellent |
| 57 | Al-0.5 at % Ta-3.0 at % La-0.1 at % Co-0.5 at % Ge—N | Al-0.5 at % Ta-3.0 at % La-0.1 at % Co-0.5 at % Ge | excellent | excellent | excellent | excellent | excellent |
| 58 | Al-0.5 at % Ta-0.3 at % Nd-0.1 at % Ni-0.3 at % Ge—N | Al-0.5 at % Ta-0.3 at % Nd-0.1 at % Ni-0.3 at % Ge | excellent | excellent | excellent | excellent | excellent |
| 59 | Al-0.5 at % Ta-0.3 at % La-0.1 at % Ni-0.3 at % Ge—N | Al-0.5 at % Ta-0.3 at % La-0.1 at % Ni-0.3 at % Ge | excellent | excellent | excellent | excellent | excellent |
| 60 | Al-0.5 at % Ta-3.0 at % Nd-0.1 at % Ni-0.3 at % Ge—N | Al-0.5 at % Ta-3.0 at % Nd-0.1 at % Ni-0.3 at % Ge | excellent | excellent | excellent | excellent | excellent |
| 61 | Al-0.5 at % Ta-3.0 at % La-0.1 at % Ni-0.3 at % Ge—N | Al-0.5 at % Ta-3.0 at % La-0.1 at % Ni-0.3 at % Ge | excellent | excellent | excellent | excellent | excellent |
| 62 | Al-0.5 at % Ta-0.3 at % Nd-0.1 at % Ni-1.0 at % Ge—N | Al-0.5 at % Ta-0.3 at % Nd-0.1 at % Ni-1.0 at % Ge | excellent | excellent | excellent | excellent | excellent |
| 63 | Al-0.5 at % Ta-0.3 at % La-0.1 at % Ni-1.0 at % Ge—N | Al-0.5 at % Ta-0.3 at % La-0.1 at % Ni-1.0 at % Ge | excellent | excellent | excellent | excellent | excellent |
| 64 | Al-0.5 at % Ta-3.0 at % Nd-0.1 at % Ni-1.0 at % Ge—N | Al-0.5 at % Ta-3.0 at % Nd-0.1 at % Ni-1.0 at % Ge | excellent | excellent | excellent | excellent | excellent |
| 65 | Al-0.5 at % Ta-3.0 at % La-0.1 at % Ni-1.0 at % Ge—N | Al-0.5 at % Ta-3.0 at % La-0.1 at % Ni-1.0 at % Ge | excellent | excellent | excellent | excellent | excellent |
| 66 | Al-0.5 at % Ta-0.3 at % Nd-0.1 at % Ni-2.0 at % Ge—N | Al-0.5 at % Ta-0.3 at % Nd-0.1 at % Ni-2.0 at % Ge | excellent | excellent | excellent | excellent | excellent |
| 67 | Al-0.5 at % Ta-0.3 at % La-0.1 at % Ni-2.0 at % Ge—N | Al-0.5 at % Ta-0.3 at % La-0.1 at % Ni-2.0 at % Ge | excellent | excellent | excellent | excellent | excellent |
| 68 | Al-0.5 at % Ta-3.0 at % Nd-0.1 at % Ni-2.0 at % Ge—N | Al-0.5 at % Ta-3.0 at % Nd-0.1 at % Ni-2.0 at % Ge | excellent | excellent | excellent | excellent | excellent |
| 69 | Al-0.5 at % Ta-3.0 at % La-0.1 at % Ni-2.0 at % Ge—N | Al-0.5 at % Ta-3.0 at % La-0.1 at % Ni-2.0 at % Ge | excellent | excellent | excellent | excellent | excellent |
| 70 | Al-0.5 at % Ta-0.3 at % Nd-0.1 at % Ni-0.5 at % Cu—N | Al-0.5 at % Ta-0.3 at % Nd-0.1 at % Ni-0.5 at % Cu | excellent | excellent | excellent | excellent | excellent |
| 71 | Al-0.5 at % Ta-0.3 at % La-0.1 at % Ni-0.5 at % Cu—N | Al-0.5 at % Ta-0.3 at % La-0.1 at % Ni-0.5 at % Cu | excellent | excellent | excellent | excellent | excellent |
| 72 | Al-0.5 at % Ta-3.0 at % Nd-0.1 at % Ni-0.5 at % Cu—N | Al-0.5 at % Ta-3.0 at % Nd-0.1 at % Ni-0.5 at % Cu | excellent | excellent | excellent | excellent | excellent |

TABLE 2C-continued

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 73 | Al-0.5 at % Ta-3.0 at % La-0.1 at % Ni-0.5 at % Cu—N | Al-0.5 at % Ta-3.0 at % La-0.1 at % Ni-0.5 at % Cu | excellent | excellent | excellent | excellent | excellent |
| 74 | Al-0.5 at % Ta-3.0 at % Nd-2.0 at % Ni-0.5 at % Ge—N | Al-0.5 at % Ta-3.0 at % Nd-2.0 at % Ni-0.5 at % Ge | excellent | excellent | excellent | excellent | excellent |
| 75 | Al-0.5 at % Ta-3.0 at % La-2.0 at % Ni-0.5 at % Ge—N | Al-0.5 at % Ta-3.0 at % La-2.0 at % Ni-0.5 at % Ge | excellent | excellent | excellent | excellent | excellent |

TABLE 2D

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 76 | Al-0.5 at % Ta-0.1 at % Zr-0.2 at % Nd-0.1 at % Ni-0.5 at % Ge—N | Al-0.5 at % Ta-0.1 at % Zr-0.2 at % Nd-0.1 at % Ni-0.5 at % Ge | excellent | excellent | excellent | excellent | excellent |
| 77 | Al-0.5 at % Ta-0.35 at % Zr-0.2 at % Nd-0.1 at % Ni-0.5 at % Ge—N | Al-0.5 at % Ta-0.35 at % Zr-0.2 at % Nd-0.1 at % Ni-0.5 at % Ge | excellent | excellent | excellent | excellent | excellent |
| 78 | Al-0.5 at % Ta-0.5 at % Zr-0.2 at % Nd-0.1 at % Ni-0.5 at % Ge—N | Al-0.5 at % Ta-0.5 at % Zr-0.2 at % Nd-0.1 at % Ni-0.5 at % Ge | excellent | excellent | excellent | excellent | excellent |
| 79 | Al-0.1 at % Ta-0.35 at % Zr-0.2 at % Nd-0.1 at % Ni-0.5 at % Ge—N | Al-0.1 at % Ta-0.35 at % Zr-0.2 at % Nd-0.1 at % Ni-0.5 at % Ge | excellent | excellent | excellent | excellent | excellent |
| 80 | Al-0.35 at % Ta-0.35 at % Zr-0.2 at % Nd-0.1 at % Ni-0.5 at % Ge—N | Al-0.35 at % Ta-0.35 at % Zr-0.2 at % Nd-0.1 at % Ni-0.5 at % Ge | excellent | excellent | excellent | excellent | excellent |
| 81 | Al-0.5 at % Ta-0.35 at % Zr-0.2 at % La-0.1 at % Ni-0.5 at % Ge—N | Al-0.5 at % Ta-0.35 at % Zr-0.2 at % La-0.1 at % Ni-0.5 at % Ge | excellent | excellent | excellent | excellent | excellent |
| 82 | Al-0.5 at % Ta-0.35 at % Zr-0.2 at % Gd-0.1 at % Ni-0.5 at % Ge—N | Al-0.5 at % Ta-0.35 at % Zr-0.2 at % Gd-0.1 at % Ni-0.5 at % Ge | excellent | excellent | excellent | excellent | excellent |
| 83 | Al-0.1 at % Ta-0.3 at % La-0.1 at % Ni—N | Al-0.1 at % Ta-0.3 at % La-0.1 at % Ni | excellent | excellent | excellent | excellent | excellent |
| 84 | Al-0.1 at % Ta-3.0 at % La-0.1 at % Ni—N | Al-0.1 at % Ta-3.0 at % La-0.1 at % Ni | excellent | excellent | excellent | excellent | excellent |
| 85 | Al-0.5 at % Ta-0.3 at % La-0.1 at % Ni—N | Al-0.5 at % Ta-0.3 at % La-0.1 at % Ni | excellent | excellent | excellent | excellent | excellent |
| 86 | Al-0.5 at % Ta-3.0 at % La-0.1 at % Ni—N | Al-0.5 at % Ta-3.0 at % La-0.1 at % Ni | excellent | excellent | excellent | excellent | excellent |
| 87 | Al-0.5 at % Ta-0.3 at % La-0.1 at % Co—N | Al-0.5 at % Ta-0.3 at % La-0.1 at % Co | excellent | excellent | excellent | excellent | excellent |
| 88 | Al-0.5 at % Ta-3.0 at % La-0.1 at % Co—N | Al-0.5 at % Ta-3.0 at % La-0.1 at % Co | excellent | excellent | excellent | excellent | excellent |
| 89 | Al-5.0 at % Ta-0.3 at % La-0.1 at % Ni—N | Al-5.0 at % Ta-0.3 at % La-0.1 at % Ni | excellent | excellent | excellent | excellent | excellent |
| 90 | Al-5.0 at % Ta-0.3 at % La-0.1 at % Ni—N | Al-5.0 at % Ta-0.3 at % La-0.1 at % Ni | excellent | excellent | excellent | excellent | excellent |
| 91 | Al-0.1 at % Ta-0.3 at % La-0.2 at % Ge—N | Al-0.1 at % Ta-0.3 at % La-0.2 at % Ge | excellent | excellent | excellent | excellent | excellent |
| 92 | Al-0.1 at % Ta-3.0 at % La-0.2 at % Ge—N | Al-0.1 at % Ta-3.0 at % La-0.2 at % Ge | excellent | excellent | excellent | excellent | excellent |
| 93 | Al-0.5 at % Ta-0.3 at % La-0.2 at % Ge—N | Al-0.5 at % Ta-0.3 at % La-0.2 at % Ge | excellent | excellent | excellent | excellent | excellent |
| 94 | Al-0.5 at % Ta-3.0 at % La-0.2 at % Ge—N | Al-0.5 at % Ta-3.0 at % La-0.2 at % Ge | excellent | excellent | excellent | excellent | excellent |
| 95 | Al-5.0 at % Ta-0.3 at % La-0.2 at % Ge—N | Al-5.0 at % Ta-0.3 at % La-0.2 at % Ge | excellent | excellent | excellent | excellent | excellent |
| 96 | Al-5.0 at % Ta-3.0 at % La-0.2 at % Ge—N | Al-5.0 at % Ta-3.0 at % La-0.2 at % Ge | excellent | excellent | excellent | excellent | excellent |
| 97 | Al-0.1 at % Ta-0.3 at % La-0.5 at % Ge—N | Al-0.1 at % Ta-0.3 at % La-0.5 at % Ge | excellent | excellent | excellent | excellent | excellent |
| 98 | Al-0.1 at % Ta-3.0 at % La-0.5 at % Ge—N | Al-0.1 at % Ta-3.0 at % La-0.5 at % Ge | excellent | excellent | excellent | excellent | excellent |
| 99 | Al-0.25 at % Ta-0.3 at % La-0.5 at % Ge—N | Al-0.25 at % Ta-0.3 at % La-0.5 at % Ge | excellent | excellent | excellent | excellent | excellent |
| 100 | Al-0.25 at % Ta-3.0 at % La-0.5 at % Ge—N | Al-0.25 at % Ta-3.0 at % La-0.5 at % Ge | excellent | excellent | excellent | excellent | excellent |

TABLE 2E

| No. | The second layer (thickness: 50 nm) Composition | The first layer (thickness: 300 nm) Composition | Wiring resistance | | | Heat resistance (hillock density) | Resistance to 0.5% HF |
|---|---|---|---|---|---|---|---|
| | | | 450° C. | 550° C. | 600° C. | 600° C. | 600° C. |
| 101 | Al-0.5 at % Ta-0.3 at % La-0.5 at % Ge—N | Al-0.5 at % Ta-0.3 at % La-0.5 at % Ge | excellent | excellent | excellent | excellent | excellent |
| 102 | Al-0.5 at % Ta-0.6 at % La-0.5 at % Ge—N | Al-0.5 at % Ta-0.6 at % La-0.5 at % Ge | excellent | excellent | excellent | excellent | excellent |
| 103 | Al-0.5 at % Ta-2.0 at % La-0.5 at % Ge—N | Al-0.5 at % Ta-2.0 at % La-0.5 at % Ge | excellent | excellent | excellent | excellent | excellent |
| 104 | Al-0.5 at % Ta-2.0 at % Nd-0.5 at % Ge—N | Al-0.5 at % Ta-2.0 at % Nd-0.5 at % Ge | excellent | excellent | excellent | excellent | excellent |
| 105 | Al-0.5 at % Ta-2.0 at % Gd-0.5 at % Ge—N | Al-0.5 at % Ta-2.0 at % Gd-0.5 at % Ge | excellent | excellent | excellent | excellent | excellent |
| 106 | Al-0.5 at % Ta-2.0 at % Y-0.5 at % Ge—N | Al-0.5 at % Ta-2.0 at % Y-0.5 at % Ge | excellent | excellent | excellent | excellent | excellent |
| 107 | Al-0.5 at % Ta-2.0 at % Sc-0.5 at % Ge—N | Al-0.5 at % Ta-2.0 at % Sc-0.5 at % Ge | excellent | excellent | excellent | excellent | excellent |
| 108 | Al-0.5 at % Ta-2.0 at % Ce-0.5 at % Ge—N | Al-0.5 at % Ta-2.0 at % Ce-0.5 at % Ge | excellent | excellent | excellent | excellent | excellent |
| 109 | Al-0.5 at % Ta-2.0 at % Dy-0.5 at % Ge—N | Al-0.5 at % Ta-2.0 at % Dy-0.5 at % Ge | excellent | excellent | excellent | excellent | excellent |
| 110 | Al-0.5 at % Ta-3.0 at % La-0.5 at % Ge—N | Al-0.5 at % Ta-3.0 at % La-0.5 at % Ge | excellent | excellent | excellent | excellent | excellent |
| 111 | Al-1.5 at % Ta-0.3 at % La-0.5 at % Ge—N | Al-1.5 at % Ta-0.3 at % La-0.5 at % Ge | excellent | excellent | excellent | excellent | excellent |
| 112 | Al-1.5 at % Ta-3.0 at % La-0.5 at % Ge—N | Al-1.5 at % Ta-3.0 at % La-0.5 at % Ge | excellent | excellent | excellent | excellent | excellent |
| 113 | Al-5.0 at % Ta-0.3 at % La-0.5 at % Ge—N | Al-5.0 at % Ta-0.3 at % La-0.5 at % Ge | excellent | excellent | excellent | excellent | excellent |
| 114 | Al-5.0 at % Ta-3.0 at % La-0.5 at % Ge—N | Al-5.0 at % Ta-3.0 at % La-0.5 at % Ge | excellent | excellent | excellent | excellent | excellent |
| 115 | Al-0.1 at % Ta-0.3 at % La-0.5 at % Cu—N | Al-0.1 at % Ta-0.3 at % La-0.5 at % Cu | excellent | excellent | excellent | excellent | excellent |
| 116 | Al-0.1 at % Ta-3.0 at % La-0.5 at % Cu—N | Al-0.1 at % Ta-3.0 at % La-0.5 at % Cu | excellent | excellent | excellent | excellent | excellent |
| 117 | Al-0.5 at % Ta-0.3 at % La-0.5 at % Cu—N | Al-0.5 at % Ta-0.3 at % La-0.5 at % Cu | excellent | excellent | excellent | excellent | excellent |
| 118 | Al-0.5 at % Ta-3.0 at % La-0.5 at % Cu—N | Al-0.5 at % Ta-3.0 at % La-0.5 at % Cu | excellent | excellent | excellent | excellent | excellent |
| 119 | Al-5.0 at % Ta-0.3 at % La-0.5 at % Cu—N | Al-5.0 at % Ta-0.3 at % La-0.5 at % Cu | excellent | excellent | excellent | excellent | excellent |
| 120 | Al-5.0 at % Ta-3.0 at % La-0.5 at % Cu—N | Al-5.0 at % Ta-3.0 at % La-0.5 at % Cu | excellent | excellent | excellent | excellent | excellent |
| 121 | Al-0.1 at % Ta-0.3 at % La-2.0 at % Ge—N | Al-0.1 at % Ta-0.3 at % La-2.0 at % Ge | excellent | excellent | excellent | excellent | excellent |
| 122 | Al-0.1 at % Ta-3.0 at % La-2.0 at % Ge—N | Al-0.1 at % Ta-3.0 at % La-2.0 at % Ge | excellent | excellent | excellent | excellent | excellent |
| 123 | Al-0.5 at % Ta-0.3 at % La-2.0 at % Ge—N | Al-0.5 at % Ta-0.3 at % La-2.0 at % Ge | excellent | excellent | excellent | excellent | excellent |
| 124 | Al-0.5 at % Ta-3.0 at % La-2.0 at % Ge—N | Al-0.5 at % Ta-3.0 at % La-2.0 at % Ge | excellent | excellent | excellent | excellent | excellent |

TABLE 2F

| No. | The second layer (thickness: 50 nm) Composition | The first layer (thickness: 300 nm) Composition | Wiring resistance | | | Heat resistance (hillock density) | Resistance to 0.5% HF |
|---|---|---|---|---|---|---|---|
| | | | 450° C. | 550° C. | 600° C. | 600° C. | 600° C. |
| 125 | Al-0.1 at % Ta-0.2 at % La—N | Al-0.1 at % Ta-0.2 at % La | excellent | excellent | excellent | excellent | excellent |
| 126 | Al-0.5 at % Ta-0.2 at % La—N | Al-0.5 at % Ta-0.2 at % La | excellent | excellent | excellent | excellent | excellent |
| 127 | Al-5.0 at % Ta-0.2 at % La—N | Al-5.0 at % Ta-0.2 at % La | excellent | excellent | excellent | excellent | excellent |
| 128 | Al-0.1 at % Ta-0.2 at % Nd—N | Al-0.1 at % Ta-0.2 at % Nd | excellent | excellent | excellent | excellent | excellent |
| 129 | Al-0.5 at % Ta-0.2 at % Nd—N | Al-0.5 at % Ta-0.2 at % Nd | excellent | excellent | excellent | excellent | excellent |
| 130 | Al-5.0 at % Ta-0.2 at % Nd—N | Al-5.0 at % Ta-0.2 at % Nd | excellent | excellent | excellent | excellent | excellent |
| 131 | Al-0.5 at % Ta-2.0 at % La—N | Al-0.5 at % Ta-2.0 at % La | excellent | excellent | excellent | excellent | excellent |
| 132 | Al-5.0 at % Ta-2.0 at % La—N | Al-5.0 at % Ta-2.0 at % La | excellent | excellent | excellent | excellent | excellent |
| 133 | Al-0.1 at % Ta-2.0 at % Nd—N | Al-0.1 at % Ta-2.0 at % Nd | excellent | excellent | excellent | excellent | excellent |
| 134 | Al-0.5 at % Ta-2.0 at % Nd—N | Al-0.5 at % Ta-2.0 at % Nd | excellent | excellent | excellent | excellent | excellent |
| 135 | Al-5.0 at % Ta-2.0 at % Nd—N | Al-5.0 at % Ta-2.0 at % Nd | excellent | excellent | excellent | excellent | excellent |
| 136 | Al-0.5 at % Ta-3.0 at % La—N | Al-0.5 at % Ta-3.0 at % La | excellent | excellent | excellent | excellent | excellent |

TABLE 2F-continued

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 137 | Al-5.0 at % Ta-3.0 at % La—N | Al-5.0 at % Ta-3.0 at % La | excellent | excellent | excellent | excellent | excellent |
| 138 | Al-0.5 at % Ta-3.0 at % Nd—N | Al-0.5 at % Ta-3.0 at % Nd | excellent | excellent | excellent | excellent | excellent |
| 139 | Al-5.0 at % Ta-3.0 at % Nd—N | Al-5.0 at % Ta-3.0 at % Nd | excellent | excellent | excellent | excellent | excellent |

TABLE 3A

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 1 | Ti—N | Al-0.1 at % Ta-0.3 at % Nd-0.1 at % Ni-0.5 at % Ge | excellent | excellent | excellent | excellent | excellent |
| 2 | Ti—N | Al-0.1 at % Ta-0.3 at % La-0.1 at % Ni-0.5 at % Ge | excellent | excellent | excellent | excellent | excellent |
| 3 | Ti—N | Al-0.1 at % Ta-0.6 at % Nd-0.1 at % Ni-0.5 at % Ge | excellent | excellent | excellent | excellent | excellent |
| 4 | Ti—N | Al-0.1 at % Ta-0.6 at % La-0.1 at % Ni-0.5 at % Ge | excellent | excellent | excellent | excellent | excellent |
| 5 | Ti—N | Al-0.1 at % Ta-2.0 at % Nd-0.1 at % Ni-0.5 at % Ge | excellent | excellent | excellent | excellent | excellent |
| 6 | Ti—N | Al-0.1 at % Ta-2.0 at % La-0.1 at % Ni-0.5 at % Ge | excellent | excellent | excellent | excellent | excellent |
| 7 | Ti—N | Al-0.1 at % Ta-3.0 at % Nd-0.1 at % Ni-0.5 at % Ge | excellent | excellent | excellent | excellent | excellent |
| 8 | Ti—N | Al-0.1 at % Ta-3.0 at % La-0.1 at % Ni-0.5 at % Ge | excellent | excellent | excellent | excellent | excellent |
| 9 | Ti—N | Al-0.1 at % Ta-0.3 at % Nd-0.1 at % Ni-0.5 at % Cu | excellent | excellent | excellent | excellent | excellent |
| 10 | Ti—N | Al-0.1 at % Ta-0.3 at % La-0.1 at % Ni-0.5 at % Cu | excellent | excellent | excellent | excellent | excellent |
| 11 | Ti—N | Al-0.1 at % Ta-0.6 at % Nd-0.1 at % Ni-0.5 at % Cu | excellent | excellent | excellent | excellent | excellent |
| 12 | Ti—N | Al-0.1 at % Ta-0.6 at % La-0.1 at % Ni-0.5 at % Cu | excellent | excellent | excellent | excellent | excellent |
| 13 | Ti—N | Al-0.1 at % Ta-2.0 at % Nd-0.1 at % Ni-0.5 at % Cu | excellent | excellent | excellent | excellent | excellent |
| 14 | Ti—N | Al-0.1 at % Ta-2.0 at % La-0.1 at % Ni-0.5 at % Cu | excellent | excellent | excellent | excellent | excellent |
| 15 | Ti—N | Al-0.1 at % Ta-3.0 at % Nd-0.1 at % Ni-0.5 at % Cu | excellent | excellent | excellent | excellent | excellent |
| 16 | Ti—N | Al-0.1 at % Ta-3.0 at % La-0.1 at % Ni-0.5 at % Cu | excellent | excellent | excellent | excellent | excellent |
| 17 | Ti—N | Al-0.1 at % Ta-0.3 at % Nd-0.1 at % Co-0.5 at % Ge | excellent | excellent | excellent | excellent | excellent |
| 18 | Ti—N | Al-0.1 at % Ta-0.3 at % La-0.1 at % Co-0.5 at % Ge | excellent | excellent | excellent | excellent | excellent |
| 19 | Ti—N | Al-0.1 at % Ta-0.6 at % Nd-0.1 at % Co-0.5 at % Ge | excellent | excellent | excellent | excellent | excellent |
| 20 | Ti—N | Al-0.1 at % Ta-0.6 at % La-0.1 at % Co-0.5 at % Ge | excellent | excellent | excellent | excellent | excellent |
| 21 | Ti—N | Al-0.1 at % Ta-2.0 at % Nd-0.1 at % Co-0.5 at % Ge | excellent | excellent | excellent | excellent | excellent |
| 22 | Ti—N | Al-0.1 at % Ta-2.0 at % La-0.1 at % Co-0.5 at % Ge | excellent | excellent | excellent | excellent | excellent |
| 23 | Ti—N | Al-0.1 at % Ta-3.0 at % Nd-0.1 at % Co-0.5 at % Ge | excellent | excellent | excellent | excellent | excellent |
| 24 | Ti—N | Al-0.1 at % Ta-3.0 at % La-0.1 at % Co-0.5 at % Ge | excellent | excellent | excellent | excellent | excellent |

TABLE 3B

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 25 | Ti—N | Al-0.25 at % Ta-0.3 at % Nd-0.1 at % Ni-0.5 at % Ge | excellent | excellent | excellent | excellent | excellent |
| 26 | Ti—N | Al-0.25 at % Ta-0.3 at % La-0.1 at % Ni-0.5 at % Ge | excellent | excellent | excellent | excellent | excellent |
| 27 | Ti—N | Al-0.25 at % Ta-0.6 at % Nd-0.1 at % Ni-0.5 at % Ge | excellent | excellent | excellent | excellent | excellent |
| 28 | Ti—N | Al-0.25 at % Ta-0.6 at % La-0.1 at % Ni-0.5 at % Ge | excellent | excellent | excellent | excellent | excellent |
| 29 | Ti—N | Al-0.25 at % Ta-2.0 at % Nd-0.1 at % Ni-0.5 at % Ge | excellent | excellent | excellent | excellent | excellent |
| 30 | Ti—N | Al-0.25 at % Ta-2.0 at % La-0.1 at % Ni-0.5 at % Ge | excellent | excellent | excellent | excellent | excellent |
| 31 | Ti—N | Al-0.25 at % Ta-2.0 at % Gd-0.1 at % Ni-0.5 at % Ge | excellent | excellent | excellent | excellent | excellent |
| 32 | Ti—N | Al-0.25 at % Ta-2.0 at % Y-0.1 at % Ni-0.5 at % Ge | excellent | excellent | excellent | excellent | excellent |
| 33 | Ti—N | Al-0.25 at % Ta-2.0 at % Ce-0.1 at % Ni-0.5 at % Ge | excellent | excellent | excellent | excellent | excellent |
| 34 | Ti—N | Al-0.25 at % Ta-2.0 at % Sc-0.1 at % Ni-0.5 at % Ge | excellent | excellent | excellent | excellent | excellent |
| 35 | Ti—N | Al-0.25 at % Ta-2.0 at % Dy-0.1 at % Ni-0.5 at % Ge | excellent | excellent | excellent | excellent | excellent |
| 36 | Ti—N | Al-0.25 at % Ta-3.0 at % Nd-0.1 at % Ni-0.5 at % Ge | excellent | excellent | excellent | excellent | excellent |
| 37 | Ti—N | Al-0.25 at % Ta-3.0 at % La-0.1 at % Ni-0.5 at % Ge | excellent | excellent | excellent | excellent | excellent |
| 38 | Ti—N | Al-0.5 at % Ta-0.3 at % Nd-0.1 at % Ni-0.5 at % Ge | excellent | excellent | excellent | excellent | excellent |
| 39 | Ti—N | Al-0.5 at % Ta-0.3 at % La-0.1 at % Ni-0.5 at % Ge | excellent | excellent | excellent | excellent | excellent |
| 40 | Ti—N | Al-0.5 at % Ta-0.6 at % Nd-0.1 at % Ni-0.5 at % Ge | excellent | excellent | excellent | excellent | excellent |
| 41 | Ti—N | Al-0.5 at % Ta-0.6 at % La-0.1 at % Ni-0.5 at % Ge | excellent | excellent | excellent | excellent | excellent |
| 42 | Ti—N | Al-0.5 at % Ta-2.0 at % Nd-0.1 at % Ni-0.5 at % Ge | excellent | excellent | excellent | excellent | excellent |
| 43 | Ti—N | Al-0.5 at % Ta-2.0 at % La-0.1 at % Ni-0.5 at % Ge | excellent | excellent | excellent | excellent | excellent |
| 44 | Ti—N | Al-0.5 at % Ta-2.0 at % Gd-0.1 at % Ni-0.5 at % Ge | excellent | excellent | excellent | excellent | excellent |
| 45 | Ti—N | Al-0.5 at % Ta-2.0 at % Y-0.1 at % Ni-0.5 at % Ge | excellent | excellent | excellent | excellent | excellent |
| 46 | Ti—N | Al-0.5 at % Ta-2.0 at % Ce-0.1 at % Ni-0.5 at % Ge | excellent | excellent | excellent | excellent | excellent |
| 47 | Ti—N | Al-0.5 at % Ta-2.0 at % Sc-0.1 at % Ni-0.5 at % Ge | excellent | excellent | excellent | excellent | excellent |

TABLE 3B-continued

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 48 | Ti—N | Al-0.5 at % Ta-2.0 at % Dy-0.1 at % Ni-0.5 at % Ge | excellent | excellent | excellent | excellent | excellent |
| 49 | Ti—N | Al-0.5 at % Ta-3.0 at % Nd-0.1 at % Ni-0.5 at % Ge | excellent | excellent | excellent | excellent | excellent |
| 50 | Ti—N | Al-0.5 at % Ta-3.0 at % La-0.1 at % Ni-0.5 at % Ge | excellent | excellent | excellent | excellent | excellent |

TABLE 3C

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 51 | Ti—N | Al-0.5 at % Ta-0.3 at % Nd-0.1 at % Co-0.5 at % Ge | excellent | excellent | excellent | excellent | excellent |
| 52 | Ti—N | Al-0.5 at % Ta-0.3 at % La-0.1 at % Co-0.5 at % Ge | excellent | excellent | excellent | excellent | excellent |
| 53 | Ti—N | Al-0.5 at % Ta-0.6 at % La-0.1 at % Co-0.5 at % Ge | excellent | excellent | excellent | excellent | excellent |
| 54 | Ti—N | Al-0.5 at % Ta-2.0 at % Nd-0.1 at % Co-0.5 at % Ge | excellent | excellent | excellent | excellent | excellent |
| 55 | Ti—N | Al-0.5 at % Ta-2.0 at % La-0.1 at % Co-0.5 at % Ge | excellent | excellent | excellent | excellent | excellent |
| 56 | Ti—N | Al-0.5 at % Ta-3.0 at % Nd-0.1 at % Co-0.5 at % Ge | excellent | excellent | excellent | excellent | excellent |
| 57 | Ti—N | Al-0.5 at % Ta-3.0 at % La-0.1 at % Co-0.5 at % Ge | excellent | excellent | excellent | excellent | excellent |
| 58 | Ti—N | Al-0.5 at % Ta-0.3 at % Nd-0.1 at % Ni-0.3 at % Ge | excellent | excellent | excellent | excellent | excellent |
| 59 | Ti—N | Al-0.5 at % Ta-0.3 at % La-0.1 at % Ni-0.3 at % Ge | excellent | excellent | excellent | excellent | excellent |
| 60 | Ti—N | Al-0.5 at % Ta-3.0 at % Nd-0.1 at % Ni-0.3 at % Ge | excellent | excellent | excellent | excellent | excellent |
| 61 | Ti—N | Al-0.5 at % Ta-3.0 at % La-0.1 at % Ni-0.3 at % Ge | excellent | excellent | excellent | excellent | excellent |
| 62 | Ti—N | Al-0.5 at % Ta-0.3 at % Nd-0.1 at % Ni-1.0 at % Ge | excellent | excellent | excellent | excellent | excellent |
| 63 | Ti—N | Al-0.5 at % Ta-0.3 at % La-0.1 at % Ni-1.0 at % Ge | excellent | excellent | excellent | excellent | excellent |
| 64 | Ti—N | Al-0.5 at % Ta-3.0 at % Nd-0.1 at % Ni-1.0 at % Ge | excellent | excellent | excellent | excellent | excellent |
| 65 | Ti—N | Al-0.5 at % Ta-3.0 at % La-0.1 at % Ni-1.0 at % Ge | excellent | excellent | excellent | excellent | excellent |
| 66 | Ti—N | Al-0.5 at % Ta-0.3 at % Nd-0.1 at % Ni-2.0 at % Ge | excellent | excellent | excellent | excellent | excellent |
| 67 | Ti—N | Al-0.5 at % Ta-0.3 at % La-0.1 at % Ni-2.0 at % Ge | excellent | excellent | excellent | excellent | excellent |
| 68 | Ti—N | Al-0.5 at % Ta-3.0 at % Nd-0.1 at % Ni-2.0 at % Ge | excellent | excellent | excellent | excellent | excellent |
| 69 | Ti—N | Al-0.5 at % Ta-3.0 at % La-0.1 at % Ni-2.0 at % Ge | excellent | excellent | excellent | excellent | excellent |
| 70 | Ti—N | Al-0.5 at % Ta-0.3 at % Nd-0.1 at % Ni-0.5 at % Cu | excellent | excellent | excellent | excellent | excellent |
| 71 | Ti—N | Al-0.5 at % Ta-0.3 at % La-0.1 at % Ni-0.5 at % Cu | excellent | excellent | excellent | excellent | excellent |
| 72 | Ti—N | Al-0.5 at % Ta-3.0 at % Nd-0.1 at % Ni-0.5 at % Cu | excellent | excellent | excellent | excellent | excellent |
| 73 | Ti—N | Al-0.5 at % Ta-3.0 at % La-0.1 at % Ni-0.5 at % Cu | excellent | excellent | excellent | excellent | excellent |
| 74 | Ti—N | Al-0.5 at % Ta-3.0 at %Nd-2.0 at % Ni-0.5 at % Ge | excellent | excellent | excellent | excellent | excellent |
| 75 | Ti—N | Al-0.5 at % Ta-3.0 at % La-2.0 at % Ni-0.5 at % Ge | excellent | excellent | excellent | excellent | excellent |

TABLE 3D

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 76 | Ti—N | Al-0.5 at % Ta-0.1 at % Zr-0.2 at % Nd-0.1 at % Ni-0.5 at % Ge | excellent | excellent | excellent | excellent | excellent |
| 77 | Ti—N | Al-0.5 at % Ta-0.35 at % Zr-0.2 at % Nd-0.1 at % Ni-0.5 at % Ge | excellent | excellent | excellent | excellent | excellent |
| 78 | Ti—N | Al-0.5 at % Ta-0.5 at % Zr-0.2 at % Nd-0.1 at % Ni-0.5 at % Ge | excellent | excellent | excellent | excellent | excellent |
| 79 | Ti—N | Al-0.1 at % Ta-0.35 at % Zr-0.2 at % Nd-0.1 at % Ni-0.5 at % Ge | excellent | excellent | excellent | excellent | excellent |
| 80 | Ti—N | Al-0.35 at % Ta-0.35 at % Zr-0.2 at % Nd-0.1 at % Ni-0.5 at % Ge | excellent | excellent | excellent | excellent | excellent |
| 81 | Ti—N | Al-0.5 at % Ta-0.35 at % Zr-0.2 at % La-0.1 at % Ni-0.5 at % Ge | excellent | excellent | excellent | excellent | excellent |
| 82 | Ti—N | Al-0.5 at % Ta-0.35 at % Zr-0.2 at % Gd-0.1 at % Ni-0.5 at % Ge | excellent | excellent | excellent | excellent | excellent |
| 83 | Ti—N | Al-0.1 at % Ta-0.3 at % La-0.1 at % Ni | excellent | excellent | excellent | excellent | excellent |
| 84 | Ti—N | Al-0.1 at % Ta-3.0 at % La-0.1 at % Ni | excellent | excellent | excellent | excellent | excellent |
| 85 | Ti—N | Al-0.5 at % Ta-0.3 at % La-0.1 at % Ni | excellent | excellent | excellent | excellent | excellent |
| 86 | Ti—N | Al-0.5 at % Ta-3.0 at % La-0.1 at % Ni | excellent | excellent | excellent | excellent | excellent |
| 87 | Ti—N | Al-0.5 at % Ta-0.3 at % La-0.1 at % Co | excellent | excellent | excellent | excellent | excellent |
| 88 | Ti—N | Al-0.5 at % Ta-3.0 at % La-0.1 at % Co | excellent | excellent | excellent | excellent | excellent |
| 89 | Ti—N | Al-5.0 at % Ta-0.3 at % La-0.1 at % Ni | excellent | excellent | excellent | excellent | excellent |
| 90 | Ti—N | Al-5.0 at % Ta-0.3 at % La-0.1 at % Ni | excellent | excellent | excellent | excellent | excellent |

TABLE 3D-continued

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550° C. | 600° C. | 600° C. | 600° C. |
| 91 | Ti—N | Al-0.1 at % Ta-0.3 at % La-0.2 at % Ge | excellent | excellent | excellent | excellent | excellent |
| 92 | Ti—N | Al-0.1 at % Ta-3.0 at % La-0.2 at % Ge | excellent | excellent | excellent | excellent | excellent |
| 93 | Ti—N | Al-0.5 at % Ta-0.3 at % La-0.2 at % Ge | excellent | excellent | excellent | excellent | excellent |
| 94 | Ti—N | Al-0.5 at % Ta-3.0 at % La-0.2 at % Ge | excellent | excellent | excellent | excellent | excellent |
| 95 | Ti—N | Al-5.0 at % Ta-0.3 at % La-0.2 at % Ge | excellent | excellent | excellent | excellent | excellent |
| 96 | Ti—N | Al-5.0 at % Ta-3.0 at % La-0.2 at % Ge | excellent | excellent | excellent | excellent | excellent |

TABLE 3E

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550° C. | 600° C. | 600° C. | 600° C. |
| 97 | Ti—N | Al-0.1 at % Ta-0.3 at % La-0.5 at % Ge | excellent | excellent | excellent | excellent | excellent |
| 98 | Ti—N | Al-0.1 at % Ta-3.0 at % La-0.5 at % Ge | excellent | excellent | excellent | excellent | excellent |
| 99 | Ti—N | Al-0.25 at % Ta-0.3 at % La-0.5 at % Ge | excellent | excellent | excellent | excellent | excellent |
| 100 | Ti—N | Al-0.25 at % Ta-3.0 at % La-0.5 at % Ge | excellent | excellent | excellent | excellent | excellent |
| 101 | Ti—N | Al-0.5 at % Ta-0.3 at % La-0.5 at % Ge | excellent | excellent | excellent | excellent | excellent |
| 102 | Ti—N | Al-0.5 at % Ta-0.6 at % La-0.5 at % Ge | excellent | excellent | excellent | excellent | excellent |
| 103 | Ti—N | Al-0.5 at % Ta-2.0 at % La-0.5 at % Ge | excellent | excellent | excellent | excellent | excellent |
| 104 | Ti—N | Al-0.5 at % Ta-2.0 at % Nd-0.5 at % Ge | excellent | excellent | excellent | excellent | excellent |
| 105 | Ti—N | Al-0.5 at % Ta-2.0 at % Gd-0.5 at % Ge | excellent | excellent | excellent | excellent | excellent |
| 106 | Ti—N | Al-0.5 at % Ta-2.0 at % Y-0.5 at % Ge | excellent | excellent | excellent | excellent | excellent |
| 107 | Ti—N | Al-0.5 at % Ta-2.0 at % Sc-0.5 at % Ge | excellent | excellent | excellent | excellent | excellent |
| 108 | Ti—N | Al-0.5 at % Ta-2.0 at % Ce-0.5 at % Ge | excellent | excellent | excellent | excellent | excellent |
| 109 | Ti—N | Al-0.5 at % Ta-2.0 at % Dy-0.5 at % Ge | excellent | excellent | excellent | excellent | excellent |
| 110 | Ti—N | Al-0.5 at % Ta-3.0 at % La-0.5 at % Ge | excellent | excellent | excellent | excellent | excellent |
| 111 | Ti—N | Al-1.5 at % Ta-0.3 at % La-0.5 at % Ge | excellent | excellent | excellent | excellent | excellent |
| 112 | Ti—N | Al-1.5 at % Ta-3.0 at % La-0.5 at % Ge | excellent | excellent | excellent | excellent | excellent |
| 113 | Ti—N | Al-5.0 at % Ta-0.3 at % La-0.5 at % Ge | excellent | excellent | excellent | excellent | excellent |
| 114 | Ti—N | Al-5.0 at % Ta-3.0 at % La-0.5 at % Ge | excellent | excellent | excellent | excellent | excellent |
| 115 | Ti—N | Al-0.1 at % Ta-0.3 at % La-0.5 at % Cu | excellent | excellent | excellent | excellent | excellent |
| 116 | Ti—N | Al-0.1 at % Ta-3.0 at % La-0.5 at % Cu | excellent | excellent | excellent | excellent | excellent |
| 117 | Ti—N | Al-0.5 at % Ta-0.3 at % La-0.5 at % Cu | excellent | excellent | excellent | excellent | excellent |
| 118 | Ti—N | Al-0.5 at % Ta-3.0 at % La-0.5 at % Cu | excellent | excellent | excellent | excellent | excellent |
| 119 | Ti—N | Al-5.0 at % Ta-0.3 at % La-0.5 at % Cu | excellent | excellent | excellent | excellent | excellent |
| 120 | Ti—N | Al-5.0 at % Ta-3.0 at % La-0.5 at % Cu | excellent | excellent | excellent | excellent | excellent |
| 121 | Ti—N | Al-0.1 at % Ta-0.3 at % La-2.0 at % Ge | excellent | excellent | excellent | excellent | excellent |
| 122 | Ti—N | Al-0.1 at % Ta-3.0 at % La-2.0 at % Ge | excellent | excellent | excellent | excellent | excellent |
| 123 | Ti—N | Al-0.5 at % Ta-0.3 at % La-2.0 at % Ge | excellent | excellent | excellent | excellent | excellent |
| 124 | Ti—N | Al-0.5 at % Ta-3.0 at % La-2.0 at % Ge | excellent | excellent | excellent | excellent | excellent |

TABLE 3F

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550° C. | 600° C. | 600° C. | 600° C. |
| 125 | Ti—N | Al-0.1 at % Ta-0.2 at % La | excellent | excellent | excellent | excellent | excellent |
| 126 | Ti—N | Al-0.5 at % Ta-0.2 at % La | excellent | excellent | excellent | excellent | excellent |
| 127 | Ti—N | Al-5.0 at % Ta-0.2 at % La | excellent | excellent | excellent | excellent | excellent |
| 128 | Ti—N | Al-0.1 at % Ta-0.2 at % Nd | excellent | excellent | excellent | excellent | excellent |
| 129 | Ti—N | Al-0.5 at % Ta-0.2 at % Nd | excellent | excellent | excellent | excellent | excellent |
| 130 | Ti—N | Al-5.0 at % Ta-0.2 at % Nd | excellent | excellent | excellent | excellent | excellent |
| 131 | Ti—N | Al-0.5 at % Ta-2.0 at % La | excellent | excellent | excellent | excellent | excellent |
| 132 | Ti—N | Al-5.0 at % Ta-2.0 at % La | excellent | excellent | excellent | excellent | excellent |
| 133 | Ti—N | Al-0.1 at % Ta-2.0 at % Nd | excellent | excellent | excellent | excellent | excellent |
| 134 | Ti—N | Al-0.5 at % Ta-2.0 at % Nd | excellent | excellent | excellent | excellent | excellent |
| 135 | Ti—N | Al-5.0 at % Ta-2.0 at % Nd | excellent | excellent | excellent | excellent | excellent |
| 136 | Ti—N | Al-0.5 at % Ta-3.0 at % La | excellent | excellent | excellent | excellent | excellent |

TABLE 3F-continued

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550° C. | 600° C. | 600° C. | 600° C. |
| 137 | Ti—N | Al-5.0 at % Ta-3.0 at % La | excellent | excellent | excellent | excellent | excellent |
| 138 | Ti—N | Al-0.5 at % Ta-3.0 at % Nd | excellent | excellent | excellent | excellent | excellent |
| 139 | Ti—N | Al-5.0 at % Ta-3.0 at % Nd | excellent | excellent | excellent | excellent | excellent |

TABLE 4A

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550° C. | 600° C. | 600° C. | 600° C. |
| 1 | Mo—N | Al-0.1 at % Ta-0.3 at % Nd-0.1 at % Ni-0.5 at % Ge | excellent | excellent | excellent | excellent | excellent |
| 2 | Mo—N | Al-0.1 at % Ta-0.3 at % La-0.1 at % Ni-0.5 at % Ge | excellent | excellent | excellent | excellent | excellent |
| 3 | Mo—N | Al-0.1 at % Ta-0.6 at % Nd-0.1 at % Ni-0.5 at % Ge | excellent | excellent | excellent | excellent | excellent |
| 4 | Mo—N | Al-0.1 at % Ta-0.6 at % La-0.1 at % Ni-0.5 at % Ge | excellent | excellent | excellent | excellent | excellent |
| 5 | Mo—N | Al-0.1 at % Ta-2.0 at % Nd-0.1 at % Ni-0.5 at % Ge | excellent | excellent | excellent | excellent | excellent |
| 6 | Mo—N | Al-0.1 at % Ta-2.0 at % La-0.1 at % Ni-0.5 at % Ge | excellent | excellent | excellent | excellent | excellent |
| 7 | Mo—N | Al-0.1 at % Ta-3.0 at % Nd-0.1 at % Ni-0.5 at % Ge | excellent | excellent | excellent | excellent | excellent |
| 8 | Mo—N | Al-0.1 at % Ta-3.0 at % La-0.1 at % Ni-0.5 at % Ge | excellent | excellent | excellent | excellent | excellent |
| 9 | Mo—N | Al-0.1 at % Ta-0.3 at % Nd-0.1 at % Ni-0.5 at % Cu | excellent | excellent | excellent | excellent | excellent |
| 10 | Mo—N | Al-0.1 at % Ta-0.3 at % La-0.1 at % Ni-0.5 at % Cu | excellent | excellent | excellent | excellent | excellent |
| 11 | Mo—N | Al-0.1 at % Ta-0.6 at % Nd-0.1 at % Ni-0.5 at % Cu | excellent | excellent | excellent | excellent | excellent |
| 12 | Mo—N | Al-0.1 at % Ta-0.6 at % La-0.1 at % Ni-0.5 at % Cu | excellent | excellent | excellent | excellent | excellent |
| 13 | Mo—N | Al-0.1 at % Ta-2.0 at % Nd-0.1 at % Ni-0.5 at % Cu | excellent | excellent | excellent | excellent | excellent |
| 14 | Mo—N | Al-0.1 at % Ta-2.0 at % La-0.1 at % Ni-0.5 at % Cu | excellent | excellent | excellent | excellent | excellent |
| 15 | Mo—N | Al-0.1 at % Ta-3.0 at % Nd-0.1 at % Ni-0.5 at % Cu | excellent | excellent | excellent | excellent | excellent |
| 16 | Mo—N | Al-0.1 at % Ta-3.0 at % La-0.1 at % Ni-0.5 at % Cu | excellent | excellent | excellent | excellent | excellent |
| 17 | Mo—N | Al-0.1 at % Ta-0.3 at % Nd-0.1 at % Co-0.5 at % Ge | excellent | excellent | excellent | excellent | excellent |
| 18 | Mo—N | Al-0.1 at % Ta-0.3 at % La-0.1 at % Co-0.5 at % Ge | excellent | excellent | excellent | excellent | excellent |
| 19 | Mo—N | Al-0.1 at % Ta-0.6 at % Nd-0.1 at % Co-0.5 at % Ge | excellent | excellent | excellent | excellent | excellent |
| 20 | Mo—N | Al-0.1 at % Ta-0.6 at % La-0.1 at % Co-0.5 at % Ge | excellent | excellent | excellent | excellent | excellent |
| 21 | Mo—N | Al-0.1 at % Ta-2.0 at % Nd-0.1 at % Co-0.5 at % Ge | excellent | excellent | excellent | excellent | excellent |
| 22 | Mo—N | Al-0.1 at % Ta-2.0 at % La-0.1 at % Co-0.5 at % Ge | excellent | excellent | excellent | excellent | excellent |
| 23 | Mo—N | Al-0.1 at % Ta-3.0 at % Nd-0.1 at % Co-0.5 at % Ge | excellent | excellent | excellent | excellent | excellent |
| 24 | Mo—N | Al-0.1 at % Ta-3.0 at % La-0.1 at % Co-0.5 at % Ge | excellent | excellent | excellent | excellent | excellent |

TABLE 4B

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550° C. | 600° C. | 600° C. | 600° C. |
| 25 | Mo—N | Al-0.25 at % Ta-0.3 at % Nd-0.1 at % Ni-0.5 at % Ge | excellent | excellent | excellent | excellent | excellent |
| 26 | Mo—N | Al-0.25 at % Ta-0.3 at % La-0.1 at % Ni-0.5 at % Ge | excellent | excellent | excellent | excellent | excellent |
| 27 | Mo—N | Al-0.25 at % Ta-0.6 at % Nd-0.1 at % Ni-0.5 at % Ge | excellent | excellent | excellent | excellent | excellent |
| 28 | Mo—N | Al-0.25 at % Ta-0.6 at % La-0.1 at % Ni-0.5 at % Ge | excellent | excellent | excellent | excellent | excellent |
| 29 | Mo—N | Al-0.25 at % Ta-2.0 at % Nd-0.1 at % Ni-0.5 at % Ge | excellent | excellent | excellent | excellent | excellent |
| 30 | Mo—N | Al-0.25 at % Ta-2.0 at % La-0.1 at % Ni-0.5 at % Ge | excellent | excellent | excellent | excellent | excellent |
| 31 | Mo—N | Al-0.25 at % Ta-2.0 at % Gd-0.1 at % Ni-0.5 at % Ge | excellent | excellent | excellent | excellent | excellent |
| 32 | Mo—N | Al-0.25 at % Ta-2.0 at % Y-0.1 at % Ni-0.5 at % Ge | excellent | excellent | excellent | excellent | excellent |
| 33 | Mo—N | Al-0.25 at % Ta-2.0 at % Ce-0.1 at % Ni-0.5 at % Ge | excellent | excellent | excellent | excellent | excellent |
| 34 | Mo—N | Al-0.25 at % Ta-2.0 at % Sc-0.1 at % Ni-0.5 at % Ge | excellent | excellent | excellent | excellent | excellent |
| 35 | Mo—N | Al-0.25 at % Ta-2.0 at % Dy-0.1 at % Ni-0.5 at % Ge | excellent | excellent | excellent | excellent | excellent |
| 36 | Mo—N | Al-0.25 at % Ta-3.0 at % Nd-0.1 at % Ni-0.5 at % Ge | excellent | excellent | excellent | excellent | excellent |
| 37 | Mo—N | Al-0.25 at % Ta-3.0 at % La-0.1 at % Ni-0.5 at % Ge | excellent | excellent | excellent | excellent | excellent |
| 38 | Mo—N | Al-0.5 at % Ta-0.3 at % Nd-0.1 at % Ni-0.5 at % Ge | excellent | excellent | excellent | excellent | excellent |
| 39 | Mo—N | Al-0.5 at % Ta-0.3 at % La-0.1 at % Ni-0.5 at % Ge | excellent | excellent | excellent | excellent | excellent |
| 40 | Mo—N | Al-0.5 at % Ta-0.6 at % Nd-0.1 at % Ni-0.5 at % Ge | excellent | excellent | excellent | excellent | excellent |
| 41 | Mo—N | Al-0.5 at % Ta-0.6 at % La-0.1 at % Ni-0.5 at % Ge | excellent | excellent | excellent | excellent | excellent |
| 42 | Mo—N | Al-0.5 at % Ta-2.0 at % Nd-0.1 at % Ni-0.5 at % Ge | excellent | excellent | excellent | excellent | excellent |
| 43 | Mo—N | Al-0.5 at % Ta-2.0 at % La-0.1 at % Ni-0.5 at % Ge | excellent | excellent | excellent | excellent | excellent |
| 44 | Mo—N | Al-0.5 at % Ta-2.0 at % Gd-0.1 at % Ni-0.5 at % Ge | excellent | excellent | excellent | excellent | excellent |
| 45 | Mo—N | Al-0.5 at % Ta-2.0 at % Y-0.1 at % Ni-0.5 at % Ge | excellent | excellent | excellent | excellent | excellent |
| 46 | Mo—N | Al-0.5 at % Ta-2.0 at % Ce-0.1 at % Ni-0.5 at % Ge | excellent | excellent | excellent | excellent | excellent |
| 47 | Mo—N | Al-0.5 at % Ta-2.0 at % Sc-0.1 at % Ni-0.5 at % Ge | excellent | excellent | excellent | excellent | excellent |

TABLE 4B-continued

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 48 | Mo—N | Al-0.5 at % Ta-2.0 at % Dy-0.1 at % Ni-0.5 at % Ge | excellent | excellent | excellent | excellent | excellent |
| 49 | Mo—N | Al-0.5 at % Ta-3.0 at % Nd-0.1 at % Ni-0.5 at % Ge | excellent | excellent | excellent | excellent | excellent |
| 50 | Mo—N | Al-0.5 at % Ta-3.0 at % La-0.1 at % Ni-0.5 at % Ge | excellent | excellent | excellent | excellent | excellent |

TABLE 4C

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 51 | Mo—N | Al-0.5 at % Ta-0.3 at % Nd-0.1 at % Co-0.5 at % Ge | excellent | excellent | excellent | excellent | excellent |
| 52 | Mo—N | Al-0.5 at % Ta-0.3 at % La-0.1 at % Co-0.5 at % Ge | excellent | excellent | excellent | excellent | excellent |
| 53 | Mo—N | Al-0.5 at % Ta-0.6 at % La-0.1 at % Co-0.5 at % Ge | excellent | excellent | excellent | excellent | excellent |
| 54 | Mo—N | Al-0.5 at % Ta-2.0 at % Nd-0.1 at % Co-0.5 at % Ge | excellent | excellent | excellent | excellent | excellent |
| 55 | Mo—N | Al-0.5 at % Ta-2.0 at % La-0.1 at % Co-0.5 at % Ge | excellent | excellent | excellent | excellent | excellent |
| 56 | Mo—N | Al-0.5 at % Ta-3.0 at % Nd-0.1 at % Co-0.5 at % Ge | excellent | excellent | excellent | excellent | excellent |
| 57 | Mo—N | Al-0.5 at % Ta-3.0 at % La-0.1 at % Co-0.5 at % Ge | excellent | excellent | excellent | excellent | excellent |
| 58 | Mo—N | Al-0.5 at % Ta-0.3 at % Nd-0.1 at % Ni-0.3 at % Ge | excellent | excellent | excellent | excellent | excellent |
| 59 | Mo—N | Al-0.5 at % Ta-0.3 at % La-0.1 at % Ni-0.3 at % Ge | excellent | excellent | excellent | excellent | excellent |
| 60 | Mo—N | Al-0.5 at % Ta-3.0 at % Nd-0.1 at % Ni-0.3 at % Ge | excellent | excellent | excellent | excellent | excellent |
| 61 | Mo—N | Al-0.5 at % Ta-3.0 at % La-0.1 at % Nli-0.3 at % Ge | excellent | excellent | excellent | excellent | excellent |
| 62 | Mo—N | Al-0.5 at % Ta-0.3 at % Nd-0.1 at % Ni-1.0 at % Ge | excellent | excellent | excellent | excellent | excellent |
| 63 | Mo—N | Al-0.5 at % Ta-0.3 at % La-0.1 at % Ni-1.0 at % Ge | excellent | excellent | excellent | excellent | excellent |
| 64 | Mo—N | Al-0.5 at % Ta-3.0 at % Nd-0.1 at % Ni-1.0 at % Ge | excellent | excellent | excellent | excellent | excellent |
| 65 | Mo—N | Al-0.5 at % Ta-3.0 at % La-0.1 at % Ni-1.0 at % Ge | excellent | excellent | excellent | excellent | excellent |
| 66 | Mo—N | Al-0.5 at % Ta-0.3 at % Nd-0.1 at % Ni-2.0 at % Ge | excellent | excellent | excellent | excellent | excellent |
| 67 | Mo—N | Al-0.5 at % Ta-0.3 at % La-0.1 at % Ni-2.0 at % Ge | excellent | excellent | excellent | excellent | excellent |
| 68 | Mo—N | Al-0.5 at % Ta-3.0 at % Nd-0.1 at % Ni-2.0 at % Ge | excellent | excellent | excellent | excellent | excellent |
| 69 | Mo—N | Al-0.5 at % Ta-3.0 at % La-0.1 at % Ni-2.0 at % Ge | excellent | excellent | excellent | excellent | excellent |
| 70 | Mo—N | Al-0.5 at % Ta-0.3 at % Nd-0.1 at % Ni-0.5 at % Cu | excellent | excellent | excellent | excellent | excellent |
| 71 | Mo—N | Al-0.5 at % Ta-0.3 at % La-0.1 at % Ni-0.5 at % Cu | excellent | excellent | excellent | excellent | excellent |
| 72 | Mo—N | Al-0.5 at % Ta-3.0 at % Nd-0.1 at % Ni-0.5 at % Cu | excellent | excellent | excellent | excellent | excellent |
| 73 | Mo—N | Al-0.5 at % Ta-3.0 at % La-0.1 at % Ni-0.5 at % Cu | excellent | excellent | excellent | excellent | excellent |
| 74 | Mo—N | Al-0.5 at % Ta-3.0 at % Nd-2.0 at % Ni-0.5 at % Ge | excellent | excellent | excellent | excellent | excellent |
| 75 | Mo—N | Al-0.5 at % Ta-3.0 at % La-2.0 at % Ni-0.5 at % Ge | excellent | excellent | excellent | excellent | excellent |

TABLE 4D

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 76 | Mo—N | Al-0.5 at % Ta-0.1 at % Zr-0.2 at % Nd-0.1 at % Ni-0.5 at % Ge | excellent | excellent | excellent | excellent | excellent |
| 77 | Mo—N | Al-0.5 at % Ta-0.35 at % Zr-0.2 at % Nd-0.1 at % Ni-0.5 at % Ge | excellent | excellent | excellent | excellent | excellent |
| 78 | Mo—N | Al-0.5 at % Ta-0.5 at % Zr-0.2 at % Nd-0.1 at % Ni-0.5 at % Ge | excellent | excellent | excellent | excellent | excellent |
| 79 | Mo—N | Al-0.1 at % Ta-0.35 at % Zr-0.2 at % Nd-0.1 at % Ni-0.5 at % Ge | excellent | excellent | excellent | excellent | excellent |
| 80 | Mo—N | Al-0.35 at % Ta-0.35 at % Zr-0.2 at % Nd-0.1 at % Ni-0.5 at % Ge | excellent | excellent | excellent | excellent | excellent |
| 81 | Mo—N | Al-0.5 at % Ta-0.35 at % Zr-0.2 at % La-0.1 at % Ni-0.5 at % Ge | excellent | excellent | excellent | excellent | excellent |
| 82 | Mo—N | Al-0.5 at % Ta-0.35 at % Zr-0.2 at % Gd-0.1 at % Ni-0.5 at % Ge | excellent | excellent | excellent | excellent | excellent |
| 83 | Mo—N | Al-0.1 at % Ta-0.3 at % La-0.1 at % Ni | excellent | excellent | excellent | excellent | excellent |
| 84 | Mo—N | Al-0.1 at % Ta-3.0 at % La-0.1 at % Ni | excellent | excellent | excellent | excellent | excellent |
| 85 | Mo—N | Al-0.5 at % Ta-0.3 at % La-0.1 at % Ni | excellent | excellent | excellent | excellent | excellent |
| 86 | Mo—N | Al-0.5 at % Ta-3.0 at % La-0.1 at % Ni | excellent | excellent | excellent | excellent | excellent |
| 87 | Mo—N | Al-0.5 at % Ta-0.3 at % La-0.1 at % Co | excellent | excellent | excellent | excellent | excellent |
| 88 | Mo—N | Al-0.5 at % Ta-3.0 at % La-0.1 at % Co | excellent | excellent | excellent | excellent | excellent |
| 89 | Mo—N | Al-5.0 at % Ta-0.3 at % La-0.1 at % Ni | excellent | excellent | excellent | excellent | excellent |
| 90 | Mo—N | Al-5.0 at % Ta-0.3 at % La-0.1 at % Ni | excellent | excellent | excellent | excellent | excellent |

TABLE 4D-continued

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550° C. | 600° C. | 600° C. | 600° C. |
| 91 | Mo—N | Al-0.1 at % Ta-0.3 at % La-0.2 at % Ge | excellent | excellent | excellent | excellent | excellent |
| 92 | Mo—N | Al-0.1 at % Ta-3.0 at % La-0.2 at % Ge | excellent | excellent | excellent | excellent | excellent |
| 93 | Mo—N | Al-0.5 at % Ta-0.3 at % La-0.2 at % Ge | excellent | excellent | excellent | excellent | excellent |
| 94 | Mo—N | Al-0.5 at % Ta-3.0 at % La-0.2 at % Ge | excellent | excellent | excellent | excellent | excellent |
| 95 | Mo—N | Al-5.0 at % Ta-0.3 at % La-0.2 at % Ge | excellent | excellent | excellent | excellent | excellent |
| 96 | Mo—N | Al-5.0 at % Ta-3.0 at % La-0.2 at % Ge | excellent | excellent | excellent | excellent | excellent |

TABLE 4E

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550° C. | 600° C. | 600° C. | 600° C. |
| 97 | Mo—N | Al-0.1 at % Ta-0.3 at % La-0.5 at % Ge | excellent | excellent | excellent | excellent | excellent |
| 98 | Mo—N | Al-0.1 at % Ta-3.0 at % La-0.5 at % Ge | excellent | excellent | excellent | excellent | excellent |
| 99 | Mo—N | Al-0.25 at % Ta-0.3 at % La-0.5 at % Ge | excellent | excellent | excellent | excellent | excellent |
| 100 | Mo—N | Al-0.25 at % Ta-3.0 at % La-0.5 at % Ge | excellent | excellent | excellent | excellent | excellent |
| 101 | Mo—N | Al-0.5 at % Ta-0.3 at % La-0.5 at % Ge | excellent | excellent | excellent | excellent | excellent |
| 102 | Mo—N | Al-0.5 at % Ta-0.6 at % La-0.5 at % Ge | excellent | excellent | excellent | excellent | excellent |
| 103 | Mo—N | Al-0.5 at % Ta-2.0 at % La-0.5 at % Ge | excellent | excellent | excellent | excellent | excellent |
| 104 | Mo—N | Al-0.5 at % Ta-2.0 at % Nd-0.5 at % Ge | excellent | excellent | excellent | excellent | excellent |
| 105 | Mo—N | Al-0.5 at % Ta-2.0 at % Gd-0.5 at % Ge | excellent | excellent | excellent | excellent | excellent |
| 106 | Mo—N | Al-0.5 at % Ta-2.0 at % Y-0.5 at % Ge | excellent | excellent | excellent | excellent | excellent |
| 107 | Mo—N | Al-0.5 at % Ta-2.0 at % Sc-0.5 at % Ge | excellent | excellent | excellent | excellent | excellent |
| 108 | Mo—N | Al-0.5 at % Ta-2.0 at % Ce-0.5 at % Ge | excellent | excellent | excellent | excellent | excellent |
| 109 | Mo—N | Al-0.5 at % Ta-2.0 at % Dy-0.5 at % Ge | excellent | excellent | excellent | excellent | excellent |
| 110 | Mo—N | Al-0.5 at % Ta-3.0 at % La-0.5 at % Ge | excellent | excellent | excellent | excellent | excellent |
| 111 | Mo—N | Al-1.5 at % Ta-0.3 at % La-0.5 at % Ge | excellent | excellent | excellent | excellent | excellent |
| 112 | Mo—N | Al-1.5 at % Ta-3.0 at % La-0.5 at % Ge | excellent | excellent | excellent | excellent | excellent |
| 113 | Mo—N | Al-5.0 at % Ta-0.3 at % La-0.5 at % Ge | excellent | excellent | excellent | excellent | excellent |
| 114 | Mo—N | Al-5.0 at % Ta-3.0 at % La-0.5 at % Ge | excellent | excellent | excellent | excellent | excellent |
| 115 | Mo—N | Al-0.1 at % Ta-0.3 at % La-0.5 at % Cu | excellent | excellent | excellent | excellent | excellent |
| 116 | Mo—N | Al-0.1 at % Ta-3.0 at % La-0.5 at % Cu | excellent | excellent | excellent | excellent | excellent |
| 117 | Mo—N | Al-0.5 at % Ta-0.3 at % La-0.5 at % Cu | excellent | excellent | excellent | excellent | excellent |
| 118 | Mo—N | Al-0.5 at % Ta-3.0 at % La-0.5 at % Cu | excellent | excellent | excellent | excellent | excellent |
| 119 | Mo—N | Al-5.0 at % Ta-0.3 at % La-0.5 at % Cu | excellent | excellent | excellent | excellent | excellent |
| 120 | Mo—N | Al-5.0 at % Ta-3.0 at % La-0.5 at % Cu | excellent | excellent | excellent | excellent | excellent |
| 121 | Mo—N | Al-0.1 at % Ta-0.3 at % La-2.0 at % Ge | excellent | excellent | excellent | excellent | excellent |
| 122 | Mo—N | Al-0.1 at % Ta-3.0 at % La-2.0 at % Ge | excellent | excellent | excellent | excellent | excellent |
| 123 | Mo—N | Al-0.5 at % Ta-0.3 at % La-2.0 at % Ge | excellent | excellent | excellent | excellent | excellent |
| 124 | Mo—N | Al-0.5 at % Ta-3.0 at % La-2.0 at % Ge | excellent | excellent | excellent | excellent | excellent |

TABLE 4F

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550° C. | 600° C. | 600° C. | 600° C. |
| 125 | Mo—N | Al-0.1 at % Ta-0.2 at % La | excellent | excellent | excellent | excellent | excellent |
| 126 | Mo—N | Al-0.5 at % Ta-0.2 at % La | excellent | excellent | excellent | excellent | excellent |
| 127 | Mo—N | Al-5.0 at % Ta-0.2 at % La | excellent | excellent | excellent | excellent | excellent |
| 128 | Mo—N | Al-0.1 at % Ta-0.2 at % Nd | excellent | excellent | excellent | excellent | excellent |
| 129 | Mo—N | Al-0.5 at % Ta-0.2 at % Nd | excellent | excellent | excellent | excellent | excellent |
| 130 | Mo—N | Al-5.0 at % Ta-0.2 at % Nd | excellent | excellent | excellent | excellent | excellent |
| 131 | Mo—N | Al-0.5 at % Ta-2.0 at % La | excellent | excellent | excellent | excellent | excellent |
| 132 | Mo—N | Al-5.0 at % Ta-2.0 at % La | excellent | excellent | excellent | excellent | excellent |
| 133 | Mo—N | Al-0.1 at % Ta-2.0 at % Nd | excellent | excellent | excellent | excellent | excellent |
| 134 | Mo—N | Al-0.5 at % Ta-2.0 at % Nd | excellent | excellent | excellent | excellent | excellent |
| 135 | Mo—N | Al-5.0 at % Ta-2.0 at % Nd | excellent | excellent | excellent | excellent | excellent |

TABLE 4F-continued

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550° C. | 600° C. | 600° C. | 600° C. |
| 136 | Mo—N | Al-0.5 at % Ta-3.0 at % La | excellent | excellent | excellent | excellent | excellent |
| 137 | Mo—N | Al-5.0 at % Ta-3.0 at % La | excellent | excellent | excellent | excellent | excellent |
| 138 | Mo—N | Al-0.5 at % Ta-3.0 at % Nd | excellent | excellent | excellent | excellent | excellent |
| 139 | Mo—N | Al-5.0 at % Ta-3.0 at % Nd | excellent | excellent | excellent | excellent | excellent |

TABLE 5A

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550° C. | 600° C. | 600° C. | 600° C. |
| 1 | Al—N | Al-0.1 at % Ta-0.3 at % Nd-0.1 at % Ni-0.5 at % Ge | excellent | excellent | excellent | excellent | excellent |
| 2 | Al—N | Al-0.1 at % Ta-0.3 at % La-0.1 at % Ni-0.5 at % Ge | excellent | excellent | excellent | excellent | excellent |
| 3 | Al—N | Al-0.1 at % Ta-0.6 at % Nd-0.1 at % Ni-0.5 at % Ge | excellent | excellent | excellent | excellent | excellent |
| 4 | Al—N | Al-0.1 at % Ta-0.6 at % La-0.1 at % Ni-0.5 at % Ge | excellent | excellent | excellent | excellent | excellent |
| 5 | Al—N | Al-0.1 at % Ta-2.0 at % Nd-0.1 at % Ni-0.5 at % Ge | excellent | excellent | excellent | excellent | excellent |
| 6 | Al—N | Al-0.1 at % Ta-2.0 at % La-0.1 at % Ni-0.5 at % Ge | excellent | excellent | excellent | excellent | excellent |
| 7 | Al—N | Al-0.1 at % Ta-3.0 at % Nd-0.1 at % Ni-0.5 at % Ge | excellent | excellent | excellent | excellent | excellent |
| 8 | Al—N | Al-0.1 at % Ta-3.0 at % La-0.1 at % Ni-0.5 at % Ge | excellent | excellent | excellent | excellent | excellent |
| 9 | Al—N | Al-0.1 at % Ta-0.3 at % Nd-0.1 at % Ni-0.5 at % Cu | excellent | excellent | excellent | excellent | excellent |
| 10 | Al—N | Al-0.1 at % Ta-0.3 at % La-0.1 at % Ni-0.5 at % Cu | excellent | excellent | excellent | excellent | excellent |
| 11 | Al—N | Al-0.1 at % Ta-0.6 at % Nd-0.1 at % Ni-0.5 at % Cu | excellent | excellent | excellent | excellent | excellent |
| 12 | Al—N | Al-0.1 at % Ta-0.6 at % La-0.1 at % Ni-0.5 at % Cu | excellent | excellent | excellent | excellent | excellent |
| 13 | Al—N | Al-0.1 at % Ta-2.0 at % Nd-0.1 at % Ni-0.5 at % Cu | excellent | excellent | excellent | excellent | excellent |
| 14 | Al—N | Al-0.1 at % Ta-2.0 at % La-0.1 at % Ni-0.5 at % Cu | excellent | excellent | excellent | excellent | excellent |
| 15 | Al—N | Al-0.1 at % Ta-3.0 at % Nd-0.1 at % Ni-0.5 at % Cu | excellent | excellent | excellent | excellent | excellent |
| 16 | Al—N | Al-0.1 at % Ta-3.0 at % La-0.1 at % Ni-0.5 at % Cu | excellent | excellent | excellent | excellent | excellent |
| 17 | Al—N | Al-0.1 at % Ta-0.3 at % Nd-0.1 at % Co-0.5 at % Ge | excellent | excellent | excellent | excellent | excellent |
| 18 | Al—N | Al-0.1 at % Ta-0.3 at % La-0.1 at % Co-0.5 at % Ge | excellent | excellent | excellent | excellent | excellent |
| 19 | Al—N | Al-0.1 at % Ta-0.6 at % Nd-0.1 at % Co-0.5 at % Ge | excellent | excellent | excellent | excellent | excellent |
| 20 | Al—N | Al-0.1 at % Ta-0.6 at % La-0.1 at % Co-0.5 at % Ge | excellent | excellent | excellent | excellent | excellent |
| 21 | Al—N | Al-0.1 at % Ta-2.0 at % Nd-0.1 at % Co-0.5 at % Ge | excellent | excellent | excellent | excellent | excellent |
| 22 | Al—N | Al-0.1 at % Ta-2.0 at % La-0.1 at % Co-0.5 at % Ge | excellent | excellent | excellent | excellent | excellent |
| 23 | Al—N | Al-0.1 at % Ta-3.0 at % Nd-0.1 at % Co-0.5 at % Ge | excellent | excellent | excellent | excellent | excellent |
| 24 | Al—N | Al-0.1 at % Ta-3.0 at % La-0.1 at % Co-0.5 at % Ge | excellent | excellent | excellent | excellent | excellent |

TABLE 5B

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550 ° C. | 600 ° C. | 600° C. | 600° C. |
| 25 | Al—N | Al-0.25 at % Ta-0.3 at % Nd-0.1 at % Ni-0.5 at % Ge | excellent | excellent | excellent | excellent | excellent |
| 26 | Al—N | Al-0.25 at % Ta-0.3 at % La-0.1 at % Ni-0.5 at % Ge | excellent | excellent | excellent | excellent | excellent |
| 27 | Al—N | Al-0.25 at % Ta-0.6 at % Nd-0.1 at % Ni-0.5 at % Ge | excellent | excellent | excellent | excellent | excellent |
| 28 | Al—N | Al-0.25 at % Ta-0.6 at % La-0.1 at % Ni-0.5 at % Ge | excellent | excellent | excellent | excellent | excellent |
| 29 | Al—N | Al-0.25 at % Ta-2.0 at % Nd-0.1 at % Ni-0.5 at % Ge | excellent | excellent | excellent | excellent | excellent |
| 30 | Al—N | Al-0.25 at % Ta-2.0 at % La-0.1 at % Ni-0.5 at % Ge | excellent | excellent | excellent | excellent | excellent |
| 31 | Al—N | Al-0.25 at % Ta-2.0 at % Gd-0.1 at % Ni-0.5 at % Ge | excellent | excellent | excellent | excellent | excellent |
| 32 | Al—N | Al-0.25 at % Ta-2.0 at % Y-0.1 at % Ni-0.5 at % Ge | excellent | excellent | excellent | excellent | excellent |
| 33 | Al—N | Al-0.25 at % Ta-2.0 at % Ce-0.1 at % Ni-0.5 at % Ge | excellent | excellent | excellent | excellent | excellent |
| 34 | Al—N | Al-0.25 at % Ta-2.0 at % Sc-0.1 at % Ni-0.5 at % Ge | excellent | excellent | excellent | excellent | excellent |
| 35 | Al—N | Al-0.25 at % Ta-2.0 at% Dy-0.1 at % Ni-0.5 at % Ge | excellent | excellent | excellent | excellent | excellent |
| 36 | Al—N | Al-0.25 at % Ta-3.0 at % Nd-0.1 at% Ni-0.5 at % Ge | excellent | excellent | excellent | excellent | excellent |
| 37 | Al—N | Al-0.25 at % Ta-3.0 at % La-0.1 at % Ni-0.5 at % Ge | excellent | excellent | excellent | excellent | excellent |
| 38 | Al—N | Al-0.5 at % Ta-0.3 at % Nd-0.1 at % Ni-0.5 at % Ge | excellent | excellent | excellent | excellent | excellent |
| 39 | Al—N | Al-0.5 at % Ta-0.3 at % La-0.1 at % Ni-0.5 at % Ge | excellent | excellent | excellent | excellent | excellent |
| 40 | Al—N | Al-0.5 at % Ta-0.6 at % Nd-0.1 at % Ni-0.5 at % Ge | excellent | excellent | excellent | excellent | excellent |
| 41 | Al—N | Al-0.5 at % Ta-0.6 at % La-0.1 at % Ni-0.5 at % Ge | excellent | excellent | excellent | excellent | excellent |
| 42 | Al—N | Al-0.5 at % Ta-2.0 at % Nd-0.1 at % Ni-0.5 at % Ge | excellent | excellent | excellent | excellent | excellent |
| 43 | Al—N | Al-0.5 at % Ta-2.0 at % La-0.1 at % Ni-0.5 at % Ge | excellent | excellent | excellent | excellent | excellent |
| 44 | Al—N | Al-0.5 at % Ta-2.0 at % Gd-0.1 at % Ni-0.5 at % Ge | excellent | excellent | excellent | excellent | excellent |
| 45 | Al—N | Al-0.5 at % Ta-2.0 at % Y-0.1 at % Ni-0.5 at % Ge | excellent | excellent | excellent | excellent | excellent |
| 46 | Al—N | Al-0.5 at % Ta-2.0 at % Ce-0.1 at % Ni-0.5 at % Ge | excellent | excellent | excellent | excellent | excellent |

TABLE 5B-continued

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 47 | Al—N | Al-0.5 at % Ta-2.0 at % Sc-0.1 at % Ni-0.5 at % Ge | excellent | excellent | excellent | excellent | excellent |
| 48 | Al—N | Al-0.5 at % Ta-2.0 at % Dy-0.1 at % Ni-0.5 at % Ge | excellent | excellent | excellent | excellent | excellent |
| 49 | Al—N | Al-0.5 at % Ta-3.0 at % Nd-0.1 at % Ni-0.5 at % Ge | excellent | excellent | excellent | excellent | excellent |
| 50 | Al—N | Al-0.5 at % Ta-3.0 at % La-0.1 at % Ni-0.5 at % Ge | excellent | excellent | excellent | excellent | excellent |

TABLE 5C

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|
| 51 | Al—N | Al-0.5 at % Ta-0.3 at % Nd-0.1 at % Co-0.5 at % Ge | excellent | excellent | excellent | excellent | excellent |
| 52 | Al—N | Al-0.5 at % Ta-0.3 at % La-0.1 at % Co-0.5 at % Ge | excellent | excellent | excellent | excellent | excellent |
| 53 | Al—N | Al-0.5 at % Ta-0.6 at % La-0.1 at % Co-0.5 at % Ge | excellent | excellent | excellent | excellent | excellent |
| 54 | Al—N | Al-0.5 at % Ta-2.0 at % Nd-0.1 at % Co-0.5 at % Ge | excellent | excellent | excellent | excellent | excellent |
| 55 | Al—N | Al-0.5 at % Ta-2.0 at % La-0.1 at % Co-0.5 at % Ge | excellent | excellent | excellent | excellent | excellent |
| 56 | Al—N | Al-0.5 at % Ta-3.0 at % Nd-0.1 at % Co-0.5 at % Ge | excellent | excellent | excellent | excellent | excellent |
| 57 | Al—N | Al-0.5 at % Ta-3.0 at % La-0.1 at % Co-0.5 at % Ge | excellent | excellent | excellent | excellent | excellent |
| 58 | Al—N | Al-0.5 at % Ta-0.3 at % Nd-0.1 at % Ni-0.3 at % Ge | excellent | excellent | excellent | excellent | excellent |
| 59 | Al—N | Al-0.5 at % Ta-0.3 at % La-0.1 at % Ni-0.3 at % Ge | excellent | excellent | excellent | excellent | excellent |
| 60 | Al—N | Al-0.5 at % Ta-3.0 at % Nd-0.1 at % Ni-0.3 at % Ge | excellent | excellent | excellent | excellent | excellent |
| 61 | Al—N | Al-0.5 at % Ta-3.0 at % La-0.1 at % Ni-0.3 at % Ge | excellent | excellent | excellent | excellent | excellent |
| 62 | Al—N | Al-0.5 at % Ta-0.3 at % Nd-0.1 at % Ni-1.0 at % Ge | excellent | excellent | excellent | excellent | excellent |
| 63 | Al—N | Al-0.5 at % Ta-0.3 at % La-0.1 at % Ni-1.0 at % Ge | excellent | excellent | excellent | excellent | excellent |
| 64 | Al—N | Al-0.5 at % Ta-3.0 at % Nd-0.1 at % Ni-1.0 at % Ge | excellent | excellent | excellent | excellent | excellent |
| 65 | Al—N | Al-0.5 at % Ta-3.0 at % La-0.1 at % Ni-1.0 at % Ge | excellent | excellent | excellent | excellent | excellent |
| 66 | Al—N | Al-0.5 at % Ta-0.3 at % Nd-0.1 at % Ni-2.0 at % Ge | excellent | excellent | excellent | excellent | excellent |
| 67 | Al—N | Al-0.5 at % Ta-0.3 at % La-0.1 at % Ni-2.0 at % Ge | excellent | excellent | excellent | excellent | excellent |
| 68 | Al—N | Al-0.5 at % Ta-3.0 at % Nd-0.1 at % Ni-2.0 at %Ge | excellent | excellent | excellent | excellent | excellent |
| 69 | Al—N | Al-0.5 at % Ta-3.0 at % La-0.1 at % Ni-2.0 at % Ge | excellent | excellent | excellent | excellent | excellent |
| 70 | Al—N | Al-0.5 at % Ta-0.3 at % Nd-0.1 at % Ni-0.5 at % Cu | excellent | excellent | excellent | excellent | excellent |
| 71 | Al—N | Al-0.5 at % Ta-0.3 at % La-0.1 at % Ni-0.5 at % Cu | excellent | excellent | excellent | excellent | excellent |
| 72 | Al—N | Al-0.5 at % Ta-3.0 at % Nd-0.1 at % Ni-0.5 at % Cu | excellent | excellent | excellent | excellent | excellent |
| 73 | Al—N | Al-0.5 at % Ta-3.0 at % La-0.1 at % Ni-0.5 at % Cu | excellent | excellent | excellent | excellent | excellent |
| 74 | Al—N | Al-0.5 at % Ta-3.0 at % Nd-2.0 at % Ni-0.5 at % Ge | excellent | excellent | excellent | excellent | excellent |
| 75 | Al—N | Al-0.5 at % Ta-3.0 at % La-2.0 at % Ni-0.5 at % Ge | excellent | excellent | excellent | excellent | excellent |

TABLE 5D

| No. | The second layer (thickness: 50 nm) Composition | The first layer (thickness: 300 nm) Composition | Wiring resistance 450° C. | 550° C. | 600° C. | Heat resistance (hillock density) 600° C. | Resistance to 0.5%HF 600° C. |
|---|---|---|---|---|---|---|---|
| 76 | Al—N | Al-0.5 at % Ta-0.1 at % Zr-0.2 at % Nd-0.1 at % Ni-0.5 at % Ge | excellent | excellent | excellent | excellent | excellent |
| 77 | Al—N | Al-0.5 at % Ta-0.35 at % Zr-0.2 at % Nd-0.1 at % Ni-0.5 at % Ge | excellent | excellent | excellent | excellent | excellent |
| 78 | Al—N | Al-0.5 at % Ta-0.5 at % Zr-0.2 at % Nd-0.1 at % Ni-0.5 at % Ge | excellent | excellent | excellent | excellent | excellent |
| 79 | Al—N | Al-0.1 at % Ta-0.35 at % Zr-0.2 at % Nd-0.1 at % Ni-0.5 at % Ge | excellent | excellent | excellent | excellent | excellent |
| 80 | Al—N | Al-0.35 at % Ta-0.35 at % Zr-0.2 at % Nd-0.1 at % Ni-0.5 at % Ge | excellent | excellent | excellent | excellent | excellent |
| 81 | Al—N | Al-0.5 at % Ta-0.35 at % Zr-0.2 at % La-0.1 at % Ni-0.5 at % Ge | excellent | excellent | excellent | excellent | excellent |
| 82 | Al—N | Al-0.5 at % Ta-0.35 at % Zr-0.2 at % Gd-0.1 at % Ni-0.5 at % Ge | excellent | excellent | excellent | excellent | excellent |
| 83 | Al—N | Al-0.1 at % Ta-0.3 at % La-0.1 at % Ni | excellent | excellent | excellent | excellent | excellent |
| 84 | Al—N | Al-0.1 at % Ta-3.0 at % La-0.1 at % Ni | excellent | excellent | excellent | excellent | excellent |
| 85 | Al—N | Al-0.5 at % Ta-0.3 at % La-0.1 at % Ni | excellent | excellent | excellent | excellent | excellent |
| 86 | Al—N | Al-0.5 at % Ta-3.0 at % La-0.1 at % Ni | excellent | excellent | excellent | excellent | excellent |
| 87 | Al—N | Al-0.5 at % Ta-0.3 at % La-0.1 at % Co | excellent | excellent | excellent | excellent | excellent |
| 88 | Al—N | Al-0.5 at % Ta-3.0 at % La-0.1 at % Co | excellent | excellent | excellent | excellent | excellent |

TABLE 5D-continued

| | The second layer (thickness: 50 nm) | The first layer (thickness: 300 nm) | Wiring resistance | | | Heat resistance (hillock density) | Resistance to 0.5%HF |
|---|---|---|---|---|---|---|---|
| No. | Composition | Composition | 450° C. | 550° C. | 600° C. | 600° C. | 600° C. |
| 89 | Al—N | Al-5.0 at % Ta-0.3 at % La-0.1 at % Ni | excellent | excellent | excellent | excellent | excellent |
| 90 | Al—N | Al-5.0 at % Ta-0.3 at % La-0.1 at % Ni | excellent | excellent | excellent | excellent | excellent |
| 91 | Al—N | Al-0.1 at % Ta-0.3 at % La-0.2 at % Ge | excellent | excellent | excellent | excellent | excellent |
| 92 | Al—N | Al-0.1 at % Ta-3.0 at % La-0.2 at % Ge | excellent | excellent | excellent | excellent | excellent |
| 93 | Al—N | Al-0.5 at % Ta-0.3 at % La-0.2 at % Ge | excellent | excellent | excellent | excellent | excellent |
| 94 | Al—N | Al-0.5 at % Ta-3.0 at % La-0.2 at % Ge | excellent | excellent | excellent | excellent | excellent |
| 95 | Al—N | Al-5.0 at % Ta-0.3 at % La-0.2 at % Ge | excellent | excellent | excellent | excellent | excellent |
| 96 | Al—N | Al-5.0 at % Ta-3.0 at% La-0.2 at % Ge | excellent | excellent | excellent | excellent | excellent |

15

TABLE 5E

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550° C. | 600° C. | 600° C. | 600° C. |
| 97 | Al—N | Al-0.1 at % Ta-0.3 at % La-0.5 at % Ge | excellent | excellent | excellent | excellent | excellent |
| 98 | Al—N | Al-0.1 at % Ta-3.0 at % La-0.5 at % Ge | excellent | excellent | excellent | excellent | excellent |
| 99 | Al—N | Al-0.25 at % Ta-0.3 at % La-0.5 at % Ge | excellent | excellent | excellent | excellent | excellent |
| 100 | Al—N | Al-0.25 at % Ta-3.0 at % La-0.5 at % Ge | excellent | excellent | excellent | excellent | excellent |
| 101 | Al—N | Al-0.5 at % Ta-0.3 at % La-0.5 at % Ge | excellent | excellent | excellent | excellent | excellent |
| 102 | Al—N | Al-0.5 at % Ta-0.6 at % La-0.5 at % Ge | excellent | excellent | excellent | excellent | excellent |
| 103 | Al—N | Al-0.5 at % Ta-2.0 at % La-0.5 at % Ge | excellent | excellent | excellent | excellent | excellent |
| 104 | Al—N | Al-0.5 at % Ta-2.0 at % Nd-0.5 at % Ge | excellent | excellent | excellent | excellent | excellent |
| 105 | Al—N | Al-0.5 at % Ta-2.0 at % Gd-0.5 at % Ge | excellent | excellent | excellent | excellent | excellent |
| 106 | Al—N | Al-0.5 at % Ta-2.0 at % Y-0.5 at % Ge | excellent | excellent | excellent | excellent | excellent |
| 107 | Al—N | Al-0.5 at % Ta-2.0 at % Sc-0.5 at % Ge | excellent | excellent | excellent | excellent | excellent |
| 108 | Al—N | Al-0.5 at % Ta-2.0 at % Ce-0.5 at % Ge | excellent | excellent | excellent | excellent | excellent |
| 109 | Al—N | Al-0.5 at % Ta-2.0 at % Dy-0.5 at % Ge | excellent | excellent | excellent | excellent | excellent |
| 110 | Al—N | Al-0.5 at % Ta-3.0 at % La-0.5 at % Ge | excellent | excellent | excellent | excellent | excellent |
| 111 | Al—N | Al-1.5 at % Ta-0.3 at % La-0.5 at % Ge | excellent | excellent | excellent | excellent | excellent |
| 112 | Al—N | Al-1.5 at % Ta-3.0 at % La-0.5 at % Ge | excellent | excellent | excellent | excellent | excellent |
| 113 | Al—N | Al-5.0 at % Ta-0.3 at % La-0.5 at % Ge | excellent | excellent | excellent | excellent | excellent |
| 114 | Al—N | Al-5.0 at % Ta-3.0 at % La-0.5 at % Ge | excellent | excellent | excellent | excellent | excellent |
| 115 | Al—N | Al-0.1 at % Ta-0.3 at % La-0.5 at % Cu | excellent | excellent | excellent | excellent | excellent |
| 116 | Al—N | Al-0.1 at % Ta-3.0 at % La-0.5 at % Cu | excellent | excellent | excellent | excellent | excellent |
| 117 | Al—N | Al-0.5 at % Ta-0.3 at % La-0.5 at % Cu | excellent | excellent | excellent | excellent | excellent |
| 118 | Al—N | Al-0.5 at % Ta-3.0 at % La-0.5 at % Cu | excellent | excellent | excellent | excellent | excellent |
| 119 | Al—N | Al-5.0 at % Ta-0.3 at % La-0.5 at % Cu | excellent | excellent | excellent | excellent | excellent |
| 120 | Al—N | Al-5.0 at % Ta-3.0 at % La-0.5 at % Cu | excellent | excellent | excellent | excellent | excellent |
| 121 | Al—N | Al-0.1 at % Ta-0.3 at % La-2.0 at % Ge | excellent | excellent | excellent | excellent | excellent |
| 122 | Al—N | Al-0.1 at % Ta-3.0 at % La-2.0 at % Ge | excellent | excellent | excellent | excellent | excellent |
| 123 | Al—N | Al-0.5 at % Ta-0.3 at % La-2.0 at % Ge | excellent | excellent | excellent | excellent | excellent |
| 124 | Al—N | Al-0.5 at % Ta-3.0 at % La-2.0 at % Ge | excellent | excellent | excellent | excellent | excellent |

TABLE 5F

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550° C. | 600° C. | 600° C. | 600° C. |
| 125 | Al—N | Al-0.1 at % Ta-0.2 at % La | excellent | excellent | excellent | excellent | excellent |
| 126 | Al—N | Al-0.5 at % Ta-0.2 at % La | excellent | excellent | excellent | excellent | excellent |
| 127 | Al—N | Al-5.0 at % Ta-0.2 at % La | excellent | excellent | excellent | excellent | excellent |
| 128 | Al—N | Al-0.1 at % Ta-0.2 at % Nd | excellent | excellent | excellent | excellent | excellent |
| 129 | Al—N | Al-0.5 at % Ta-0.2 at % Nd | excellent | excellent | excellent | excellent | excellent |
| 130 | Al—N | Al-5.0 at % Ta-0.2 at % Nd | excellent | excellent | excellent | excellent | excellent |
| 131 | Al—N | Al-0.5 at % Ta-2.0 at % La | excellent | excellent | excellent | excellent | excellent |
| 132 | Al—N | Al-5.0 at % Ta-2.0 at % La | excellent | excellent | excellent | excellent | excellent |
| 133 | Al—N | Al-0.1 at % Ta-2.0 at % Nd | excellent | excellent | excellent | excellent | excellent |
| 134 | Al—N | Al-0.5 at % Ta-2.0 at % Nd | excellent | excellent | excellent | excellent | excellent |
| 135 | Al—N | Al-5.0 at % Ta-2.0 at % Nd | excellent | excellent | excellent | excellent | excellent |

TABLE 5F-continued

| | The second layer (thickness: 50 nm) | The first layer (thickness: 300 nm) | Wiring resistance | | | Heat resistance (hillock density) | Resistance to 0.5% HF |
|---|---|---|---|---|---|---|---|
| No. | Composition | Composition | 450° C. | 550° C. | 600° C. | 600° C. | 600° C. |
| 136 | Al—N | Al-0.5 at % Ta-3.0 at % La | excellent | excellent | excellent | excellent | excellent |
| 137 | Al—N | Al-5.0 at % Ta-3.0 at % La | excellent | excellent | excellent | excellent | excellent |
| 138 | Al—N | Al-0.5 at % Ta-3.0 at % Nd | excellent | excellent | excellent | excellent | excellent |
| 139 | Al—N | Al-5.0 at % Ta-3.0 at %Nd | excellent | excellent | excellent | excellent | excellent |

In this example, the samples with the first and second layers which satisfy the requirements of the present invention showed every desired property as shown in tables above.

Specifically, the samples in Table 2 are examples including a nitride of an Al alloy as the second layer. The samples in Table 3 are examples including a nitride of group Y element (Ti) according to the present invention as the second layer. The samples in Table 4 are examples including a nitride of group Y element (Mo) according to the present invention as the second layer. The samples in Table 5 are examples including a nitride of group Y element (Al) according to the present invention as the second layer. All the samples, regardless of Al alloy of the first layer, showed low wiring resistance, high heat resistance, and excellent resistance to hydrofluoric acid after being subjected to high temperature heat treatment. For all the samples in Tables 2-5, nitrogen concentration (in atomic percent) in the first layer was suppressed to less than 1 atomic percent (not shown in the Table).

Example 3

In this example, as the second wiring structure, each of the second and third layers of various compositions was deposited in that order on each of the Al alloy (the first layer) shown in Table 6. After the heat treatment at 450° C. to 600° C., electrical resistance, heat resistance (hillock density), and resistance to hydrofluoric acid of the wiring structures were evaluated in the same manner as Example 1. All of the Al alloys of the first layer adopted in this example are Al-group X element-REM alloys which satisfy the requirements of the present invention.

Specifically, each of Al alloy film of Table 6 (the first layer, thickness: 300 nm) was first deposited on a glass substrate in the same manner as described in Example 1.

Next, each of nitride film No. 1-50 of Table 6 (the second layer, thickness: 50 nm) was deposited in the same manner as described in Example 1.

Each of the No. 1-50 metal films (the third layer with a thickness of 20 nm) described in Table 6 were subsequently deposited in vacuo by a DC magnetron sputtering method (atmospheric gas: argon with a flow rate of 30 sccm, pressure: 2 mTorr, and substrate temperature: 25° C. (room temperature)). The second wiring structure consisting of three layers was thus fabricated.

These results are shown in Table 6.

TABLE 6A

| | The second layer (thickness: 50 nm) | The first layer (thickness: 300 nm) | The third layer (thickness: 20 nm) | Wiring resistance | | | Heat resistance (hillock density) | Resistance to 0.5% HF |
|---|---|---|---|---|---|---|---|---|
| No. | Composition | Composition | Composition | 450° C. | 550° C. | 600° C. | 600° C. | 600° C. |
| 1 | Ti—N | Al-0.5 at % | Ti | excellent | excellent | excellent | excellent | excellent |
| 2 | Mo—N | Ta-2.0 at % | Mo | excellent | excellent | excellent | excellent | excellent |
| 3 | Al—N | Nd-0.1 at % | Ti | excellent | excellent | excellent | excellent | excellent |
| 4 | Al-2 at % Nd—N | Ni-0.5 at % Ge | Ti | excellent | excellent | excellent | excellent | excellent |
| 5 | Al-1 at % Ta—N | | Ti | excellent | excellent | excellent | excellent | excellent |
| 6 | Al-1at % Ni-0.5 at % Cu-0.3 at % La—N | | Ti | excellent | excellent | excellent | excellent | excellent - |
| 7 | Al-0.5 at % Ta-2.0 at % Nd-0.1 at % Ni-0.5 at % Ge—N | | Ti | excellent | excellent | excellent | excellent | excellent |
| 8 | Al-0.5 at % Ta-0.2 at % Nd-0.1 at % Ni-0.5 at % Ge-0.35 at % Zr—N | | Ti | excellent | excellent | excellent | excellent | excellent |
| 9 | Al—N | | Mo | excellent | excellent | excellent | excellent | excellent |
| 10 | Al-2 at % Nd—N | | Mo | excellent | excellent | excellent | excellent | excellent |
| 11 | Al-1 at % Ta—N | | Mo | excellent | excellent | excellent | excellent | excellent |
| 12 | Al-1 at % Ni-0.5 at % Cu-0.3 at % La—N | | Mo | excellent | excellent | excellent | excellent | excellent |
| 13 | Al-0.5 at % Ta-2.0 at % Nd-0.1 at % Ni-0.5 at % Ge—N | | Mo | excellent | excellent | excellent | excellent | excellent |
| 14 | Al-0.5 at % Ta-0.2 at % Nd-0.1 at % Ni-0.5 at % Ge-0.35 at % Zr—N | | Mo | excellent | excellent | excellent | excellent | excellent |
| 15 | Ta—N | | Ta | excellent | excellent | excellent | excellent | excellent |
| 16 | Nb—N | | Nb | excellent | excellent | excellent | excellent | excellent |
| 17 | Zr—N | | Zr | excellent | excellent | excellent | excellent | excellent |
| 18 | W—N | | W | excellent | excellent | excellent | excellent | excellent |
| 19 | V—N | | V | excellent | excellent | excellent | excellent | excellent |
| 20 | Hf—N | | Hf | excellent | excellent | excellent | excellent | excellent |

TABLE 6A-continued

| | The second layer (thickness: 50 nm) | The first layer (thickness: 300 nm) | The third layer (thickness: 20 nm) | Wiring resistance | | | Heat resistance (hillock density) | Resistance to 0.5% HF |
|---|---|---|---|---|---|---|---|---|
| No. | Composition | Composition | Composition | 450° C. | 550° C. | 600° C. | 600° C. | 600° C. |
| 21 | Cr—N | | Cr | excellent | excellent | excellent | excellent | excellent |
| 22 | Re—N | | Re | excellent | excellent | excellent | excellent | excellent |
| 23 | Mo—W—N | | Mo—W | excellent | excellent | excellent | excellent | excellent |
| 24 | Mo—Nb—N | | Mo—Nb | excellent | excellent | excellent | excellent | excellent |
| 25 | Mo—Ti—N | | Mo—Ti | excellent | excellent | excellent | excellent | excellent |

TABLE 6B

| | The second layer (thickness: 50 nm) | The first layer (thickness: 300 nm) | The third layer (thickness: 20 nm) | Wiring resistance | | | Heat resistance (hillock density) | Resistance to 0.5% HF |
|---|---|---|---|---|---|---|---|---|
| No. | Composition | Composition | Composition | 450° C. | 550° C. | 600° C. | 600° C. | 600° C. |
| 26 | Ti—N | Al-0.5 at % | Ti | excellent | excellent | excellent | excellent | excellent |
| 27 | Mo—N | Ta-2.0 at % | Mo | excellent | excellent | excellent | excellent | excellent |
| 28 | Al—N | Nd-0.1 at % | Ti | excellent | excellent | excellent | excellent | excellent |
| 29 | Al-2 at % Nd—N | Ni-0.5 at % | Ti | excellent | excellent | excellent | excellent | excellent |
| 30 | Al-1 at % Ta—N | Ge-0.35 at % Zr | Ti | excellent | excellent | excellent | excellent | excellent |
| 31 | Al-1 at % Ni-0.5 at % Cu-0.3 at % La—N | | Ti | excellent | excellent | excellent | excellent | excellent |
| 32 | Al-0.5 at % Ta-2.0 at % Nd-0.1 at % Ni-0.5 at % Ge—N | | Ti | excellent | excellent | excellent | excellent | excellent |
| 33 | Al-0.5 at % Ta-0.2 at % Nd-0.1 at % Ni-0.5 at % Ge-0.35 at % Zr—N | | Ti | excellent | excellent | excellent | excellent | excellent |
| 34 | Al—N | | Mo | excellent | excellent | excellent | excellent | excellent |
| 35 | Al-2 at % Nd—N | | Mo | excellent | excellent | excellent | excellent | excellent |
| 36 | Al-1 at % Ta—N | | Mo | excellent | excellent | excellent | excellent | excellent |
| 37 | Al-1 at % Ni-0.5 at % Cu-0.3 at % La—N | | Mo | excellent | excellent | excellent | excellent | excellent |
| 38 | Al-0.5 at % Ta-2.0 at % Nd-0.1 at % Ni-0.5 at % Ge—N | | Mo | excellent | excellent | excellent | excellent | excellent |
| 39 | Al-0.5 at % Ta-0.2 at % Nd-0.1 at % Ni-0.5 at % Ge-0.35 at %Zr—N | | Mo | excellent | excellent | excellent | excellent | excellent |
| 40 | Ta—N | | Ta | excellent | excellent | excellent | excellent | excellent |
| 41 | Nb—N | | Nb | excellent | excellent | excellent | excellent | excellent |
| 42 | Zr—N | | Zr | excellent | excellent | excellent | excellent | excellent |
| 43 | W—N | | W | excellent | excellent | excellent | excellent | excellent |
| 44 | V—N | | V | excellent | excellent | excellent | excellent | excellent |
| 45 | Hf—N | | Hf | excellent | excellent | excellent | excellent | excellent |
| 46 | Cr—N | | Cr | excellent | excellent | excellent | excellent | excellent |
| 47 | Re—N | | Re | excellent | excellent | excellent | excellent | excellent |
| 48 | Mo—W—N | | Mo—W | excellent | excellent | excellent | excellent | excellent |
| 49 | Mo—Nb—N | | Mo—Nb | excellent | excellent | excellent | excellent | excellent |
| 50 | Mo—Ti—N | | Mo—Ti | excellent | excellent | excellent | excellent | excellent |

As shown in the tables, samples No. 1-50 which showed low wiring resistance and high heat resistance as well as excellent resistance to hydrofluoric acid after being subjected to the high temperature heat treatment. For all the samples in Table 6, nitrogen concentration (in atomic percent) in the first layer was suppressed to less than 1 atomic percent (not shown in the Table).

Example 4

In this example, each of the second layer of various compositions was deposited on each of the Al alloy (the first layer) shown in Table 7. The thickness of the second layers was varied in a range from 10 nm to 50 nm as shown in Table 7. After the heat treatment at 450° C. to 600° C., electrical resistance, heat resistance (hillock density), and resistance to hydrofluoric acid of the wiring structures were evaluated in the same manner as Example 1. All of the Al alloys of the first layer adopted in this example are Al-group X element-REM alloys which satisfy the requirements of the present invention.

The results are also shown in Table 7.

TABLE 7A

| No. | The second layer Composition | Thickness | The first layer (thickness: 300 nm) Composition | Wiring resistance 450° C. | 550° C. | 600° C. | Heat resistance (hillock density) 600° C. | Resistance to 0.5%HF 600° C. |
|---|---|---|---|---|---|---|---|---|
| 1 | Ti—N | 10 nm | Al-0.5 at % | excellent | excellent | excellent | excellent | excellent |
| 2 | Ti—N | 20 nm | Ta-2.0 at % | excellent | excellent | excellent | excellent | excellent |
| 3 | Ti—N | 30 nm | La-0.1 at % | excellent | excellent | excellent | excellent | excellent |
| 4 | Ti—N | 40 nm | Ni-0.5 at % Ge | excellent | excellent | excellent | excellent | excellent |
| 5 | Ti—N | 50 nm | | excellent | excellent | excellent | excellent | excellent |
| 6 | Mo—N | 10 nm | | excellent | excellent | excellent | excellent | excellent |
| 7 | Mo—N | 20 nm | | excellent | excellent | excellent | excellent | excellent |
| 8 | Mo—N | 30 nm | | excellent | excellent | excellent | excellent | excellent |
| 9 | Mo—N | 40 nm | | excellent | excellent | excellent | excellent | excellent |
| 10 | Mo—N | 50 nm | | excellent | excellent | excellent | excellent | excellent |
| 11 | Al-0.5 at % Ta-2.0 at % Nd-0.1 at % Ni-0.5 at % Ge—N | 10 nm | | excellent | excellent | excellent | excellent | excellent |
| 12 | | 20 nm | | excellent | excellent | excellent | excellent | excellent |
| 13 | | 30 nm | | excellent | excellent | excellent | excellent | excellent |
| 14 | | 40 nm | | excellent | excellent | excellent | excellent | excellent |
| 15 | | 50 nm | | excellent | excellent | excellent | excellent | excellent |
| 16 | Al-0.5 at % Ta-0.2 at % Nd-0.1 at % Ni-0.5 at % Ge-0.35 at % Zr—N | 10 nm | | excellent | excellent | excellent | excellent | excellent |
| 17 | | 20 nm | | excellent | excellent | excellent | excellent | excellent |
| 18 | | 30 nm | | excellent | excellent | excellent | excellent | excellent |
| 19 | | 40 nm | | excellent | excellent | excellent | excellent | excellent |
| 20 | | 50 nm | | excellent | excellent | excellent | excellent | excellent |
| 21 | Ta—N | 10 nm | | excellent | excellent | excellent | excellent | excellent |
| 22 | Ta—N | 20 nm | | excellent | excellent | excellent | excellent | excellent |
| 23 | Ta—N | 30 nm | | excellent | excellent | excellent | excellent | excellent |
| 24 | Ta—N | 40 nm | | excellent | excellent | excellent | excellent | excellent |
| 25 | Ta—N | 50 nm | | excellent | excellent | excellent | excellent | excellent |

TABLE 7B

| No | The second layer Composition | Thickness | The first layer (thickness: 300 nm) Composition | Wiring resistance 450° C. | 550° C. | 600° C. | Heat resistance (hillock density) 600° C. | Resistance to 0.5%HF 600° C. |
|---|---|---|---|---|---|---|---|---|
| 26 | Mo—Nb—N | 10 nm | Al-0.5 at % Ta-2.0 at % La-0.1 at % Ni-0.5 at % Ge | excellent | excellent | excellent | excellent | excellent |
| 27 | Mo—Nb—N | 20 nm | | excellent | excellent | excellent | excellent | excellent |
| 28 | Mo—Nb—N | 30 nm | | excellent | excellent | excellent | excellent | excellent |
| 29 | Mo—Nb—N | 40 nm | | excellent | excellent | excellent | excellent | excellent |
| 30 | Mo—Nb—N | 50 nm | | excellent | excellent | excellent | excellent | excellent |
| 31 | Ti—N | 10 nm | Al-0.5 at % Ta-0.2 at % Nd-0.1 at % Ni-0.5 at % Ge-0.35 at % Zr | excellent | excellent | excellent | excellent | excellent |
| 32 | Ti—N | 20 nm | | excellent | excellent | excellent | excellent | excellent |
| 33 | Ti—N | 30 nm | | excellent | excellent | excellent | excellent | excellent |
| 34 | Ti—N | 40 nm | | excellent | excellent | excellent | excellent | excellent |
| 35 | Ti—N | 50 nm | | excellent | excellent | excellent | excellent | excellent |
| 36 | Mo—N | 10 nm | | excellent | excellent | excellent | excellent | excellent |
| 37 | Mo—N | 20 nm | | excellent | excellent | excellent | excellent | excellent |
| 38 | Mo—N | 30 nm | | excellent | excellent | excellent | excellent | excellent |
| 39 | Mo—N | 40 nm | | excellent | excellent | excellent | excellent | excellent |
| 40 | Mo—N | 50 nm | | excellent | excellent | excellent | excellent | excellent |
| 41 | Al-0.5 at % Ta-2.0 at % Nd-0.1 at % Ni-0.5 at % Ge—N | 10 nm | | excellent | excellent | excellent | excellent | excellent |
| 42 | | 20 nm | | excellent | excellent | excellent | excellent | excellent |
| 43 | | 30 nm | | excellent | excellent | excellent | excellent | excellent |
| 44 | | 40 nm | | excellent | excellent | excellent | excellent | excellent |
| 45 | | 50 nm | | excellent | excellent | excellent | excellent | excellent |
| 46 | Al-0.5 at % Ta-0.2 at % Nd-0.1 at % Ni-0.5 at % Ge-0.35 at % Zr—N | 10 nm | | excellent | excellent | excellent | excellent | excellent |
| 47 | | 20 nm | | excellent | excellent | excellent | excellent | excellent |
| 48 | | 30 nm | | excellent | excellent | excellent | excellent | excellent |
| 49 | | 40 nm | | excellent | excellent | excellent | excellent | excellent |
| 50 | | 50 nm | | excellent | excellent | excellent | excellent | excellent |

TABLE 7C

| No. | The second layer Composition | Thickness | The first layer (thickness: 300 nm) Composition | Wiring resistance 450° C. | 550° C. | 600° C. | Heat resistance (hillock density) 600° C. | Resistance to 0.5% HF 600° C. |
|---|---|---|---|---|---|---|---|---|
| 51 | Ta—N | 10 nm | Al-0.5 at % Ta-0.2 | excellent | excellent | excellent | excellent | excellent |
| 52 | Ta—N | 20 nm | at % Nd-0.1 at % | excellent | excellent | excellent | excellent | excellent |
| 53 | Ta—N | 30 nm | Ni-0.5 at % Ge- | excellent | excellent | excellent | excellent | excellent |
| 54 | Ta—N | 40 nm | 0.35 at % Zr | excellent | excellent | excellent | excellent | excellent |
| 55 | Ta—N | 50 nm | | excellent | excellent | excellent | excellent | excellent |
| 56 | Mo—Nb—N | 10 nm | | excellent | excellent | excellent | excellent | excellent |
| 57 | Mo—Nb—N | 20 nm | | excellent | excellent | excellent | excellent | excellent |
| 58 | Mo—Nb—N | 30 nm | | excellent | excellent | excellent | excellent | excellent |
| 59 | Mo—Nb—N | 40 nm | | excellent | excellent | excellent | excellent | excellent |
| 60 | Mo—Nb—N | 50 nm | | excellent | excellent | excellent | excellent | excellent |
| 61 | Ti | 10 nm | Al-0.5 at % Ta-2.0 | excellent | excellent | excellent | excellent | poor |
| 62 | Ti | 50 nm | at % La-0.1 at % | good | poor | poor | excellent | excellent |
| 63 | Mo | 10 nm | Ni-0.5 at % Ge | excellent | excellent | excellent | excellent | poor |
| 64 | Mo | 50 nm | | good | poor | poor | excellent | excellent |
| 65 | Ti | 10 nm | Al-0.5 at % Ta-0.2 | excellent | excellent | excellent | excellent | poor |
| 66 | Ti | 50 nm | at % Nd-0.1 at % | good | poor | poor | excellent | excellent |
| 67 | Mo | 10 nm | Ni-0.5 at % | excellent | excellent | excellent | excellent | poor |
| 68 | Mo | 50 nm | Ge-0.35 at % Zr | good | poor | poor | excellent | excellent |

As shown in Table 7, samples No. 1-60 with the second layer comprising nitrides of group Y element which satisfies the requirements of the present invention maintained the desired properties regardless of the thickness of the second layer ranging from 10 nm to 50 nm. For all the samples in Table 7, nitrogen concentration (in atomic percent) in the first layer was suppressed to less than 1 atomic percent (not shown in the Table).

On the other hand, samples No. 61-68 with the second layer consisting Ti or Mo (see Table 7C) did not show all of the desired properties regardless of the Al alloy of the first layer even if the thickness of the second layer was decreased from 50 nm to 10 nm.

Specifically, for the samples with Ti as the second layer (No. 61, 62, 65, and 66), the thickness was decreased from 50 nm (No. 62 and 66) to 10 nm (No. 61 and 65). As the diffusion of Ti and underlying Al alloy was suppressed, the electrical resistance and heat resistance (the hillock density) after the heat treatment at 450° C. to 600° C. were enhanced to qualify the acceptance criteria. On the other hand, however, the resistance to hydrofluoric acid was significantly deteriorated.

The similar trend was observed for samples with Mo as the second layer instead of Ti. Specifically, as for samples No. 63, 64, 67, and 68 with the Mo second layer, the thickness was decreased from 50 nm (No. 64 and 68) to 10 nm (No. 63 and 67). As the diffusion of Ti and underlying Al alloy was suppressed, the electrical resistance and heat resistance (the hillock density) after the heat treatment at 450° C. to 600° C. were enhanced to qualify the acceptance criteria. On the other hand, however, the resistance to hydrofluoric acid was significantly deteriorated.

From these results, it was confirmed that desired properties could not be obtained if a refractory metal layer is deposited as the second layer regardless of the thickness.

Example 5

In this example, each of the second layer of various compositions was deposited on each of the Al alloy (the first layer) shown in Table 8. For the deposition of the nitride films of the second layers, proportions of nitrogen (flow ration in %) in the mixed gas was varied from 1% to 50% as shown in Table 8. After the heat treatment at 450° C. to 600° C., electrical resistance, heat resistance (hillock density), and resistance to hydrofluoric acid of the wiring structures were evaluated in the same manner as Example 1. All of the Al alloys of the first layer adopted in this example are Al-group X-REM alloys which satisfy the requirements of the present invention.

The results are also shown in Table 8.

TABLE 8A

| No. | The second layer (thickness: 50 nm) Composition | N₂ gas ratio in mixed gas (flow ratio in %) | The first layer (thickness: 300 nm) Composition | Wiring resistance 450° C. | 550° C. | 600° C. | Heat resistance (hillock density) 600° C. | Resistance to 0.5%HF 600° C. |
|---|---|---|---|---|---|---|---|---|
| 1 | Ti—N✗ | 1 | Al-0.5 at % | excellent | excellent | excellent | excellent | poor |
| 2 | Ti—N | 2 | Ta-2.0 at % | excellent | excellent | excellent | excellent | good |
| 3 | Ti—N | 3 | La-0.1 at % | excellent | excellent | excellent | excellent | good |
| 4 | Ti—N | 5 | Ni-0.5 at % Ge | excellent | excellent | excellent | excellent | fair |
| 5 | Ti—N | 10 | | excellent | excellent | excellent | excellent | excellent |
| 6 | Ti—N | 13 | | excellent | excellent | excellent | excellent | excellent |
| 7 | Ti—N | 27 | | excellent | excellent | excellent | excellent | excellent |
| 8 | Ti—N | 50 | | excellent | excellent | excellent | excellent | excellent |
| 9 | Mo—N✗ | 1 | | excellent | excellent | excellent | excellent | poor |
| 10 | Mo—N | 3 | | excellent | excellent | excellent | excellent | good |
| 11 | Mo—N | 5 | | excellent | excellent | excellent | excellent | fair |
| 12 | Mo—N | 10 | | excellent | excellent | excellent | excellent | excellent |
| 13 | Mo—N | 13 | | excellent | excellent | excellent | excellent | excellent |

TABLE 8A-continued

| No. | The second layer (thickness: 50 nm) Composition | N₂ gas ratio in mixed gas (flow ratio in %) | The first layer (thickness: 300 nm) Composition | Wiring resistance 450° C. | 550° C. | 600° C. | Heat resistance (hillock density) 600° C. | Resistance to 0.5%HF 600° C. |
|---|---|---|---|---|---|---|---|---|
| 14 | Mo—N | 27 | | excellent | excellent | excellent | excellent | excellent |
| 15 | Mo—N | 33 | | excellent | excellent | excellent | excellent | excellent |
| 16 | Mo—N | 50 | | excellent | excellent | excellent | excellent | excellent |
| 17 | Al-0.5 at % Ta-2.0 at % Nd-0.1 at % Ni-.5 at % Ge—N※ | 1 | | excellent | excellent | excellent | excellent | poor |
| 18 | Al-0.5 at % Ta-0.2 at % | 3 | | excellent | excellent | excellent | excellent | good |
| 19 | Nd-0.1 at % Ni-0.5 | 5 | | excellent | excellent | excellent | excellent | fair |
| 20 | at % Ge-0.35 at % Zr—N | 10 | | excellent | excellent | excellent | excellent | excellent |
| 21 | | 13 | | excellent | excellent | excellent | excellent | excellent |
| 22 | | 15 | | excellent | excellent | excellent | excellent | excellent |
| 23 | | 17 | | excellent | excellent | excellent | excellent | excellent |
| 24 | Al-0.5 at % Ta-2.0 at % Nd-0.1 at % Ni-0.5 at % Ge—N | 1 | | excellent | excellent | excellent | poor | excellent |
| 25 | Al-0.5 at % Ta-0.2 at % | 3 | | excellent | excellent | excellent | excellent | good |
| 26 | Nd-0.1 at % Ni-0.5 | 5 | | excellent | excellent | excellent | excellent | fair |
| 27 | at % Ge-0.35 at % Zr—N | 10 | | excellent | excellent | excellent | excellent | excellent |
| 28 | | 13 | | excellent | excellent | excellent | excellent | excellent |
| 29 | | 15 | | excellent | excellent | excellent | excellent | excellent |
| 30 | | 17 | | excellent | excellent | excellent | excellent | excellent |

※Samples No. 1, 9, 17, 24 are those for which a nitride sufficient to obtain the desired resistance to the hydrofluoric acid is not formed.

TABLE 8B

| No. | The second layer (thickness: 50 nm) Composition | N₂ gas ratio in mixed gas (flow ratio in %) | The first layer (thickness: 300 nm) Composition | Wiring resistance 450° C. | 550° C. | 600° C. | Heat resistance (hillock density) 600° C. | Resistance to 0.5%HF 600° C. |
|---|---|---|---|---|---|---|---|---|
| 31 | Mo—Nb—N※ | 1 | Al-0.5 at % Ta-2.0 | excellent | excellent | excellent | excellent | poor |
| 32 | Mo—Nb—N | 3 | at % La-0.1 at % | excellent | excellent | excellent | excellent | good |
| 33 | Mo—Nb—N | 5 | Ni-0.5 at % Ge | excellent | excellent | excellent | excellent | fair |
| 34 | Mo—Nb—N | 10 | | excellent | excellent | excellent | excellent | excellent |
| 35 | Mo—Nb—N | 13 | | excellent | excellent | excellent | excellent | excellent |
| 36 | Mo—W—N※ | 1 | | excellent | excellent | excellent | excellent | poor |
| 37 | Mo—W—N | 3 | | excellent | excellent | excellent | excellent | good |
| 38 | Mo—W—N | 5 | | excellent | excellent | excellent | excellent | fair |
| 39 | Mo—W—N | 10 | | excellent | excellent | excellent | excellent | excellent |
| 40 | Mo—W—N | 13 | | excellent | excellent | excellent | excellent | excellent |
| 41 | Ti—N※ | 1 | Al-0.5 at % Ta-0.2 | excellent | excellent | excellent | excellent | poor |
| 42 | Ti—N | 3 | at % Nd-0.1 at % | excellent | excellent | excellent | excellent | good |
| 43 | Ti—N | 5 | Ni-0.5 at % | excellent | excellent | excellent | excellent | fair |
| 44 | Ti—N | 10 | Ge-0.35 at % Zr | excellent | excellent | excellent | excellent | excellent |
| 45 | Ti—N | 13 | | excellent | excellent | excellent | excellent | excellent |
| 46 | Mo—N※ | 1 | | excellent | excellent | excellent | excellent | poor |
| 47 | Mo—N | 3 | | excellent | excellent | excellent | excellent | good |
| 48 | Mo—N | 5 | | excellent | excellent | excellent | excellent | fair |
| 49 | Mo—N | 10 | | excellent | excellent | excellent | excellent | excellent |
| 50 | Mo—N | 13 | | excellent | excellent | excellent | excellent | excellent |

※Samples No. 31, 36, 41, 46 are those for which a nitride sufficient to obtain the desired resistance to the hydrofluoric acid is not formed.

TABLE 8C

| No. | The second layer (thickness: 50 nm) Composition | N₂ gas ratio in mixed gas (flow ratio in %) | The first layer (thickness: 300 nm) Composition | Wiring resistance 450° C. | 550° C. | 600° C. | Heat resistance (hillock density) 600° C. | Resistance to 0.5%HF 600° C. |
|---|---|---|---|---|---|---|---|---|
| 51 | Al-0.5 at % Ta-2.0 at % Nd-0.1 at % Ni-0.5 at % Ge—N. | 1 | Al-0.5 at % Ta-0.2 at % Nd-0.1 at % | excellent | excellent | excellent | excellent | poor |
| 52 | Al-0.5 at % Ta-2.0 at % | 3 | Ni-0.5 at % | excellent | excellent | excellent | excellent | good |
| 53 | Nd-0.1 at % Ni-0.5 | 5 | Ge-0.35 at % Zr | excellent | excellent | excellent | excellent | fair |
| 54 | at % Ge—N | 10 | | excellent | excellent | excellent | excellent | excellent |

TABLE 8C-continued

| | The second layer (thickness: 50 nm) | N₂ gas ratio in mixed gas (flow | The first layer (thickness: 300 nm) | Wiring resistance | | | Heat resistance (hillock density) | Resistance to 0.5%HF |
|---|---|---|---|---|---|---|---|---|
| No. | Composition | ratio in %) | Composition | 450° C. | 550° C. | 600° C. | 600° C. | 600° C. |
| 55 | | 13 | | excellent | excellent | excellent | excellent | excellent |
| 56 | Al-0.5 at % Ta-0.2 at % Nd-0.1 at % Ni-0.5 at % Ge-0.35 at % Zr—N※ | 1 | | excellent | excellent | excellent | excellent | poor |
| 57 | Al-0.5 at % Ta-0.2 at % | 3 | | excellent | excellent | excellent | excellent | good |
| 58 | Nd-0.1 at % Ni-0.5 | 5 | | excellent | excellent | excellent | excellent | fair |
| 59 | at % Ge-0.35 at % Zr—N | 10 | | excellent | excellent | excellent | excellent | excellent |
| 60 | | 13 | | excellent | excellent | excellent | excellent | excellent |
| 61 | Mo—Nb—N※ | 1 | | excellent | excellent | excellent | excellent | poor |
| 62 | Mo—Nb—N | 3 | | excellent | excellent | excellent | excellent | good |
| 63 | Mo—Nb—N | 5 | | excellent | excellent | excellent | excellent | fair |
| 64 | Mo—Nb—N | 10 | | excellent | excellent | excellent | excellent | excellent |
| 65 | Mo—Nb—N | 13 | | excellent | excellent | excellent | excellent | excellent |
| 66 | Mo—W—N※ | 1 | | excellent | excellent | excellent | excellent | poor |
| 67 | Mo—W—N | 3 | | excellent | excellent | excellent | excellent | good |
| 68 | Mo—W—N | 5 | | excellent | excellent | excellent | excellent | fair |
| 69 | Mo—W—N | 10 | | excellent | excellent | excellent | excellent | excellent |
| 70 | Mo—W—N | 13 | | excellent | excellent | excellent | excellent | excellent |

※Samples No. 51, 56, 61, 66 are those for which a nitride sufficient to obtain the desired resistance to the hydrofluoric acid is not formed.

As shown in Table 8, samples No. 2-8, 10-16, 18-23, 25-30, 32-35, 37-40, 42-45, 47-50, 52-55, 57-60, 62-65, 67-70 for which nitrides of group Y elements were deposited as the second layer with the nitrogen gas ratio in the mixed gas satisfying the requirement of the present invention (i.e., nitrogen gas ratio of 2 percent or higher) possessed all of the desired properties. For all the samples in Table 8, nitrogen concentration (in atomic percent) in the first layer was suppressed to less than 1 atomic percent (not shown in the Table).

On the other hand, for samples No. 1, 9, 17, 24 (see Table 8A), 31, 36, 41, 46 (see Table 8B), 51, 56, 61, 66 (see Table 8C), each of the second layer was deposited with nitrogen gas ratio in the mixed gas below the required condition of the present invention. The resistance to hydrofluoric acid was deteriorated since the nitridation was insufficient and nitrides of group Y element to exhibit the desired effect were not formed.

From these results, it was confirmed essential to appropriately control the deposition condition of the nitrides in order to effectively bring the effects out of the nitrides of group Y element or Al alloy which constitute the second layer.

Example 6

Electrical resistivity of the second layer single film regarding samples No. 1 to 30 shown in Table 8A of the Example 5 was measured by four-terminal method in the same experimental condition as for the above-described wiring structure. Results of the measurement are shown in Table 9 below. The resistance to hydrofluoric acid indicated in Table 8A of each sample is also shown in Table 9. "Insulating" in Table 9 indicates that the electrical resistivity of measured sample was 10⁸ Ωcm or more.

The results shown in Table 9 may be explained as follows. Samples No. 2-8 were examples prepared to make the nitride of Ti excellent in terms of resistance to hydrofluoric acid by controlling the proportion of nitrogen being 2 percent or more in the mixed gas. The electrical resistivity of the second layer itself was 90 μΩcm or more.

Further, samples No. 10-16 were examples prepared to make the nitride of Mo excellent in terms of resistance to hydrofluoric acid by controlling the proportion of nitrogen being 3 percent or more in the mixed gas. The electrical resistivity of the second layer itself was 75 μΩcm or more.

Furthermore, samples No. 18-22, 25-29 were examples prepared to make the nitride of Al excellent in terms of resistance to hydrofluoric acid by controlling the proportion of nitrogen being 3 percent or more in the mixed gas. The electrical resistivity of the second layer itself was 27 μΩcm or more.

As shown in samples No. 23 and 30 in Table 9, excessive proportion of nitrogen in the mixed gas to form nitrides of Al alloy for the second layer results in increase of electrical resistivity of the second layer. Such excessive electrical resistivity of the second layer turns the layer itself insulating, and deteriorates fabrication property of the wiring by etching, particularly by wet etching. It is thus preferred to control the nitrogen gas ratio in the mixed gas to 15 percent or less to form a nitride of Al alloy as the second layer.

TABLE 9

| No. | The second layer (thickness: 50 nm) Composition | N₂ gas ratio in mixed gas (flow ratio in %) | Electrical resistivity of the second layer (μΩcm) | The first layer (thickness: 300 nm) Composition | Resistance to 0.5% HF 600° C. |
|---|---|---|---|---|---|
| 1 | Ti—N※ | 1 | 42 | Al—0.5 at % Ta—2.0 at % La—0.1 at % Ni—0.5 at % Ge | poor |
| 2 | Ti—N | 2 | 90 | | good |
| 3 | Ti—N | 3 | 187 | | good |
| 4 | Ti—N | 5 | 539 | | fair |
| 5 | Ti—N | 10 | 912 | | excellent |
| 6 | Ti—N | 13 | 855 | | excellent |
| 7 | Ti—N | 27 | 808 | | excellent |

TABLE 9-continued

| No. | The second layer (thickness: 50 nm) Composition | N₂ gas ratio in mixed gas (flow ratio in %) | Electrical resistivity of the second layer (μΩcm) | The first layer (thickness: 300 nm) Composition | Resistance to 0.5% HF 600° C. |
|---|---|---|---|---|---|
| 8 | Ti—N | 50 | 555 | | excellent |
| 9 | Mo—N※ | 1 | 26 | | poor |
| 10 | Mo—N | 3 | 75 | | good |
| 11 | Mo—N | 5 | 109 | | fair |
| 12 | Mo—N | 10 | 148 | | excellent |
| 13 | Mo—N | 13 | 163 | | excellent |
| 14 | Mo—N | 27 | 198 | | excellent |
| 15 | Mo—N | 33 | 221 | | excellent |
| 16 | Mo—N | 50 | 360 | | excellent |
| 17 | Al—0.5 at % Ta—2.0 at % Nd—0.1 at % Ni—0.5 at % Ge—N※ | 1 | 12 | | poor |
| 18 | Al—0.5 at % Ta—2.0 at % Nd—0.1 at % Ni—0.5 at % Ge—N | 3 | 27 | | good |
| 19 | | 5 | 34 | | fair |
| 20 | | 10 | 73 | | excellent |
| 21 | | 13 | 430 | | excellent |
| 22 | | 15 | 1300 | | excellent |
| 23 | | 17 | Insulating | | excellent |
| 24 | Al—0.5 at % Ta—0.2 at % Nd—0.1 at % Ni—0.5 at % Ge—0.35 at % Zr—N※ | 1 | 11 | | poor |
| 25 | Al—0.5 at % Ta—0.2 at % Nd—0.1 at % Ni—0.5 at % Ge—0.35 at % Zr—N | 3 | 27 | | good |
| 26 | | 5 | 33 | | fair |
| 27 | | 10 | 73 | | excellent |
| 28 | | 13 | 444 | | excellent |
| 29 | | 15 | 1300 | | excellent |
| 30 | | 17 | Insulating | | excellent |

※Samples No. 1, 9, 17, 24 are those for which a nitride sufficient to obtain the desired resistance to the hydrofluoric acid is not formed.

TABLE 10

| Property | | excellent | fair | good | poor | acceptance criteria |
|---|---|---|---|---|---|---|
| Heat resistance (Hillock density: /m²) | | $1 \times 10^8$ or less | More than $1 \times 10^8$, and $5 \times 10^8$ or less | More than $5 \times 10^8$, and $1 \times 10^9$ or less | More than $1 \times 10^9$ | excellent, fair, and good are accepted |
| Wiring resistance (μΩcm) | 450° C. | 8 or less | More than 8, and 15 or less | More than 15, and 20 or less | More than 20 | excellent and fair are accepted |
| | 550° C. | 7 or less | More than 7, and 10 or less | More than 10, and 12 or less | More than 12 | excellent and fair are accepted |
| | 600° C. | 5 or less | More than 5, and 8 or less | More than 8, and 10 or less | More than 10 | excellent and fair are accepted |
| Resistance to 0.5 mass % HF (etching rate: nm/min) | | 70 or less | More than 70, and 100 or less | More than 100, and 200 or less | More than 200 | excellent, fair, and good are accepted |

REFERENCE SIGNS LIST

1 Glass Substrate
2 Polycrystalline Silicon Layer
3 Low-Resistance Polycrystalline Silicon Layer
4 Scan Line
5 Gate Electrode
6 Gate Insulating Film
7 Passivation Film
8 Source Electrode
9 Drain Electrode
10 Signal Line
11 Via Hole
12 Transparent Electrode

The invention claimed is:

1. A wiring structure, comprising:
a first layer of a first Al alloy which comprises at least one element X selected from the group consisting of Ta, Nb, Re, Zr, W, Mo, V, Hf, Ti, Cr, and Pt, and at least one rare earth metal element; and
a second layer of a nitride which comprises at least one element Y selected from the group consisting of Ti, Mo, Ta, Nb, Re, Zr, W, V, Hf, and Cr, or a nitride of a second Al alloy which comprises one or more of other metal elements and is the same as or different from the first Al alloy,
wherein
the first layer is formed on a substrate, and
the second layer is formed on the first layer.
2. The wiring structure according to claim 1, wherein the first Al alloy further comprises at least one of Cu and Ge.
3. The wiring structure according to claim 1, wherein the first Al alloy further comprises at least one of Ni and Co.
4. The wiring structure according to claim 1, further comprising:
a third layer comprising at least one element Z selected from the group consisting of Ti, Mo, Ta, Nb, Re, Zr, W, V, Hf, and Cr, on the second layer.
5. The wiring structure according to claim 1, wherein:
the second layer comprises a nitride of Mo; and
the electrical resistivity of the second layer is 75 μΩcm or more.

6. The wiring structure according to claim 1, wherein:
the second layer comprises a nitride of Ti; and
the electrical resistivity of the second layer is 90 μΩcm or more.

7. The wiring structure according to claim 1, wherein a nitrogen concentration in the first Al alloy is 1 atomic percent or lower, after the wiring structure is subjected to the heat treatment at 450° C. to 600° C.

8. The wiring structure according to claim 1, wherein a thickness of the second layer is 10 nm or more and 100 nm or less.

9. A method of manufacturing the wiring structure according to claim 1, the method comprising
forming the nitride constituting the second layer by a reactive sputtering method with a mixed gas of nitrogen and an inert gas, such that a proportion of nitrogen in the mixed gas is 2 percent or more.

10. A display device, comprising
the wiring structure according to claim 1.

11. A liquid crystal display device, comprising
the wiring structure according to claim 1.

12. An organic EL display device, comprising
the wiring structure according to claim 1.

13. A field emission display device, comprising
the wiring structure according to claim 1.

14. A vacuum fluorescent display device, comprising
the wiring structure according to claim 1.

15. A plasma display panel device, comprising
the wiring structure according to claim 1.

16. An inorganic EL display device, comprising
the wiring structure according to claim 1.

17. The wiring structure according to claim 1, wherein a total proportion of the at least one element X in the first Al alloy ranges from 0.1 to 5 atomic %.

18. The wiring structure according to claim 1, wherein
the first Al alloy comprises the at least one rare earth metal element, and
a total proportion of the at least one rare earth metal element in the first Al alloy ranges from 0.1 to 4 atomic %.

19. The wiring structure according to claim 1, which, after being subjected to a heat treatment at 450° C.-600° C., has an electrical resistivity of 15 μΩcm or less, a hillock density of $1 \times 10^9$ pieces/m$^2$ or less, and an etching rate of 200 nm/min or less when the wiring structure is subjected to 0.5 weight percent of hydrofluoric acid solution for 1 minute.

* * * * *